US010236390B2

(12) United States Patent
Yamane et al.

(10) Patent No.: US 10,236,390 B2
(45) Date of Patent: Mar. 19, 2019

(54) SEMICONDUCTOR DEVICE

(71) Applicant: Semiconductor Energy Laboratory Co., Ltd., Atsugi-shi, Kanagawa-ken (JP)

(72) Inventors: Yasumasa Yamane, Kanagawa (JP); Motomu Kurata, Kanagawa (JP); Ryota Hodo, Kanagawa (JP); Takahisa Ishiyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/652,299

(22) Filed: Jul. 18, 2017

(65) Prior Publication Data

US 2018/0033892 A1 Feb. 1, 2018

(30) Foreign Application Priority Data

Jul. 26, 2016 (JP) ................................. 2016-146342
Feb. 16, 2017 (JP) ................................. 2017-026908

(51) Int. Cl.
*H01L 29/786* (2006.01)
*H01L 27/105* (2006.01)
(Continued)

(52) U.S. Cl.
CPC ...... *H01L 29/7869* (2013.01); *H01L 27/1052* (2013.01); *H01L 27/1207* (2013.01);
(Continued)

(58) Field of Classification Search
CPC ............. H01L 29/7869; H01L 27/1052; H01L 29/66969; H01L 29/513; H01L 29/78648;
(Continued)

(56) References Cited

U.S. PATENT DOCUMENTS 5,866,474 A  2/1999  Liu
6,806,187 B2 * 10/2004  Graettinger ....... H01L 21/28518
                                                    257/E21.009

(Continued)

FOREIGN PATENT DOCUMENTS

JP  2007-096055 A  4/2007
JP  2007-123861 A  5/2007
(Continued)

OTHER PUBLICATIONS

International Search Report (Application No. PCT/IB2017/054229) dated Nov. 21, 2017.
(Continued)

*Primary Examiner* — Earl N Taylor
(74) *Attorney, Agent, or Firm* — Fish & Richardson P.C.

(57) ABSTRACT

A semiconductor device having stable electrical characteristics is provided. Alternatively, a highly reliable semiconductor device suitable for miniaturization or high integration is provided. The semiconductor device includes a first barrier layer, a second barrier layer, a third barrier layer, a transistor including an oxide, an insulator, and a conductor. The insulator includes an oxygen-excess region. The insulator and the oxide are between the first barrier layer and the second barrier layer. The conductor is in an opening of the first barrier layer, an opening of the second barrier layer, and an opening of the insulator with the third barrier layer positioned therebetween.

15 Claims, 28 Drawing Sheets

(51) Int. Cl.
  *H01L 29/51* (2006.01)
  *H01L 29/66* (2006.01)
  *H01L 29/49* (2006.01)
  *H01L 27/12* (2006.01)

(52) U.S. Cl.
  CPC ...... *H01L 27/1225* (2013.01); *H01L 27/1248* (2013.01); *H01L 27/1255* (2013.01); *H01L 29/4908* (2013.01); *H01L 29/513* (2013.01); *H01L 29/66969* (2013.01); *H01L 29/78648* (2013.01); *H01L 29/78696* (2013.01)

(58) Field of Classification Search
  CPC ....... H01L 2221/1073; H01L 21/76841; H01L 21/76843; H01L 28/57
  See application file for complete search history.

(56) References Cited

U.S. PATENT DOCUMENTS

| | | | |
|---|---|---|---|
| 7,674,650 B2 | 3/2010 | Akimoto et al. | |
| 8,860,108 B2 | 10/2014 | Yamazaki et al. | |
| 9,443,872 B2 | 9/2016 | Miyairi | |
| 9,466,615 B2 | 10/2016 | Miyairi et al. | |
| 9,704,868 B2* | 7/2017 | Miyairi | H01L 27/1052 |
| 9,799,685 B2 | 10/2017 | Miyairi | |
| 2003/0170939 A1 | 9/2003 | Yamazaki et al. | |
| 2005/0087769 A1 | 4/2005 | Yamazaki et al. | |
| 2006/0231858 A1 | 10/2006 | Akimoto et al. | |
| 2007/0105288 A1 | 5/2007 | Miyairi et al. | |
| 2010/0201719 A1 | 8/2010 | Kimura | |
| 2011/0303913 A1 | 12/2011 | Yamazaki et al. | |
| 2012/0032730 A1 | 2/2012 | Koyama | |
| 2012/0061666 A1 | 3/2012 | Inoue et al. | |
| 2012/0161126 A1 | 6/2012 | Yamazaki | |
| 2012/0313152 A1 | 12/2012 | Yokoi et al. | |
| 2013/0140554 A1* | 6/2013 | Yamazaki | H01L 29/786 257/43 |
| 2013/0277676 A1 | 10/2013 | Yamazaki | |
| 2013/0334533 A1 | 12/2013 | Yamazaki | |
| 2014/0008647 A1 | 1/2014 | Yamazaki | |
| 2014/0042437 A1 | 2/2014 | Yamazaki | |
| 2014/0103346 A1 | 4/2014 | Yamazaki | |
| 2015/0108475 A1 | 4/2015 | Ando et al. | |
| 2015/0185579 A1 | 7/2015 | Koyama | |
| 2015/0187814 A1* | 7/2015 | Miyairi | H01L 27/1225 257/43 |
| 2015/0187898 A1 | 7/2015 | Miyairi | |
| 2015/0187953 A1 | 7/2015 | Koezuka et al. | |
| 2015/0255490 A1 | 9/2015 | Miyairi | |
| 2015/0263141 A1 | 9/2015 | Yamazaki et al. | |
| 2015/0270177 A1* | 9/2015 | Tseng | H01L 21/823857 438/216 |
| 2015/0325708 A1 | 11/2015 | Yakubo et al. | |
| 2015/0364610 A1 | 12/2015 | Tsubuku et al. | |
| 2015/0372122 A1 | 12/2015 | Hodo et al. | |
| 2016/0013321 A1 | 1/2016 | Kobayashi et al. | |
| 2016/0307777 A1 | 10/2016 | Kurata et al. | |
| 2016/0329434 A1 | 11/2016 | Ito et al. | |
| 2016/0380115 A1 | 12/2016 | Nakano et al. | |
| 2017/0141130 A1 | 5/2017 | Yamazaki | |
| 2017/0170211 A1 | 6/2017 | Yamazaki | |
| 2017/0186875 A1* | 6/2017 | Yamazaki | H01L 29/7869 |
| 2017/0207242 A1 | 7/2017 | Yamazaki | |
| 2017/0236821 A1* | 8/2017 | Kim | H01L 27/0886 257/401 |
| 2017/0236839 A1 | 8/2017 | Yamazaki et al. | |
| 2017/0263651 A1 | 9/2017 | Tochibayashi et al. | |
| 2017/0309752 A1* | 10/2017 | Yamazaki | H01L 29/78606 |
| 2018/0033892 A1* | 2/2018 | Yamane | H01L 29/7869 |

FOREIGN PATENT DOCUMENTS

| | | |
|---|---|---|
| JP | 2011-119674 A | 6/2011 |
| JP | 2015-128151 A | 7/2015 |
| JP | 2015-144271 A | 8/2015 |
| JP | 2015-188070 A | 10/2015 |
| KR | 2016-0102295 A | 8/2016 |
| TW | 201532248 | 8/2015 |
| WO | WO-2015/097589 | 7/2015 |
| WO | WO-2015/151337 | 10/2015 |

OTHER PUBLICATIONS

Written Opinion (Application No. PCT/IB2017/054229) dated Nov. 21, 2017.

\* cited by examiner

280A

280A

280

280

282

282

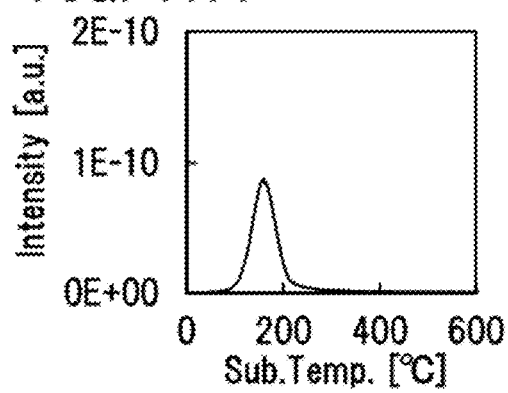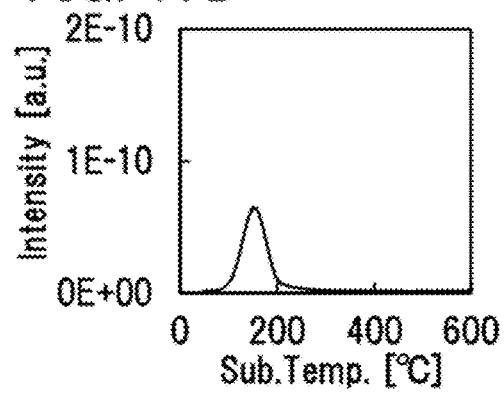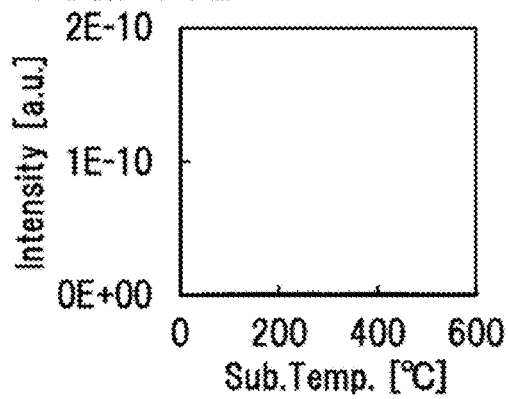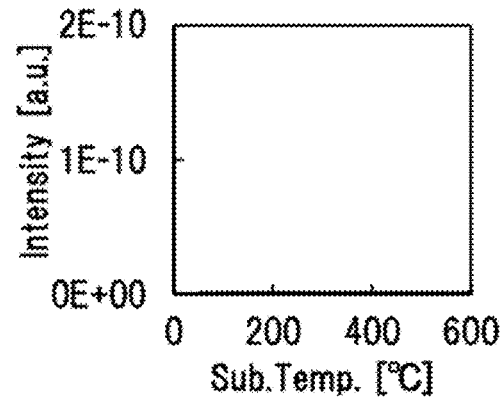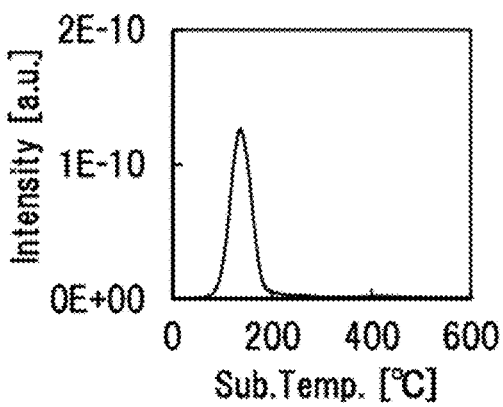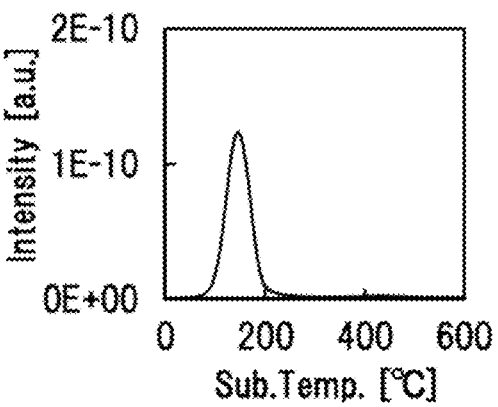

FIG. 18A
804

| | |
|---|---|
| | 822 |
| | 821 |
| | 820 |

FIG. 18B
805

| | |
|---|---|
| | 823 |
| | 822 |
| | 821 |
| | 820 |

SEMICONDUCTOR DEVICE

TECHNICAL FIELD

One embodiment of the present invention relates to a semiconductor device and a driving method thereof. Another embodiment of the present invention relates to an electronic device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device (e.g., a liquid crystal display device or a light-emitting display device), a projection device, a lighting device, an electro-optical device, a power storage device, a memory device, a semiconductor circuit, an imaging device, an electronic device, and the like may include a semiconductor device.

BACKGROUND ART

A technique in which a transistor is formed using a semiconductor thin film has attracted attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, techniques have been disclosed by each of which a display device is manufactured using a transistor whose active layer is formed of zinc oxide or an In—Ga—Zn-based oxide as an oxide semiconductor (see Patent Documents 1 and 2).

Moreover, in recent years, a technique in which an integrated circuit of a memory device is fabricated using a transistor including an oxide semiconductor has been disclosed (see Patent Document 3). In addition, not only the memory device but also an arithmetic device or other devices have been fabricated using a transistor including an oxide semiconductor.

However, it is known that a transistor including an oxide semiconductor as an active layer has a problem in that the electrical characteristics are easily changed by impurities and oxygen vacancies in the oxide semiconductor and thus the reliability is low. For example, the threshold voltage of the transistor is changed in some cases after a bias temperature stress test (BT test).

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119674

DISCLOSURE OF INVENTION

An object of one embodiment of the present invention is to provide a semiconductor device having favorable electrical characteristics. Another object of one embodiment of the present invention is to provide a highly reliable semiconductor device. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

In one embodiment of the present invention, excess oxygen is supplied to an oxide semiconductor from an oxide insulator in the vicinity of the oxide semiconductor to reduce oxygen vacancies in the oxide semiconductor.

Furthermore, impurities such as water and hydrogen from other components or the like in the vicinity of the oxide semiconductor can be prevented from entering the oxide semiconductor. To prevent the entrance of impurities such as hydrogen from the outside into the oxide semiconductor, an insulator having a barrier property against impurities such as water and hydrogen is formed to cover the oxide semiconductor.

The insulator having a barrier property against impurities such as water and hydrogen is made to have low oxygen permeability. Accordingly, outward diffusion of oxygen can be prevented and oxygen can be effectively supplied to the oxide semiconductor and the oxide insulator in the vicinity of the oxide semiconductor.

In such a manner, impurities such as water and hydrogen contained in the oxide semiconductor and the surrounding oxide insulator can be reduced, and oxygen vacancies in the oxide semiconductor can be reduced.

One embodiment of the present invention includes a first barrier layer, a second barrier layer, a third barrier layer, a transistor including an oxide, an insulator, and a conductor. The insulator includes an oxygen-excess region. The insulator and the oxide are between the first barrier layer and the second barrier layer. The conductor is in an opening of the first barrier layer, an opening of the second barrier layer, and an opening of the insulator. The third barrier layer is between the conductor and the first barrier layer, the second barrier layer, and the insulator.

One embodiment of the present invention includes a first barrier layer, a second barrier layer, a third barrier layer, a transistor including an oxide, an insulator, and a conductor electrically connected to the transistor. The insulator includes an oxygen-excess region. The insulator and the oxide are between the first barrier layer and the second barrier layer. The conductor is in an opening of the first barrier layer and an opening of the insulator. The third barrier layer is between the conductor and the first barrier layer and the insulator.

One embodiment of the present invention includes a first barrier layer, a second barrier layer, a third barrier layer, a transistor including an oxide, an insulator, a first conductor, and a second conductor. The insulator includes an oxygen-excess region. The second conductor is electrically connected to the transistor. The insulator and the oxide are between the first barrier layer and the second barrier layer. The first conductor is in an opening of the first barrier layer, an opening of the second barrier layer, and an opening of the insulator. The third barrier layer is between the first conductor and the first barrier layer, the second barrier layer, and the insulator. The second conductor is in the opening of the first barrier layer and the opening of the insulator. The third barrier layer is between the second conductor and the first barrier layer and the insulator.

In any of the above structures, a side surface of the opening of the first barrier layer and a side surface of the opening of the second barrier layer may be in contact with the third barrier layer, so that the transistor and the insulator are sealed by the first barrier layer, the second barrier layer, and the third barrier layer.

In any of the above structures, the amount of hydrogen released from components below the first barrier layer, the second barrier layer, or the third barrier layer may be less than or equal to $5.0 \times 10^{14}/cm^2$ when measured by TDS at a temperature lower than or equal to 400° C.

Any of the above structures may include a second insulator having an opening and a third insulator having an opening. The second insulator is over the second barrier layer. The third insulator is below the first barrier layer. A side surface of the opening of the second insulator and a side surface of the opening of the third insulator each have a region covered by the third barrier layer.

In any of the above structures, the first barrier layer may serve as a gate insulating film of the transistor.

According to one embodiment of the present invention, a semiconductor device that includes a transistor containing an oxide semiconductor and having stable electrical characteristics can be provided. According to one embodiment of the present invention, a semiconductor device having a high degree of design flexibility can be provided.

According to one embodiment of the present invention, a semiconductor device having favorable electrical characteristics can be provided. According to one embodiment of the present invention, a highly reliable semiconductor device can be provided. According to one embodiment of the present invention, a semiconductor device that can be miniaturized or highly integrated can be provided. According to one embodiment of the present invention, a semiconductor device that can be manufactured with high productivity can be provided.

According to one embodiment of the present invention, a semiconductor device capable of retaining data for a long time can be provided. According to one embodiment of the present invention, a semiconductor device capable of high-speed data writing can be provided. According to one embodiment of the present invention, a low-power semiconductor device can be provided. According to one embodiment of the present invention, a novel semiconductor device can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF DRAWINGS

FIGS. 17A to 17F show TDS results in Example.

FIGS. 18A and 18B each illustrate a structure in Example.

BEST MODE FOR CARRYING OUT THE INVENTION

Figure 1A:
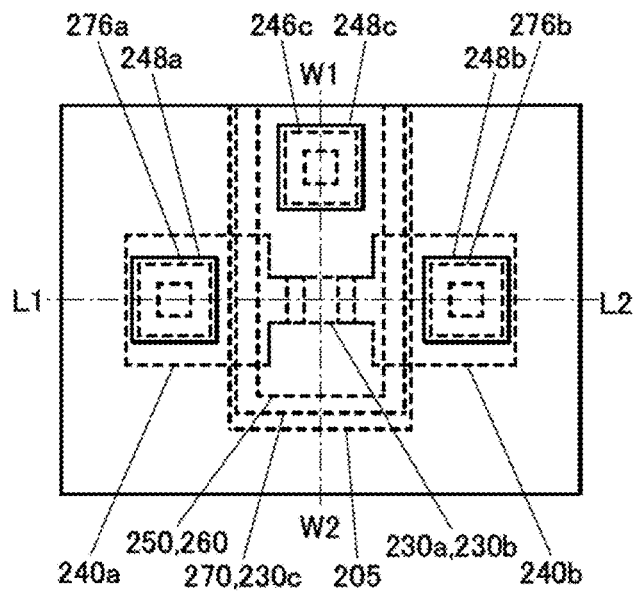
FIGS. 1A to 1C are a top view and cross-sectional views illustrating a structure of a semiconductor device of one embodiment of the present invention.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views illustrating ideal examples, and embodiments of the present invention are not limited to shapes or values illustrated in the drawings. In the drawings, the same portions or portions having similar functions are denoted by the same reference numerals in different drawings, and explanation thereof will not be repeated. Furthermore, the same hatching pattern is applied to portions having similar functions, and the portions are not denoted by reference numerals in some cases.

Note that the ordinal numbers such as "first," "second," and the like in this specification and the like are used for convenience and do not denote the order of steps or the stacking order of layers. Therefore, for example, description can be made even when "first" is replaced with "second" or "third," as appropriate. In addition, the ordinal numbers in this specification and the like are not necessarily the same as those which specify one embodiment of the present invention.

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow between the drain and the source through the channel formation region. Note that in this specification and the like, a channel region refers to a region through which current mainly flows.

Functions of a "source" and a "drain" are sometimes interchanged with each other when a transistor of opposite polarity is used or when the direction of current flow is changed in circuit operation, for example. Therefore, the terms "source" and "drain" can be interchanged with each other in this specification and the like.

Note that the channel length refers to, for example, a distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

The channel width refers to, for example, the length of a portion where a source and a drain face each other in a region where a semiconductor (or a portion where current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering side surfaces of a semiconductor, an effective channel width is greater than an apparent channel width, and its influence cannot be ignored in some cases. For example, in a miniaturized transistor having a gate electrode covering side surfaces of a semiconductor, the proportion of a channel formation region formed in the side surfaces of the semiconductor is increased in some cases. In that case, an effective channel width is greater than an apparent channel width.

In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a "surrounded channel width (SCW)" in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

In this specification and the like, the term "electrically connected" includes the case where components are connected through an "object having any electric function." There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RBS), for example.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Note that in this specification, a barrier film refers to a film having a function of inhibiting the passage of oxygen and impurities such as hydrogen. The barrier film that has conductivity may be referred to as a conductive barrier film.

In this specification and the like, a transistor having normally-on characteristics is a transistor that is on when no potential (0 V) is applied by a power source. For example, the normally-on characteristics of a transistor mean, in some cases, electrical characteristics in which the threshold voltage of the transistor becomes negative when a voltage applied to a gate of the transistor ($V_g$) is 0 V.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

Embodiment 1

In this embodiment, one embodiment of a semiconductor device will be described with reference to FIGS. 1A to 1C, FIGS. 2A to 2J, FIGS. 3A to 3H, FIGS. 4A to 4H, FIGS. 5A to 5F, FIGS. 6A to 6D, FIGS. 7A to 7D, FIGS. 8A to 8D, FIGS. 9A and 9B, FIGS. 10A to 10C, and FIGS. 11A to 11C.
<Structure of Semiconductor Device>

Figure 1C:
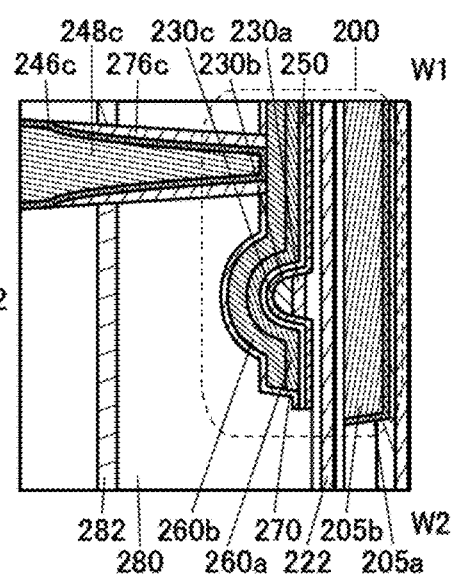
Figure 1B:
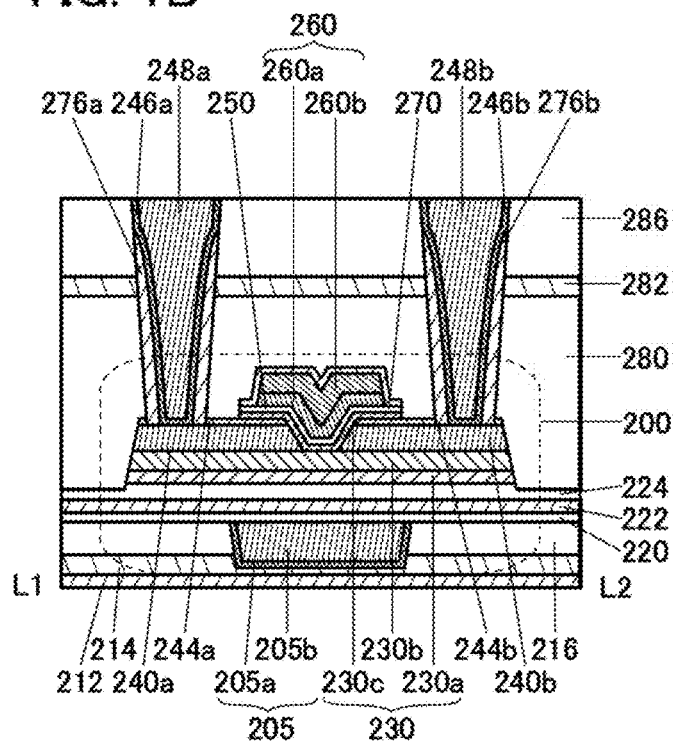

An example of a semiconductor device of one embodiment of the present invention is described below. FIGS. 1A to 1C are a top view and cross-sectional views illustrating a transistor 200 of one embodiment of the present invention and plugs electrically connected to the transistor 200. FIG. 1A is the top view, FIG. 1B is the cross-sectional view taken along a dashed-dotted line L1-L2 in FIG. 1A, and FIG. 1C is the cross-sectional view taken along a dashed-dotted line W1-W2. For simplification of the drawing, some components are not illustrated in the top view in FIG. 1A.

The semiconductor device of one embodiment of the present invention includes the transistor 200, insulators 280, 282, and 286 functioning as interlayer films, barrier layers 276 (barrier layers 276a, 276b, and 276c) that cover side surfaces of openings of the insulators 280 and 282, and conductors 246 (conductors 246a, 246b, and 246c) and conductors 248 (conductors 248a, 248b, and 248c) that are provided in openings of the insulators 280, 282, and 286 functioning as interlayer films. The barrier layers 276 are between the conductors 246 and 248 and the insulators 280, 282, and 286.

In the semiconductor device, the conductors 246 and 248 function as plugs or wirings. Note that in this specification and the like, a wiring and a plug electrically connected to the wiring may be a single component. That is, there are cases where a part of a conductor functions as a wiring and another part of the conductor functions as a plug.

The transistor 200 includes a conductor 260 (including a conductor 260a and a conductor 260b) functioning as a first gate electrode, a conductor 205 (including a conductor 205a and a conductor 205b) functioning as a second gate electrode, a barrier layer 270 in contact with the conductor 260, insulators 220, 222, and 224 and an insulator 250 functioning as gate insulating layers, an oxide 230 (including an oxide 230a, an oxide 230b, and an oxide 230c) including a region where a channel is formed, a conductor 240a functioning as one of a source and a drain, a conductor 240b functioning as the other of the source and the drain, and barrier layers 244 (barrier layers 244a and 244b) in contact with the conductors 240 (the conductors 240a and 240b).

In the transistor 200, the oxide 230 is preferably formed using a metal oxide functioning as an oxide semiconductor (hereinafter, the metal oxide is also referred to as an oxide semiconductor). A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

However, the transistor formed using an oxide semiconductor is likely to have its electrical characteristics changed by impurities and oxygen vacancies in the oxide semiconductor; as a result, the reliability is reduced, in some cases. Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible.

Thus, the insulator 280 functioning as an interlayer film that is provided in the vicinity of the transistor 200 is preferably an insulator containing oxygen, such as a silicon oxide film or a silicon oxynitride film.

It is particularly preferable that the insulator 280 be formed using an oxide containing oxygen at a proportion higher than that in the stoichiometric composition. That is, the insulator 280 preferably has a region containing oxygen in excess of that in the stoichiometric composition (hereinafter also referred to as an oxygen-excess region). In particular, when an insulator having an oxygen-excess region is provided for the interlayer film in the vicinity of the transistor 200, oxygen vacancies in the oxide 230 included in the transistor 200 can be reduced, leading to an improvement in reliability.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, a material containing silicon oxide or silicon oxynitride can be used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

Furthermore, when the insulator 280 includes an excess-oxygen region, the insulator 282 preferably has a barrier property against oxygen, hydrogen, and water. When the insulator 282 has a barrier property against oxygen, oxygen in the excess-oxygen region is not diffused to the insulator 286 side but supplied to the oxide 230 efficiently.

Note that unless it is specified, the term "barrier property" in this specification refers to a function of inhibiting the diffusion of at least impurities typified by hydrogen and water. For example, the diffusion of hydrogen is inhibited in an atmosphere at 350° C., preferably at 400° C. When a structure including a first film that releases hydrogen and any second film stacked thereover is subjected to TDS measurement at a temperature lower than or equal to 400° C. and the amount of released hydrogen is less than or equal to $5.0 \times 10^{14}$/cm$^2$, for example, the second film is regarded to have a barrier property against hydrogen. The amount of released hydrogen is preferably less than or equal to $3.4 \times 10^{14}$/cm$^2$ at a temperature lower than or equal to 400° C., further preferably less than or equal to $7.1 \times 10^{14}$/cm$^2$ at a temperature lower than or equal to 500° C., and still further preferably less than or equal to $1.4 \times 10^{15}$/cm$^2$ at a temperature lower than or equal to 600° C.

As described later in detail, as well as the insulator 282, the insulator 222 included in the transistor 200 preferably has a barrier property against oxygen, hydrogen, and water. When the insulator 222 has a barrier property against oxygen, oxygen in the excess-oxygen region is not diffused to the insulator 220 side but can be supplied to the oxide 230 efficiently.

The insulator 282 preferably has a single-layer structure or a stacked-layer structure using an insulator containing what is called a high-k material such as silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST). In particular, an insulating film having a barrier property against oxygen or hydrogen, e.g., an aluminum oxide film or a hafnium oxide film, is preferably used. The insulator 282 formed of such a material functions as a layer which prevents release of oxygen from the oxide 230 and entry of an impurity such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. Silicon oxide, silicon oxynitride, or silicon nitride may be stacked over the above insulator.

Note that the insulators 280, 282, and 286 each may have a stacked-layer structure of two or more layers. In that case, the stacked layers are not necessarily formed of the same material but may be formed of different materials. Note that the insulator 280 that covers the transistor 200 may function as a planarization film that covers a roughness thereunder.

The transistor 200 is electrically connected to another component via the plug or the wiring such as the conductors 246 and 248 provided in the insulators 280, 282, and 286, in some cases. When the conductors 246 and 248 are in contact with the insulator 280, excess oxygen contained in the insulator 280 may be absorbed by the conductors 246 and 248.

Depending on the shape of the plug or the wiring provided in the semiconductor device or the number of the plugs or the wirings, excess oxygen contained in the insulator 280 becomes insufficient to fill oxygen vacancies in the oxide 230 included in the transistor 200, which may result in a reduction in the reliability of the semiconductor device. Thus, the oxygen-excess region in the insulator 280 needs to be formed with the amount of oxygen absorbed by the conductors 246 and 248 taken into consideration.

Note that hydrogen, which is an impurity, contained in a component formed in the vicinity of the transistor 200 is diffused via the conductor used as the plug or the wiring to a component in contact with the conductor, in some cases.

Thus, it is preferable to provide the barrier layers 276 between the conductors 246 and 248 and the insulator 280 having the oxygen-excess region and the insulator 282 having a barrier property. It is particularly preferable that the barrier layers 276 be provided to be in contact with the insulator 282 having a barrier property. Since the barrier layers 276 are in contact with the insulator 282, the insulator 280 and the transistor 200 can be sealed by the insulator having a barrier property and the barrier layers. It is also preferable that the barrier layers 276 be in contact with a part of the insulator 286. When the barrier layers 276 are also in contact with the insulator 286, the diffusion of oxygen and impurities can be inhibited more.

That is, the barrier layers 276 can prevent excess oxygen contained in the insulator 280 from being absorbed by the conductors 246 and 248. Accordingly, a reduction in the reliability of the semiconductor device, which is caused by not filling oxygen vacancies in the oxide 230 included in the transistor 200 with excess oxygen because of the absorption of the excess oxygen by the conductors 246 and 248, can be prevented.

Furthermore, the barrier layers 276 can inhibit the diffusion of hydrogen, which is an impurity. For example, the barrier layers 276 can inhibit the diffusion of hydrogen contained in components over the insulator 282 to the insulator 280 in contact with the transistor 200 via the conductors 246 and 248.

In addition, with the barrier layers 276, the insulator 280 can contain excess oxygen at an appropriate amount regardless of the shape or the position of the plug or the wiring provided in the semiconductor device or the number of the plugs or the wirings. Since oxygen vacancies are less likely to be formed when the diffusion of hydrogen is inhibited, generation of carriers can be inhibited. Thus, excess oxygen can be supplied to the transistor 200 stably, which enables the transistor 200 to have stable electrical characteristics. Moreover, the design flexibility of the semiconductor device can be increased.

Furthermore, with the use of the barrier layers 276, the range of choices for the materials of the conductor used as the plug or the wiring can be expanded. The use of a metal material having an oxygen absorbing property and high conductivity for the conductors 246 and 248, for example, can provide a semiconductor device with low power consumption. As specific examples, a material having low oxidation resistance and high conductivity, such as tungsten or aluminum, and a conductor that can be easily deposited and processed can be given.

Each of the conductors 246 and 248 can be formed to have a single-layer structure or a stacked-layer structure using a conductive material such as a metal material, an alloy material, a metal nitride material, or a metal oxide material. For example, a high-melting-point material having both heat resistance and conductivity, such as tungsten or molybdenum, is preferably used. Alternatively, a low-resistance conductive material such as aluminum or copper is preferably used. The use of a low-resistance conductive material can reduce wiring resistance.

For the conductors 246, tantalum nitride or the like, which is a conductor having a barrier property against hydrogen and oxygen, can be used, for example. Furthermore, when tungsten that has high conductivity is used for the conductors 248, the diffusion of impurities from the outside can be inhibited while remaining the conductivity as a wiring.

For the barrier layers 276, for example, a metal oxide can be used. In particular, an insulating film having a barrier property against oxygen or hydrogen, e.g., an aluminum oxide film, a hafnium oxide film, or a gallium oxide film, is preferably used. Alternatively, silicon nitride deposited by a chemical vapor deposition (CVD) method may be used.

According to the above, a semiconductor device having stable electrical characteristics can be provided. According to the above, a highly reliable semiconductor device can be provided. According to the above, a semiconductor device with low power consumption can be provided. According to the above, the design flexibility of a semiconductor device can be increased.

<Transistor Structure 1>

Hereinafter, an example of the transistor 200 will be described.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. In particular, a metal nitride film such as a tantalum nitride film is preferable because it has a barrier property against hydrogen or oxygen and is difficult to oxidize (has a high oxidation resistance). Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For example, it is preferable that a conductor having a barrier property against hydrogen, e.g., tantalum nitride, be used as the conductor 205a, and tungsten, which has high conductivity, be stacked thereover as the conductor 205b. The use of the combination of the materials can prevent the diffusion of hydrogen to the oxide 230 while the conductivity of a wiring is ensured. Note that a two-layer structure of the conductors 205a and 205b is illustrated in FIGS. 1A to 1C; however, one embodiment of the present invention is not limited thereto, and a single-layer structure or a stacked-layer structure of three or more layers may be used. For example, between a conductor having a barrier property and a conductor having high conductivity, a conductor which is highly adhesive to the conductor having a barrier property and the conductor having high conductivity may be formed.

Like the insulator 280, the insulator 224 is preferably an insulator containing oxygen, such as a silicon oxide film or a silicon oxynitride film. It is particularly preferable that the insulator 224 have an oxygen-excess region. When an oxide semiconductor is used for the transistor 200 and an insulator having an oxygen-excess region is provided for the interlayer film or the like in the vicinity of the transistor 200, oxygen vacancies in the oxide 230 included in the transistor 200 can be reduced and the reliability can be improved.

Furthermore, when the insulator 224 includes an excess-oxygen region, the insulator 222 preferably has a barrier property against oxygen, hydrogen, and water. When the insulator 222 has a barrier property against oxygen, oxygen in the excess-oxygen region is not diffused to the conductor 205a side but supplied to the oxide 230 efficiently. The conductor 205 can be inhibited from reacting with oxygen of the excess-oxygen region of the insulator 224.

The insulator 222 preferably has a single-layer structure or a stacked-layer structure using an insulator containing what is called a high-k material such as silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). In particular, an insulating film having a barrier property against oxygen or hydrogen, e.g., an aluminum oxide film or a hafnium oxide film, is preferably used. The insulator 222 formed of such a material functions as a layer which prevents release of oxygen from the oxide 230 and entry of an impurity such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

Note that the insulators 220, 222, and 224 each may have a stacked-layer structure of two or more layers. In that case, the stacked layers are not necessarily formed of the same material but may be formed of different materials.

Since the insulator 222 containing a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having many electron trap states such as hafnium oxide, aluminum oxide, or tantalum oxide, the state where the potential of the conductor 205 is higher than the potential of the source electrode or the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states in the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

Furthermore, the treatment for trapping the electrons may be performed in the manufacturing process of the transistor. For example, the treatment is preferably performed at any step before factory shipment, such as after the formation of a conductor connected to the source conductor or the drain conductor of the transistor, after pretreatment (wafer processing), after a wafer-dicing step, after packaging, or the like.

The threshold voltage can be controlled by appropriate adjustment of the thicknesses of the insulators 220, 222, and 224. For example, when the total thickness of the insulators 220, 222, and 224 is small, a voltage is efficiently applied from the conductor 205, resulting in low power consumption of the transistor. The total thickness of the insulators 220, 222, and 224 is less than or equal to 65 nm, preferably less than or equal to 20 nm.

Thus, a transistor having a low leakage current in an off state can be provided. A transistor with stable electrical characteristics can be provided. A transistor having a high on-state current can be provided. A transistor with a small subthreshold swing value can be provided. A highly reliable transistor can be provided.

The oxide 230 includes the oxide 230a, the oxide 230b over the oxide 230a, and the oxide 230c over the oxide 230b. When the transistor 200 is turned on, current flows (a channel is formed) mainly in the oxide 230b. In contrast, although current might flow through a region in the vicinity of the interface (a mixed region in some cases) between the oxide 230b and the oxide 230a or 230c, the other region of the oxides 230a and 230c might function as insulators.

As illustrated in FIG. 1C, the oxide 230c is preferably provided to cover side surfaces of the oxides 230a and 230b. The oxide 230c, which is provided between the insulator 280 and the oxide 230b including the region where the channel is formed, can prevent impurities such as hydrogen, water, and halogen from diffusing from the insulator 280 to the oxide 230b.

The oxides 230a, 230b, and 230c are formed using a metal oxide such as an In-M-Zn oxide (an element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like). An In—Ga oxide or an In—Zn oxide may be used for the oxide 230.

[Metal Oxide]

The oxide 230 of one embodiment of the present invention will be described below. The oxide 230 is preferably formed using a metal oxide functioning as an oxide semiconductor (hereinafter, the metal oxide is also referred to as an oxide semiconductor).

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor is InMZnO containing indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

In this specification and the like, a metal oxide including nitrogen is also called a metal oxide in some cases. Moreover, a metal oxide including nitrogen may be called a metal oxynitride.

<Composition of Metal Oxide>

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, a high on-state current and high field-effect mobility, can be obtained.

In other words, CAC-OS or CAC-metal oxide can be called a matrix composite or a metal matrix composite.

<Structure of Metal Oxide>

Oxide semiconductors can be classified into a single crystal oxide semiconductor and a non-single-crystal oxide semiconductor. Examples of the non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (InN,Zn) layer. When indium of the In layer is replaced with the element M, the layer can also be referred to as an (In,M) layer.

The CAAC-OS is an oxide semiconductor with high crystallinity. In contrast, in the CAAC-OS, a reduction in the electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the oxide semiconductor is used for a transistor will be described.

Note that when the oxide semiconductor is used for a transistor, the transistor can have high field-effect mobility. In addition, the transistor can have high reliability.

An oxide semiconductor with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

<Impurities>

Here, the influence of impurities in the oxide semiconductor will be described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide semiconductor contains alkali metal or alkaline earth metal, defect states are formed and carriers are generated, in some cases. Thus, a transistor including an oxide semiconductor which contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor including an oxide semiconductor which contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel region in a transistor, the transistor can have stable electrical characteristics.

As the insulator 250, an insulator containing what is called a high-k material such as silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used, for example. The insulator may have a single-layer structure or a stacked-layer structure. Alternatively, aluminum oxide, bismuth oxide, germanium oxide, niobium oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

Because silicon oxide and silicon oxynitride have thermal stability, combination of silicon oxide or silicon oxynitride with an insulator with a high relative permittivity allows the stacked-layer structure to be thermally stable and have a high relative permittivity, for example.

As the insulator 250, like the insulator 224, an oxide insulator that contains more oxygen than that in the stoichiometric composition is preferably used. When such an insulator containing excess oxygen is provided in contact with the oxide 230, oxygen vacancies in the oxide 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen or hydrogen, can be used. The insulator 250 formed of such a material serves as a layer that prevents release of oxygen from the oxide 230 and entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons are trapped by electron trap states, the threshold voltage of the transistor 200 can be shifted in the positive direction. The transistor 200 having the structure is a normally-off transistor which is in a non-conduction state (also referred to as an off state) even when the gate voltage is 0 V.

One of the conductors 240a and 240b functions as a source electrode, and the other thereof functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a and 240b. In particular, a metal nitride film such as a tantalum nitride film is preferable because it has a barrier property against hydrogen or oxygen and has a high oxidation resistance.

Although a single-layer structure is illustrated in the drawings, a stacked-layer structure of two or more layers may be used. For example, a tantalum nitride film and a tungsten film may be stacked. Alternatively, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

Furthermore, the barrier layer 244a and the barrier layer 244b may be provided over the conductor 240a and the conductor 240b. A material having a barrier property against oxygen or hydrogen is preferably used for the barrier layer 244a and the barrier layer 244b. With this structure, the conductor 240a and the conductor 240b can be inhibited from being oxidized when the oxide 230c is deposited. Oxygen of the excess-oxygen region in the insulator 280 can be prevented from reacting with the conductor 240a and the conductor 240b and from oxidizing them.

A metal oxide can be used for the barrier layer 244a and the barrier layer 244b, for example. In particular, an insulating film having a barrier property against oxygen or hydrogen, e.g., an aluminum oxide film, a hafnium oxide film, or a gallium oxide film, is preferably used. Alternatively, silicon nitride deposited by a CVD method may be used.

With the use of the barrier layers 244, the range of choices for the materials of the conductors 240 can be expanded. For the conductors 240, for example, a material having low oxidation resistance and high conductivity, such as tungsten or aluminum, or a conductor that can be easily deposited and processed can be used.

In addition, the oxidation of the conductors 240 can be prevented, and oxygen released from the insulator 224 and the insulator 280 can be supplied to the oxide 230 efficiently. Furthermore, a conductor that has high conductivity is used for the conductors 240, whereby the transistor 200 with low power consumption can be provided.

The conductor 260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. In particular, a metal nitride film such as a tantalum nitride film is preferable because it has a barrier property against hydrogen or oxygen and has a high oxidation resistance. Furthermore, one or both of manganese and zirconium may be used. Alternatively, a semiconductor typified by polycrystalline silicon doped with an impurity element such as phosphorus, or a silicide such as nickel silicide may be used.

The conductor 260a is formed by a thermal CVD method, an MOCVD method, or an atomic layer deposition (ALD) method, for example. In particular, the conductor 260a is preferably formed by an ALD method. By employing an ALD method or the like, damage to the insulator 250 at the time of the deposition can be reduced. Furthermore, the conductor 260a is preferably formed by an ALD method or the like because coverage can be improved. Thus, the transistor 200 having high reliability can be provided.

Next, the conductor 260b is formed by a sputtering method. At that time, since the conductor 260a is provided over the insulator 250, damage caused during deposition of the conductor 260b can be prevented from affecting the insulator 250. Since the deposition rate in a sputtering method is higher than that in an ALD method, the productivity can be improved with a high yield.

The barrier layer 270 may be provided to cover the conductor 260. In the case where the insulator 280 is formed using an oxide material from which oxygen is released, the barrier layer 270 is formed using a substance having a barrier property against oxygen. With such a structure, oxygen in the excess-oxygen region of the insulator 280 can be prevented from reacting with the conductor 260 and from oxidizing the conductor 260.

For the barrier layer 270, for example, a metal oxide can be used. In particular, an insulating film having a barrier property against oxygen or hydrogen, e.g., an aluminum oxide film, a hafnium oxide film, or a gallium oxide film, is preferably used. Alternatively, silicon nitride deposited by a CVD method may be used. The barrier layer 270 is formed to a thickness with which the oxidation of the conductor 260 is prevented.

With the use of the barrier layer 270, the range of choices for the materials of the conductor 260 can be expanded. For example, the conductor 260 can be formed using a material with a low oxidation resistance and high conductivity, such as tungsten or aluminum. Furthermore, a conductor that can be easily deposited or processed can be used, for example.

In addition, the oxidation of the conductor 260 can be prevented, and oxygen released from the insulator 224 and the insulator 280 can be supplied to the oxide 230 efficiently. Furthermore, a conductor that has high conductivity is used for the conductor 260, whereby the transistor 200 with low power consumption can be provided.

The above structure makes it possible to provide a semiconductor device including a transistor that contains an oxide semiconductor and has a high on-state current. Alternatively, a semiconductor device including a transistor that contains an oxide semiconductor and has a low off-state current can be provided. Alternatively, a semiconductor device with high reliability and small variation in electrical characteristics can be provided. Alternatively, a semiconductor device with reduced power consumption can be provided.

<Method for Manufacturing Semiconductor Device>

An example of a method for manufacturing the semiconductor device illustrated in FIGS. 1A to 1C will be described below with reference to FIGS. 2A to 2J, FIGS. 3A to 3H, FIGS. 4A to 4H, FIGS. 5A to 5F, FIGS. 6A to 6D, FIGS. 7A to 7D, FIGS. 8A to 8D, and FIGS. 9A and 9B. In the drawings, cross-sectional views along L1-L2 are cross-sectional views of the transistor 200 in the channel length direction, and cross-sectional views along W1-W2 are cross-sectional views of the transistor 200 in the channel width direction.

First, a substrate is prepared (not illustrated). Although there is no particular limitation on the substrate, it preferably has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium, gallium arsenide, indium arsenide, or indium gallium arsenide; a silicon-on-insulator (SOI) substrate; a germanium-on-insulator (GOI) substrate; or the like can be used. Further alternatively, any of these substrates provided with a semiconductor element may be used as the substrate.

Further alternatively, a flexible substrate may be used as the substrate to manufacture the semiconductor device. To manufacture a flexible semiconductor device, a transistor may be directly formed over a flexible substrate; alternatively, a transistor may be formed over a manufacturing substrate and then separated from the manufacturing substrate and transferred to a flexible substrate. In order that the transistor be separated from the manufacturing substrate to be transferred to the flexible substrate, it is preferable to provide a separation layer between the manufacturing substrate and the transistor including an oxide semiconductor.

Figure 2A:
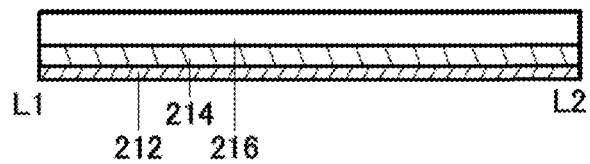
FIGS. 2A to 2J are cross-sectional views illustrating a method for manufacturing a semiconductor device of one embodiment of the present invention.
Figure 2B:
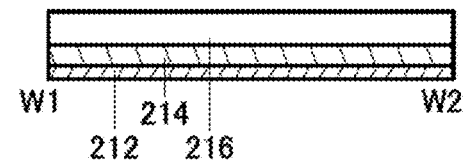

Next, an insulator 212, an insulator 214, and an insulator 216 are formed (FIGS. 2A and 2B).

The insulators 212, 214, and 216 can be formed using a sputtering method, a CVD method (including a thermal CVD method, a metal organic CVD (MOCVD) method, a plasma-enhanced CVD (PECVD) method, and the like), a molecular beam epitaxy (MBE) method, an ALD method, a pulsed laser deposition (PLD) method, or the like. In particular, it is preferable that the insulators be deposited by a CVD method, further preferably an ALD method or the like, because coverage can be further improved. It is preferable to use a thermal CVD method, an MOCVD method, or an ALD method in order to reduce plasma damage. The insulators can also be formed using a silicon oxide film capable of providing high step coverage that is formed by reacting tetraethyl orthosilicate (TEOS), silane, or the like with oxygen, nitrous oxide, or the like.

As the insulator 212, aluminum oxide is formed by an ALD method, for example. A dense insulating layer including reduced defects such as cracks and pinholes or having a uniform thickness can be formed by an ALD method. As the insulator 214, aluminum oxide is formed by a sputtering method for example. Since the deposition rate in a sputtering method is higher than that in an ALD method, the productivity can be improved. As the insulator 216, silicon oxynitride is formed by a CVD method, for example. The insulator 216 preferably has a lower permittivity than the insulator 212 and the insulator 214. In the case where a material with a low permittivity is used for an interlayer film, the parasitic capacitance between wirings can be reduced.

Figure 2C:
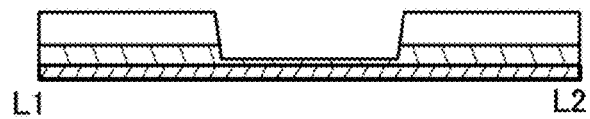
Figure 2D:
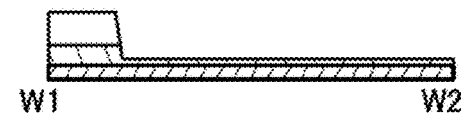

Subsequently, a resist mask is formed over the insulator 216 by a lithography method or the like. Then, unnecessary portions of the insulators 214 and 216 are removed. After that, the resist mask is removed; thus, an opening can be formed (FIGS. 2C and 2D).

Here, a method for processing a film is described. To process a film finely, a variety of fine processing techniques can be used. For example, it is possible to use a method in which a resist mask formed by a lithography process or the like is subjected to slimming treatment. Alternatively, a dummy pattern is formed by a lithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use extreme ultra-violet (EUV) light, X-rays, or an electron beam because extremely minute processing can be performed. Note that in the case of performing exposure by scanning with a beam such as an electron beam, a photomask is not needed.

An organic resin film having a function of improving the adhesion between a film and a resist film may be formed before the resist film serving as a resist mask is formed. The organic resin film can be formed to provide a flat surface by covering a step under the film by a spin coating method or the like, and thus can reduce variation in thickness of the resist mask over the organic resin film. In the case of fine processing, in particular, a material serving as a film preventing reflection of light for the exposure is preferably used for the organic resin film. Examples of the organic resin film having such a function include a bottom anti-reflection coating (BARC) film. The organic resin film may be removed at the same time as the resist mask or after the resist mask is removed.

Figure 2E:
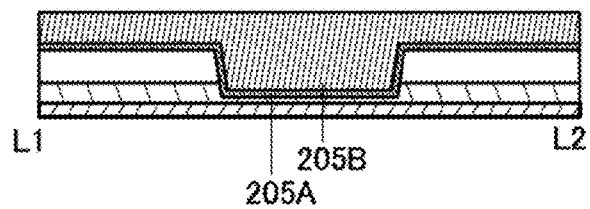
Figure 2F:
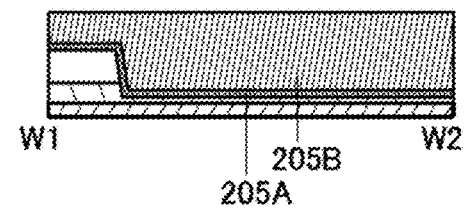
Figure 2G:
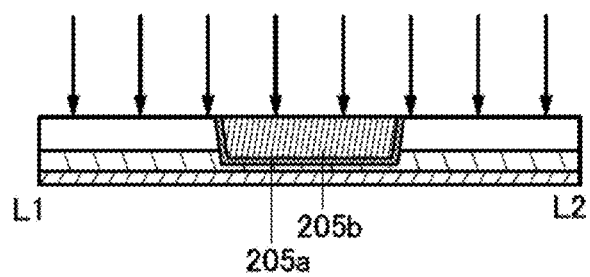
Figure 2H:
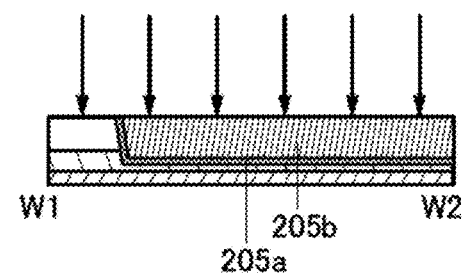

Next, a conductive film 205A and a conductive film 205B are deposited over the insulator 214 and the insulator 216 (FIGS. 2E and 2F). The conductive film 205A and the conductive film 205B can be deposited by, for example, a sputtering method, an evaporation method, or a CVD method (including a thermal CVD method, an MOCVD method, a PECVD method, and the like). It is preferable to use a thermal CVD method, an MOCVD method, or an ALD method in order to reduce plasma damage.

Then, unnecessary portions of the conductive films 205A and 205B are removed. For example, part of the conductive film 205A and part of the conductive film 205B are removed by etch-back processing, chemical mechanical polishing (CMP) processing, or the like until the insulator 216 is exposed, whereby the conductors 205a and 205b are formed (FIGS. 2G and 2H, where arrows show the CMP processing). At this time, the insulator 216 can be used as a stopper layer, and the thickness of the insulator 216 is reduced in some cases.

The CMP processing is processing for planarizing a surface of an object to be processed by a combination of chemical and mechanical actions. More specifically, the CMP processing is processing in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing between the object to be processed and the polishing cloth.

Note that the CMP processing may be performed only once or a plurality of times. When the CMP processing is performed a plurality of times, it is preferable that first polishing be performed at a high polishing rate and final polishing be performed at a low polishing rate. In this manner, polishing processes using different polishing rates may be used in combination.

Then, the insulator 220, the insulator 222, and the insulator 224 are formed. Note that the insulator 220 and the insulator 222 are not necessarily provided. For example, when the insulator 224 has an excess-oxygen region, a conductor with a barrier property may be formed over the conductor 205. The conductor with a barrier property can inhibit the conductor 205 from reacting with oxygen in the excess-oxygen region and from generating an oxide.

The insulators 220, 222, and 224 can be formed using materials and methods similar to those used for forming the insulators 212, 214, and 216. It is particularly preferable to use a high-k material such as aluminum oxide for the insulator 222.

The insulators 220, 222, and 224 are preferably deposited successively. By successive deposition, impurities do not attach to the interfaces between the insulators 220 and 222 and between the insulators 222 and 224, resulting in high reliability of the insulators.

As the insulator 222, aluminum oxide is formed by an ALD method, for example. A dense insulating layer including reduced defects such as cracks and pinholes or having a uniform thickness can be formed by an ALD method. As each of the insulators 220 and 224, silicon oxynitride is formed by a CVD method, for example. The insulator 224 preferably contains excess oxygen. After the formation of the insulator 224, oxygen doping treatment may be performed.

Next, the oxide film 230A, the oxide film 230B, a conductive film 240A, and a barrier film 244A are sequentially formed. It is preferable that the oxide film 230A and the oxide film 230B be successively formed without exposure to the air.

Then, the oxide films 230A and 230B are formed by a sputtering method, for example. Oxygen or a mixed gas of oxygen and a rare gas is used as a sputtering gas. By increasing the proportion of oxygen in the sputtering gas, the amount of excess oxygen in the oxide film to be deposited can be increased.

In particular, part of oxygen contained in the sputtering gas is supplied to the insulator 224 in some cases, at the formation of the oxide film 230A. As the amount of oxygen contained in the sputtering gas increases, the amount of oxygen supplied to the insulator 224 increases. Thus, a region containing excess oxygen can be formed in the insulator 224. Part of oxygen supplied to the insulator 224 reacts with hydrogen left in the insulator 224 to produce water and is released from the insulator 224 by later heat treatment. Thus, the hydrogen concentrations in the insulator 224 can be reduced.

Thus, the proportion of oxygen in the sputtering gas is preferably 70% or higher, further preferably 80% or higher, and still further preferably 100%. When an oxide containing excess oxygen is used for the oxide film 230A, oxygen can be supplied to the oxide 230b by later heat treatment.

The oxide film 230B is formed by a sputtering method. At this time, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

In the case where an oxygen-deficient oxide semiconductor is used for the oxide film 230B, an oxide film containing excess oxygen is preferably used as the oxide film 230A. Oxygen doping treatment may be performed after the formation of the oxide film 230B.

Figure 2I:
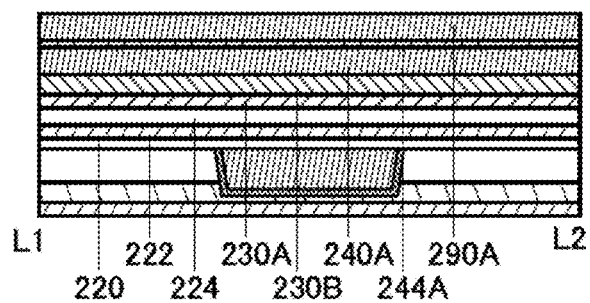
Figure 2J:
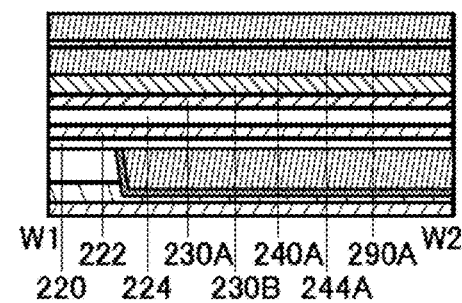

Next, the conductive film 240A, the barrier film 244A, and a film 290A to be a hard mask are formed (FIGS. 2I and 2J).

For example, tantalum nitride is formed as the conductive film 240A by a sputtering method. Tantalum nitride has high oxidation resistance and thus is preferably used in the case where heat treatment is performed in a later step.

When the conductive film 240A is in contact with the oxide film 230B, impurity elements are introduced to the surface of the oxide film 230B in some cases. Introduction of the impurity element into the oxide film 230B can change a threshold voltage of the transistor 200. The impurity element may be introduced by an ion implantation method, an ion doping method, a plasma immersion ion implantation method, plasma treatment using a gas containing the impurity element, or the like before the conductive film 240A is formed. Alternatively, the impurity element may be introduced by an ion implantation method or the like after the conductive film 240A is formed.

As the barrier film 244A, aluminum oxide is preferably formed by an ALD method, for example. A dense film including reduced defects such as cracks and pinholes or having a uniform thickness can be formed by an ALD method.

As the film 290A to be a hard mask, tantalum nitride is formed by a sputtering method, for example. The hard mask is processed at the same time as the conductive film 240A in a later step and thus is preferably formed using the same material as the conductive film 240A or a material whose etching rate is closer to that of the conductive film 240A.

Figure 3A:
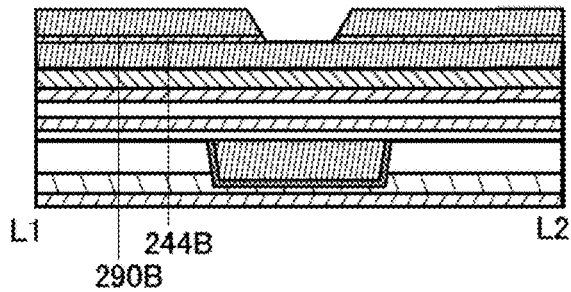
FIGS. 3A to 3H are cross-sectional views illustrating a method for manufacturing a semiconductor device of one embodiment of the present invention.
Figure 3B:
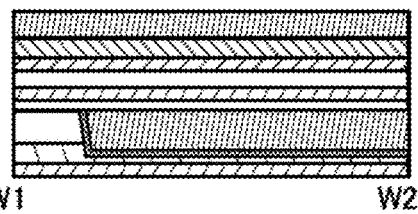

Then, a resist mask is formed over the film 290A to be a hard mask by a photolithography method. The film 290A to be a hard mask and part of the barrier film 244A are selectively removed using the resist mask, so that a film 290B to be a hard mask having an opening and a barrier film 244B having an opening are formed (FIGS. 3A and 3B). The formation of the openings using the resist mask is preferably performed using the minimum feature size. Accordingly, the barrier film 244B has an opening whose width is the minimum feature size.

Note that at the time of the formation of the openings, side surfaces of the film 290B to be a hard mask and the barrier film 244B in the openings are preferably tapered to the top surface of the conductive film 240A. Note that the taper angle is 30° or more and 90° or less, and preferably 45° or more and 80° or less.

Figure 3C:
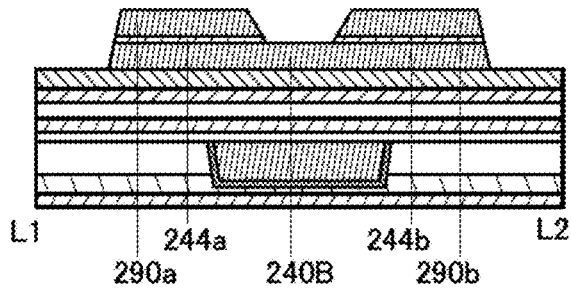
Figure 3D:
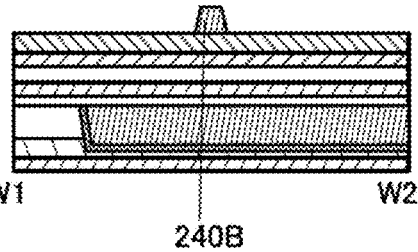

Next, a resist mask is formed over the film 290B to be a hard mask and the barrier film 244B by a photolithography method. Part of the film 290B to be a hard mask, part of the barrier film 244B, and part of the conductive film 240A are selectively removed using the resist mask, so that island-shaped conductive film 240B, hard mask 290a, hard mask 290b, barrier layer 244a, and barrier layer 244b are formed (FIGS. 3C and 3D). At this time, the barrier film 244B is processed into the barrier layers 244a and 244b. That is, when the width of the opening of the barrier film 244B is the minimum feature size, the distance between the barrier layer 244a and the barrier layer 244b is the minimum feature size.

Figure 3E:
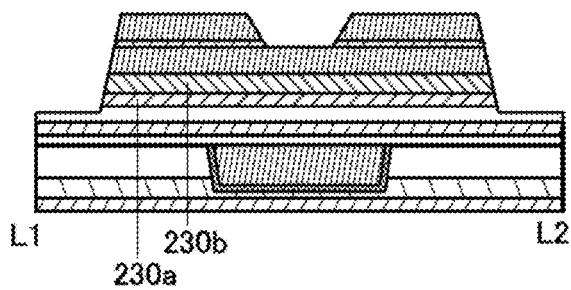
Figure 3F:
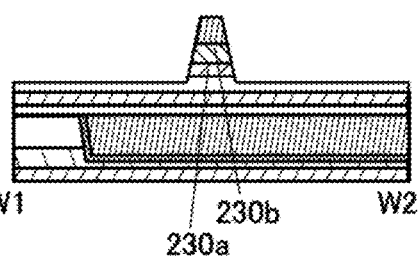

Subsequently, part of the oxide film 230A and part of the oxide film 230B are selectively removed using the island-shaped conductive film 240B, hard mask 290a, and hard mask 290b as masks. In this step, part of the insulator 224 is also removed in some cases. After that, the resist mask is removed. In this manner, the island-shaped oxides 230a and 230b can be formed (FIGS. 3E and 3F).

Figure 3G:
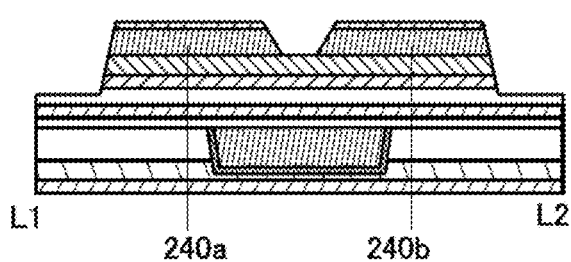
Figure 3H:
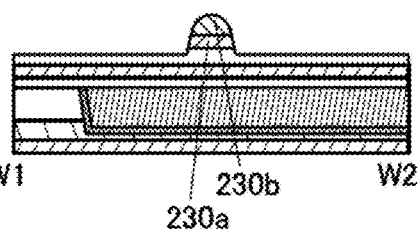

Then, at the same time as the hard masks 290a and 290b, part of the island-shaped conductive film 240B is selectively removed. In this step, the conductive film 240B is separated into the conductor 240a and the conductor 240b (FIGS. 3G and 3H).

The conductors 240a and 240b function as a source electrode and a drain electrode of the transistor 200; thus, a distance between the conductors 240a and 240b facing each other can be referred to as a channel length of the transistor. That is, when the width of the opening of the barrier film 244B is the minimum feature size, the distance between the barrier layer 244a and 244b is the minimum feature size; thus, the gate line width and the channel length can be smaller than the minimum feature size.

Note that the removal of the portions of the oxide film 230A, the oxide film 230B, the conductive film 240A, and the barrier film 244A can be performed by a dry etching method, a wet etching method, or the like. Both the dry etching method and the wet etching method may be used.

When the conductors 240a and 240b are formed by a dry etching method, an impurity element such as remaining components of an etching gas might be attached to an exposed part of the oxide 230b. For example, when a chlorine-based gas is used as an etching gas, chlorine and the like are attached in some cases. Furthermore, when a hydrocarbon-based gas is used as an etching gas, carbon, hydrogen, and the like are attached in some cases. The impurity elements attached to the exposed surface of the oxide 230b are preferably reduced. The impurity elements can be reduced by cleaning treatment using diluted hydrofluoric acid, cleaning treatment using ozone or the like, cleaning treatment using ultra violet rays, or the like. Note that different types of cleaning treatment may be combined.

Plasma treatment using an oxidizing gas may be performed. For example, plasma treatment using a nitrous oxide gas is performed. By the plasma treatment, the concentration of fluorine in the oxide 230b can be lowered. Moreover, the plasma treatment is effective in removing an organic substance on the surface of a sample.

Oxygen doping treatment may be performed on the exposed oxide 230b.

Next, heat treatment is preferably performed to further reduce impurities such as moisture and hydrogen contained in the oxide 230a and the oxide 230b to highly purify the oxide 230a and the oxide 230b.

Plasma treatment using an oxidizing gas may be performed before the heat treatment. For example, plasma treatment using a nitrous oxide gas is performed. By the plasma treatment, the concentration of fluorine in the exposed insulator 224 can be lowered. Moreover, the plasma treatment is effective in removing an organic substance on the surface of a sample.

For example, the heat treatment is performed in an inert atmosphere containing nitrogen, a rare gas, or the like, an oxidizing gas atmosphere, or an ultra-dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidizing gas atmosphere refers to an atmosphere containing an oxidizing gas such as oxygen, ozone, or nitrogen oxide at 10 ppm or higher. The inert atmosphere refers to an atmosphere which contains the oxidizing gas at lower than 10 ppm and is filled with nitrogen or a rare gas. Although there is not particular limitation on the pressure during the heat treatment, the heat treatment is preferably performed under a reduced pressure.

By the heat treatment, at the same time that the impurities are released, oxygen contained in the insulator 224 is diffused to the oxide 230a and the oxide 230b and oxygen vacancies in the oxides can be reduced. Note that the heat treatment may be performed in such a manner that heat treatment is performed in an inert atmosphere, and then another heat treatment is performed in an atmosphere containing an oxidizing gas at 10 ppm or more, 1% or more, or 10% or more in order to compensate for desorbed oxygen. The heat treatment may be performed at any time after the oxides 230a and 230b are formed.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

After heat treatment is performed at 400° C. in a nitrogen gas atmosphere for one hour, another heat treatment is preferably performed at 400° C. in an oxygen gas atmosphere for one hour, for example. By performing the heat treatment in a nitrogen gas atmosphere first, impurities such as moisture or hydrogen contained in the oxide 230a and the oxide 230b are released, so that the impurity concentrations in the oxides 230a and 230b are reduced. By performing the heat treatment in an oxygen gas atmosphere next, oxygen is introduced into the oxides 230a and 230b.

Since the top surfaces of the conductors 240a and 240b are partly covered with the barrier layers 244a and 244b at the heat treatment, oxidation caused from the top surfaces can be prevented.

Figure 4A:
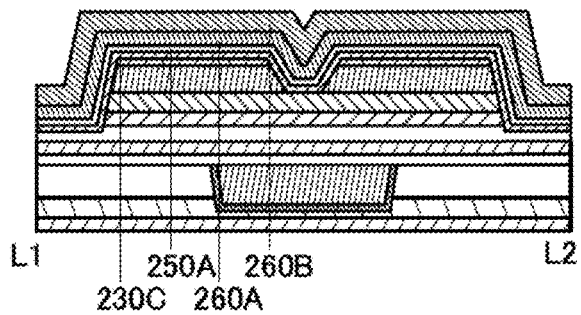
FIGS. 4A to 4H are cross-sectional views illustrating a method for manufacturing a semiconductor device of one embodiment of the present invention.
Figure 4B:
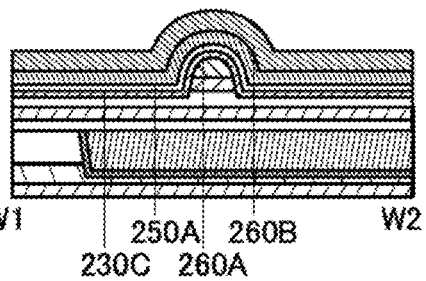

Next, an oxide film 230C, an insulating film 250A, a conductive film 260A, and a conductive film 260B are formed (FIGS. 4A and 4B).

For the oxide film 230C, for example, an oxide containing much excess oxygen is used like the oxide 230a. When an oxide containing excess oxygen is used for the oxide film 230C, oxygen can be supplied to the oxide 230b by later heat treatment.

At the formation of the oxide film 230C, part of oxygen contained in the sputtering gas is supplied to the insulator 224, and an excess oxygen region is formed in some cases, as in the case of the oxide 230a. Part of oxygen supplied to the insulator 224 reacts with hydrogen left in the insulator 224 to produce water and is released from the insulator 224 by later heat treatment. Thus, the hydrogen concentrations in the insulator 224 can be reduced.

Oxygen doping treatment and/or heat treatment may be performed after the formation of the oxide film 230C. By the heat treatment, oxygen contained in the oxide 230a and the oxide film 230C can be supplied to the oxide 230b. By supplying oxygen to the oxide 230b, oxygen vacancies in the oxide 230b can be reduced. Thus, in the case where an oxygen-deficient oxide semiconductor is used for the oxide 230b, a semiconductor containing excess oxygen is preferably used for the oxide film 230C.

Part of the oxide film 230C is in contact with the channel formation region of the oxide 230b. Top and side surfaces of the channel formation region of the oxide 230b are covered with the oxide film 230C. In such a manner, the oxide 230b can be surrounded by the oxide 230a and the oxide film 230C. By surrounding the oxide 230b by the oxide 230a and the oxide film 230C, the diffusion of impurities to the oxide 230b which is to be caused in a later step can be suppressed.

For the insulating film 250A, silicon oxynitride formed by a CVD method is used, for example. The insulating film 250A is preferably an insulating layer containing excess oxygen. The insulating film 250A may be subjected to oxygen doping treatment. Heat treatment may be performed after the formation of the insulating film 250A.

As the conductive film 260A, titanium nitride is formed by a sputtering method, for example. As the conductive film 260B, tungsten is formed by a sputtering method, for example.

Figure 4C:
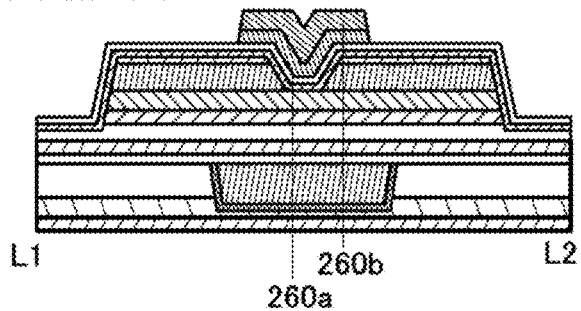
Figure 4D:
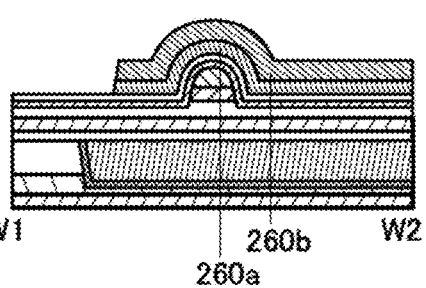

Next, a resist mask is formed over the conductive film 260B by a photolithography method. Part of the conductive film 260A and part of the conductive film 260B are selectively removed using the resist mask, so that the conductor 260 is formed (FIGS. 4C and 4D).

Figure 4E:
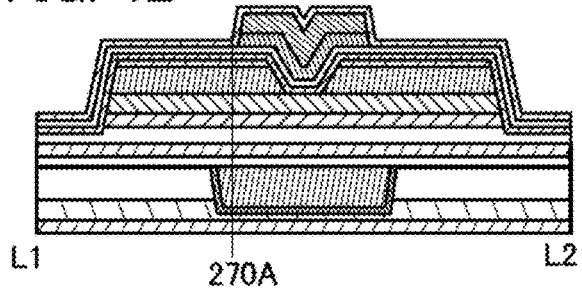
Figure 4F:
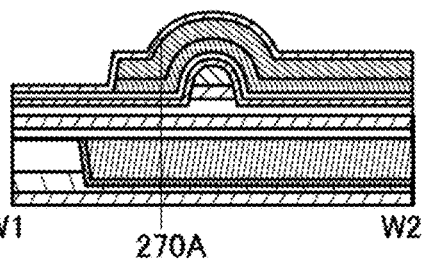

Then, a barrier film 270A is formed. As the barrier film 270A, aluminum oxide is formed by an ALD method, for example (FIGS. 4E and 4F).

Figure 4G:
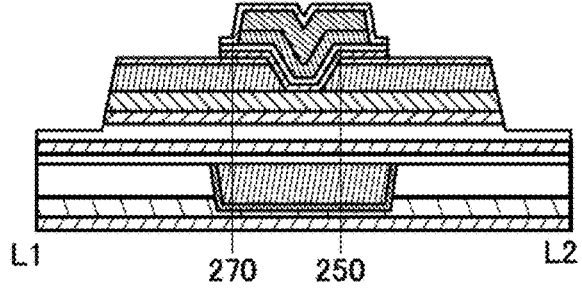
Figure 4H:
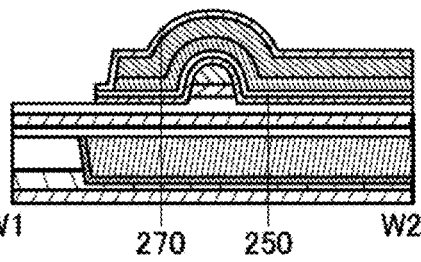

Subsequently, a resist mask is formed over the barrier film 270A by a photolithography method. Part of the barrier film 270A is selectively removed using the resist mask, so that the barrier layer 270 is formed (FIGS. 4G and 4H).

Depending on the material used for the conductor 260, the resistance of the conductor 260 might be increased by oxidation of the conductor 260 in the post-process such as heat treatment, for example. Furthermore, when excess oxygen is supplied to the oxide 230b, oxygen might be absorbed by the conductor 260. With the use of the barrier layer 270, the oxidization of the conductor 260 can be inhibited and the shortage of oxygen supplied to the oxide 230 can be inhibited.

It is preferable that heat treatment be performed after the formation of the barrier layer 270. Through the heat treatment, impurities in the oxide 230 are removed.

Through the above steps, the transistor 200 of one embodiment of the present invention can be manufactured.

Figure 5A:
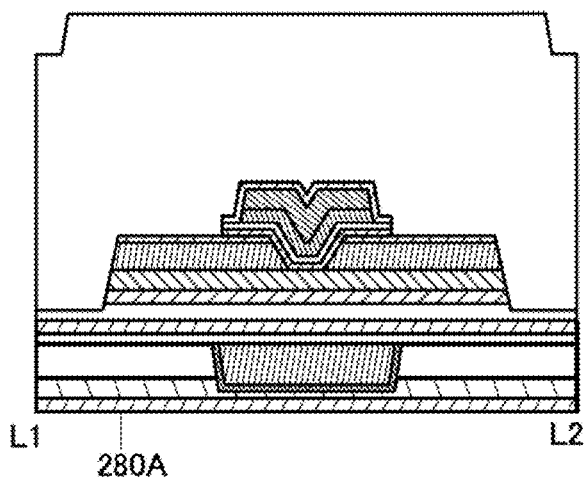
FIGS. 5A to 5F are cross-sectional views illustrating a method for manufacturing a semiconductor device of one embodiment of the present invention.
Figure 5B:
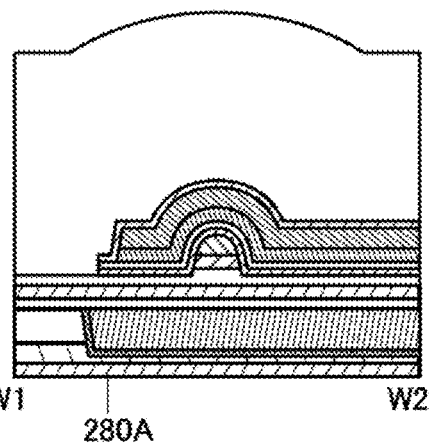
Figure 5C:
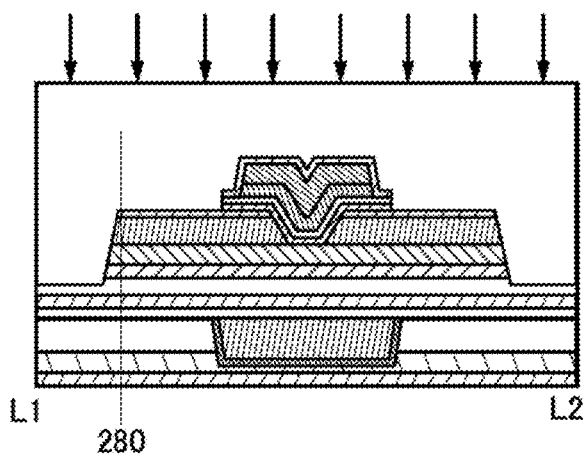
Figure 5D:
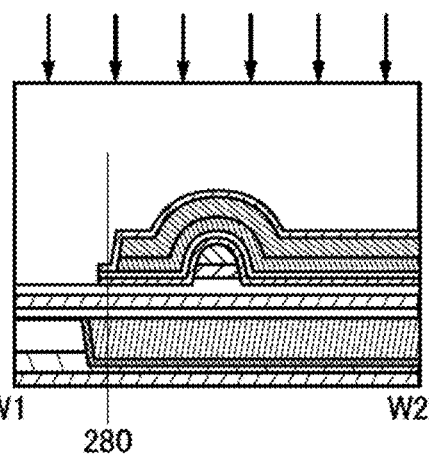

Then, an insulating film 280A is formed over the transistor 200 (FIGS. 5A and 5B). After the insulating film 280A is formed, planarization treatment using a CMP method or the like may be performed to improve the planarity of the top surface of the insulator (FIGS. 5C and 5D, where arrows show the CMP processing).

The insulator 280 is an insulator containing oxygen, such as a silicon oxide film or a silicon oxynitride film. As the insulator containing excess oxygen, a silicon oxide film or a silicon oxynitride film containing a large amount of oxygen can be formed by a CVD method or a sputtering method under the conditions that are set as appropriate.

To make the insulator 280 contain excess oxygen, the insulator 280 is formed in an oxygen atmosphere, for example. Alternatively, a region containing excess oxygen may be formed by introducing oxygen into the insulator 280 that has been formed. Both the methods may be used in combination.

For example, oxygen (at least including any of oxygen radicals, oxygen atoms, and oxygen ions) is introduced into the insulator 280 that has been formed, whereby a region containing excess oxygen is formed. Oxygen can be introduced by an ion implantation method, an ion doping method, a plasma immersion ion implantation method, plasma treatment, or the like.

A gas containing oxygen can be used for the oxygen introduction treatment. As a gas containing oxygen, oxygen, dinitrogen monoxide, nitrogen dioxide, carbon dioxide, carbon monoxide, or the like can be used. A rare gas may be contained in the oxygen-containing gas in introducing oxygen. For example, a mixed gas of carbon dioxide, hydrogen, and argon can be used.

Figure 5E:
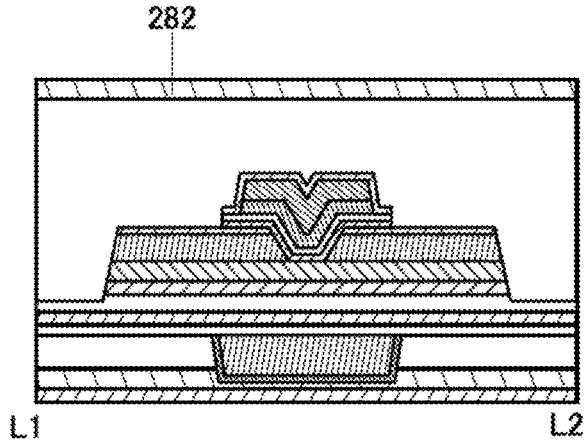
Figure 5F:
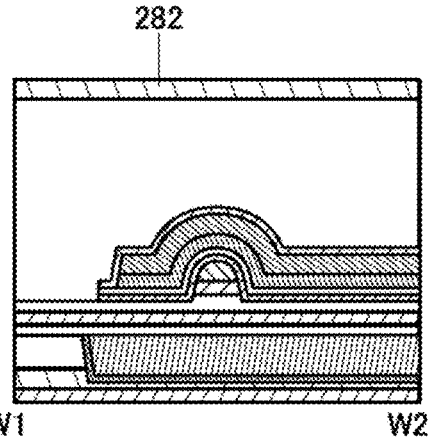

Then, the insulator 282 is formed over the insulator 280 (FIGS. 5E and 5F). The insulator 282 is preferably formed with a sputtering apparatus. By using a sputtering method, an excess-oxygen region can be formed easily in the insulator 280 positioned under the insulator 282.

During deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2 > E_1 > E_0$.

The ions in plasma are accelerated by a potential difference ($E_2-E_0$) and collide with the target; accordingly, sputtered particles are ejected from the target. These sputtered particles attach to a deposition surface and deposited thereover; as a result, a film is formed. Some ions recoil by the target and might be taken, as recoil ions, into the insulator 280 positioned below the formed film, through the formed film. The ions in the plasma are accelerated by a potential difference ($E_2-E_1$) and collide with the deposition surface. At that time, some ions reach the inside of the insulator 280. The ions are taken into the insulator 280; accordingly, a region into which the ions are taken is formed in the insulator 280. That is, an excess-oxygen region is formed in the insulator 280 in the case where the ions include oxygen.

Introduction of excess oxygen to the insulator 280 can form an excess-oxygen region. The excess oxygen in the insulator 280 is supplied to the oxide 230 and can fill oxygen vacancies in the oxide 230.

Accordingly, when the insulator 282 is formed in an oxygen gas atmosphere with a sputtering apparatus, oxygen can be introduced into the insulator 280 while the insulator 282 is formed. When aluminum oxide having a barrier property is used for the insulator 282, for example, excess oxygen introduced into the insulator 280 can be effectively sealed in on the transistor 200 side.

Next, the insulator 286, a film 292A to be a hard mask, and a film 294A to be a hard mask are formed over the insulator 282.

As the insulator 286, an insulator containing oxygen, such as a silicon oxide film or a silicon oxynitride film, is formed by a CVD method, for example. The insulator 286 preferably has a lower permittivity than the insulator 282. In the case where a material with a low permittivity is used for an interlayer film, the parasitic capacitance between wirings can be reduced.

As the film 292A to be a hard mask, tungsten is formed by a sputtering method, for example. As the film 294A to be a hard mask, silicon nitride is formed by a sputtering method, for example.

Figure 6A:
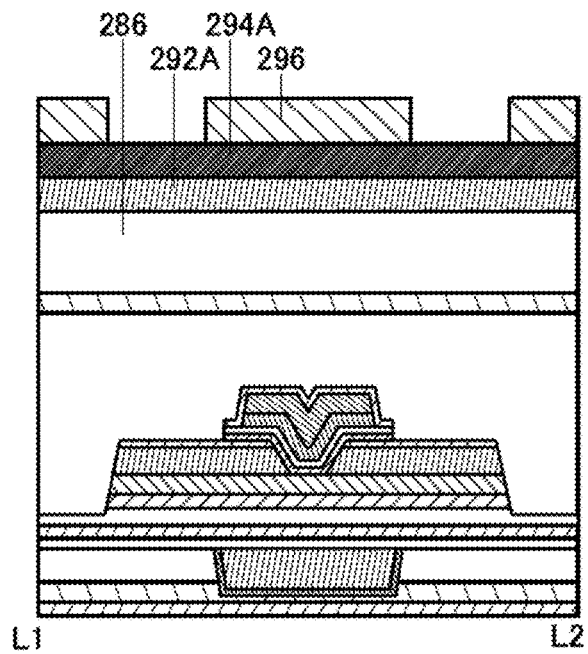
FIGS. 6A to 6D are cross-sectional views illustrating a method for manufacturing a semiconductor device of one embodiment of the present invention.
Figure 6B:
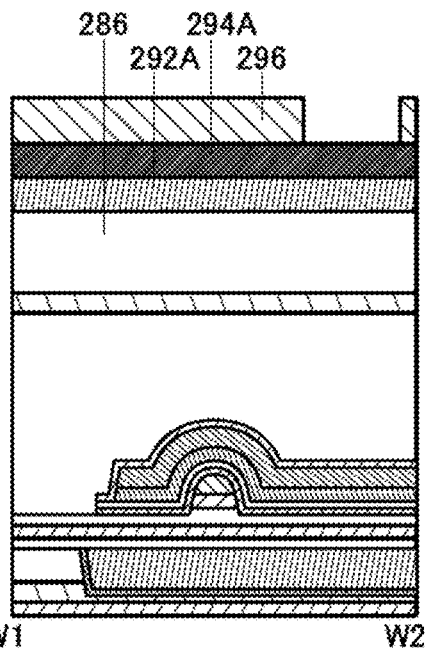

Next, a resist mask 296 is formed over the film 294A to be a hard mask by a photolithography method (FIGS. 6A and 6B).

Figure 6C:
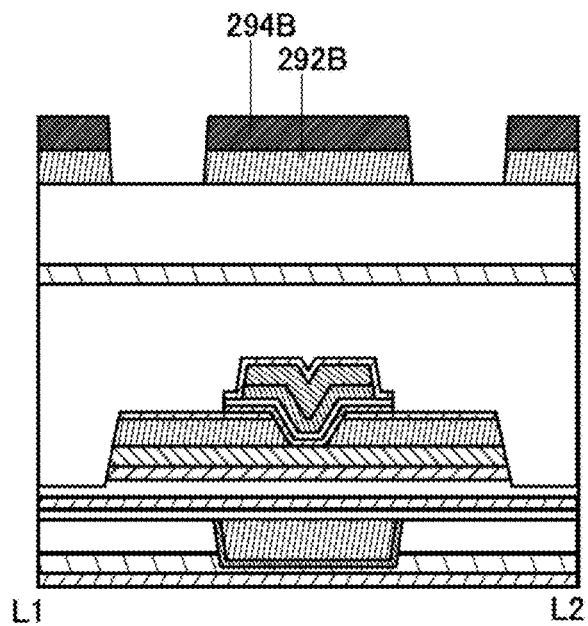
Figure 6D:
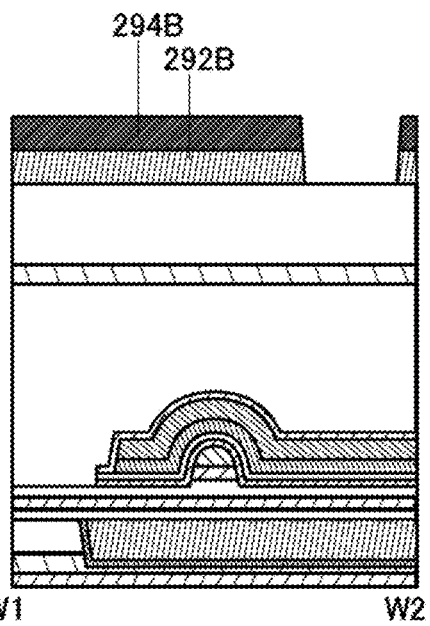

Then, part of the film 292A to be a hard mask and part of the film 294A to be a hard mask are removed using the resist mask 296 to form a hard mask 292B and a hard mask 294B (FIGS. 6C and 6D). At this time, the resist mask 296 is removed by the etching in some cases.

Figure 7A:
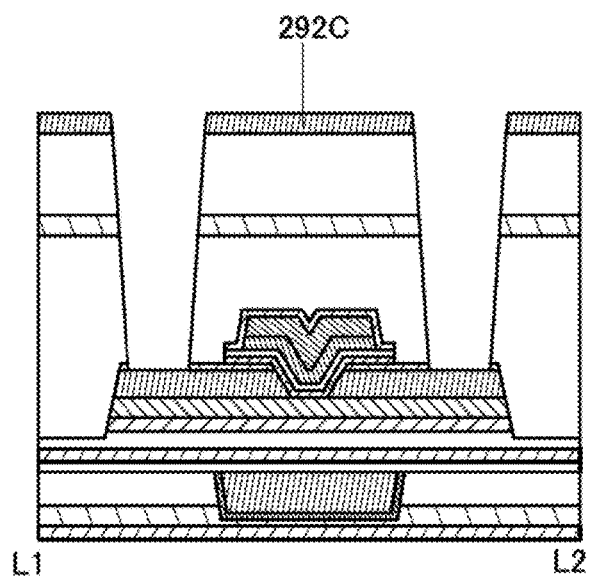
FIGS. 7A to 7D are cross-sectional views illustrating a method for manufacturing a semiconductor device of one embodiment of the present invention.
Figure 7B:
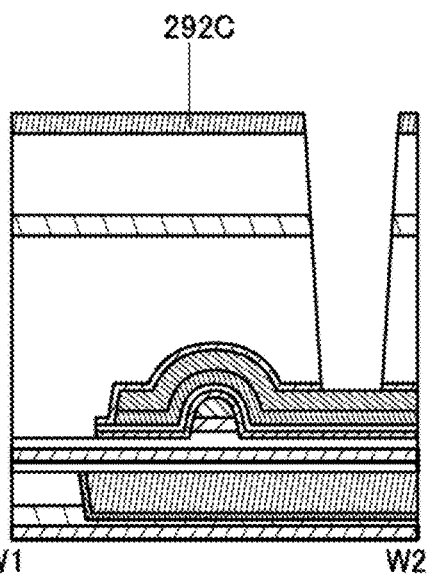

Subsequently, the openings are formed in the insulators 286, 282, and 280 using the hard masks 292B and 294B to expose the conductors 260 and 240 (FIGS. 7A and 7B). At this time, the hard mask 294B is removed by the etching. Furthermore, part of the hard mask 292B is removed, so that a hard mask 292C is formed.

Figure 7C:
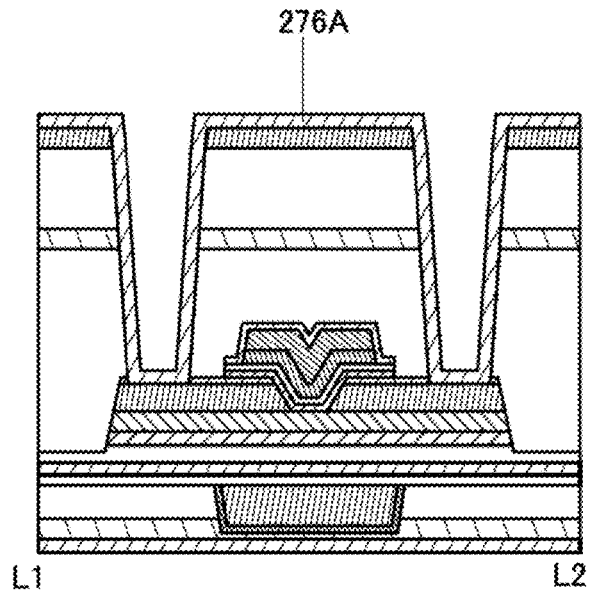
Figure 7D:
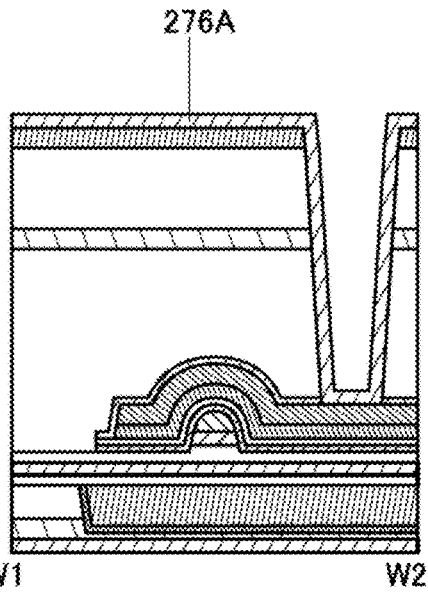

Next, a barrier film 276A is formed over the hard mask 292C and in the openings that are formed by the above etching. As the barrier film 276A, aluminum oxide is formed by an ALD method, for example (FIGS. 7C and 7D).

Figure 8A:
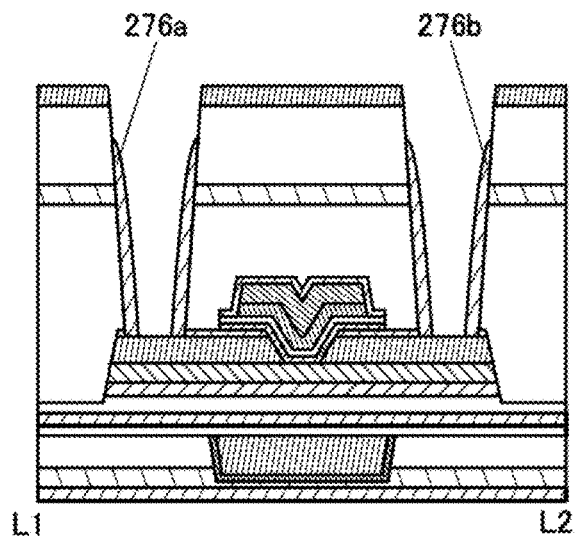
FIGS. 8A to 8D are cross-sectional views illustrating a method for manufacturing a semiconductor device of one embodiment of the present invention.
Figure 8B:
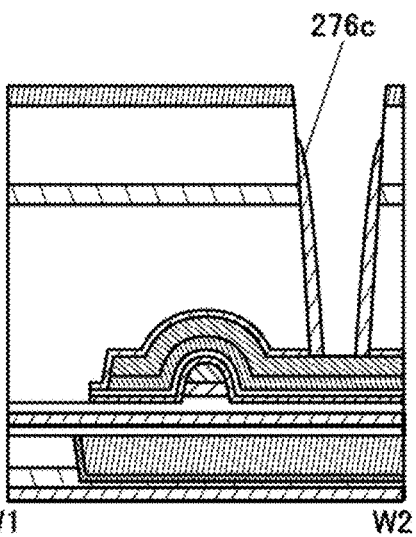

After that, the barrier film 276A is partly removed in regions where the barrier film 276A is in contact with the conductors 260 and 240. For example, etch-back processing is performed until the conductors 260 and 240 are exposed, so that the barrier layers 276 can be formed (FIGS. 8A and 8B).

Note that cleaning is preferably performed after the etch-back processing. An etching residue of the barrier film 276A remaining in the openings can be removed by the cleaning. For the cleaning, an alkaline solution such as a resist stripping solution can be used, for example.

In some cases, an unnecessary layer formed of an oxide or the like is formed on surfaces of the conductors 240 exposed as a result of the etching. Note that the unnecessary layer is a layer containing a residue that includes the component of the barrier layers 276 or a layer containing a product that includes the component of the conductors 240. The unnecessary layer may be formed of a composite of the residue and the product. The unnecessary layer is preferably removed because the layer increases the contact resistance between the conductors 240 and the conductors 246 and 248.

The formed unnecessary layer can be removed by wet etching, plasma treatment, or the like depending on its component or shape. For example, to remove an unnecessary layer containing aluminum oxide, plasma treatment is preferably performed in an atmosphere containing a rare gas such as argon (Ar). To remove an unnecessary layer containing tantalum nitride, plasma treatment is preferably performed in an atmosphere including a gas containing a halogen, such as $CF_4$, $BC_{13}$, $NF_3$, or $SF_6$, that is less likely to generate a polymer, for example.

At this time, the barrier layers 276 preferably cover at least part of the side surfaces of the openings in the insulators 280 and 282. With such a structure, the insulator 280 and the transistor 200 can be sealed. Thus, excess oxygen contained in the insulator 280 can be prevented from being absorbed by the conductors 248 and 246. Furthermore, the diffusion of hydrogen, which is an impurity, to the insulator 280 via the conductors 246 and 248 can be inhibited.

With the barrier layers 276, the oxide where the channel is formed in the transistor 200 can be an oxide semiconductor with a low density of defect states and stable characteristics. That is, a change in electrical characteristics of the transistor 200 can be prevented and the reliability can be improved.

In addition, with the barrier layers 276, excess oxygen can be supplied to the transistor 200 stably regardless of the shape or the position of the plug or the wiring provided in the semiconductor device or the number of the plugs or the wirings. Since oxygen vacancies are less likely to be formed when the diffusion of hydrogen is inhibited, generation of carriers can be inhibited. Thus, the transistor 200 can have stable electrical characteristics. Moreover, the design flexibility of the semiconductor device can be increased.

Figure 8C:
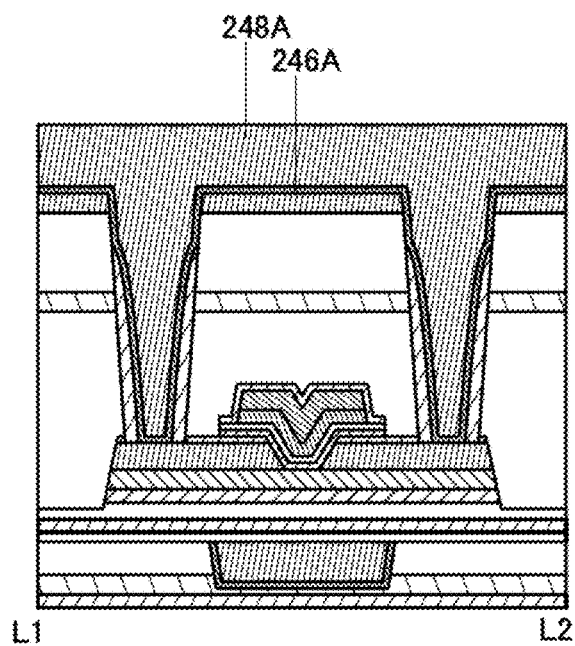
Figure 8D:
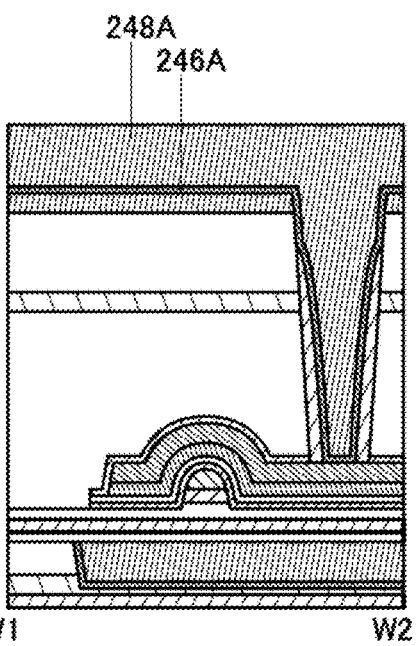
Figure 9A:
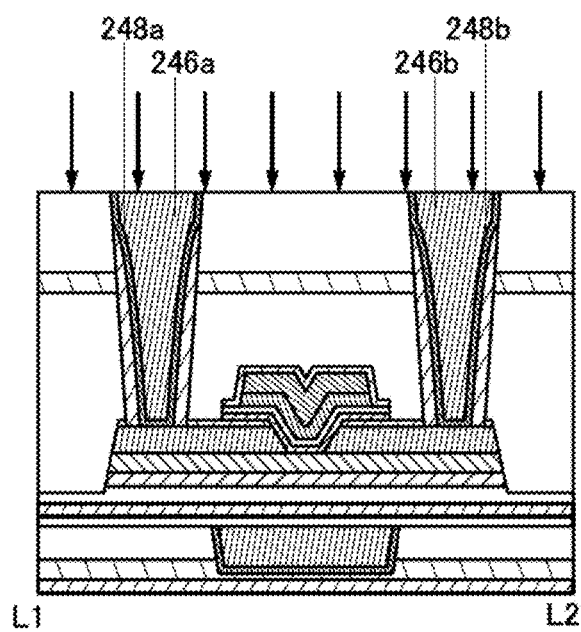
FIGS. 9A and 9B are cross-sectional views illustrating a method for manufacturing a semiconductor device of one embodiment of the present invention.
Figure 9B:
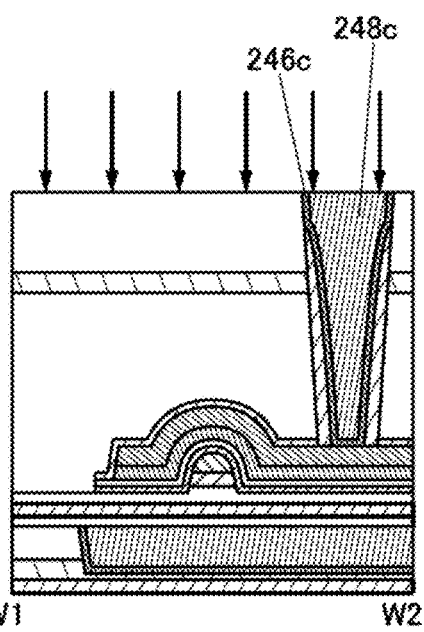

Next, a conductive film 246A and a conductive film 248A are formed. The conductive films 246A and 248A can be formed by a sputtering method, a CVD method, an MBE method, a PLD method, an ALD method, or the like. The conductive films 246A and 248A are formed so as to fill the openings formed in the insulator 280 and the like. Thus, it is preferable to use a CVD method (in particular, an MOCVD method). In order to increase the adhesion of the conductor formed by an MOCVD method, a multilayer film of a conductor formed by an ALD method or the like and a conductor formed by a CVD method is preferably formed in some cases. For example, titanium nitride is formed as the conductive film 246A and tungsten is formed as the conductive film 248A (FIGS. 8C and 8D).

Then, unnecessary portions of the conductive films 246A and 248A are removed. For example, part of the conductive film 246A, part of the conductive film 248A, and the hard mask 292C are removed by etch-back processing, chemical mechanical polishing (CMP) processing, or the like until the insulator 280 is exposed, whereby the conductors 246 and 248 are formed (FIGS. 9A and 9B, where arrows show the CMP processing). At this time, the insulator 280 can be used as a stopper layer, and the thickness of the insulator 280 is reduced in some cases.

Through the above steps, the semiconductor device of one embodiment of the present invention can be manufactured.

<Transistor Structure 2>

Figure 10A:
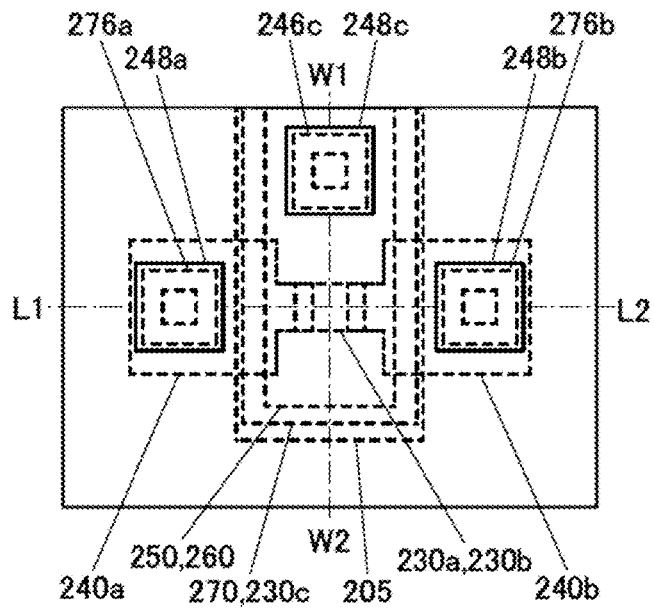
FIGS. 10A to 10C are a top view and cross-sectional views illustrating a structure of a semiconductor device of one embodiment of the present invention.
Figure 10C:
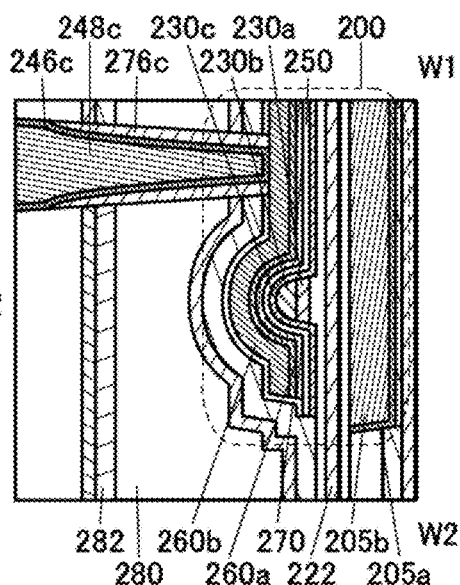
Figure 10B:
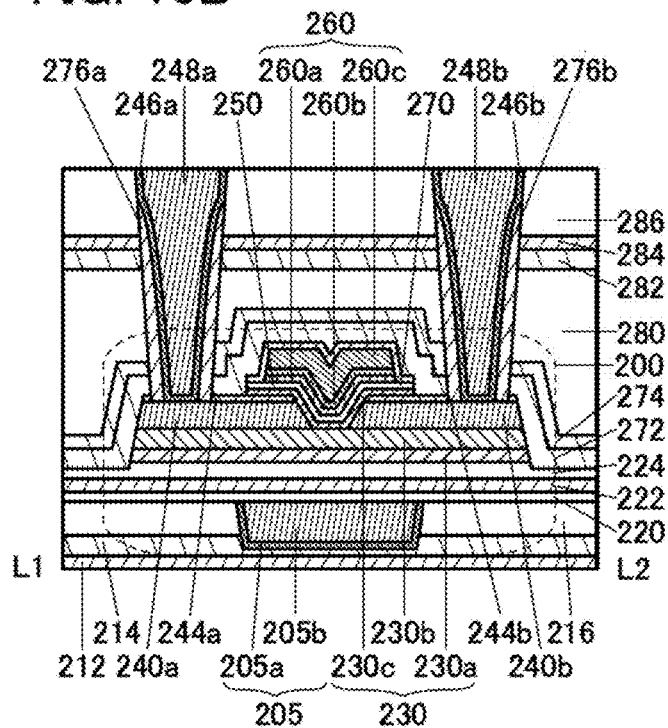

FIGS. 10A to 10C illustrate another example of a structure applicable to the transistor 200. FIG. 10A illustrates the top surface of the transistor 200. For simplification of the drawing, some films are not illustrated in FIG. 10A. FIG. 10B is a cross-sectional view taken along a dashed-dotted line L1-L2 in FIG. 10A, and FIG. 10C is a cross-sectional view taken along a dashed-dotted line W1-W2.

Note that in the transistor 200 illustrated in FIGS. 10A to 10C, components having the same functions as the components in the transistor 200 in FIGS. 1A to 1C are denoted by the same reference numerals.

In the structure illustrated in FIGS. 10A to 10C, the conductor 260 has a three-layer structure. For example, the conductor 260a can be formed using an oxide typified by an In—Ga—Zn oxide. An oxide semiconductor typified by an In—Ga—Zn oxide has an increased carrier density by being supplied with nitrogen or hydrogen. In other words, the oxide semiconductor functions as an oxide conductor (OC). When a metal nitride is provided as the conductor 260b, the oxide semiconductor has a higher carrier density and thus, the conductor 260a functions as a gate electrode.

An oxide semiconductor typified by an In—Ga—Zn oxide can be used as the conductor 260a. The conductor 260a can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as an In—Sn—Si oxide or ITSO).

The conductor 260a is preferably formed by a sputtering method in an atmosphere containing an oxygen gas. In the case where the conductor 260a is formed in an atmosphere containing an oxygen gas, an excess-oxygen region can be formed in the insulator 250. Note that a method for forming the conductor 260a is not limited to a sputtering method, and other methods such as an ALD method may be used.

The use of a metal nitride for the conductor 260b produces the following effects: the resistance of the conductor 260a is reduced by the diffusion of the constituent element (especially, nitrogen) of the metal nitride to the conductor 260a; and the resistance is reduced by damage (e.g., sputtering damage) caused during the deposition of the conductor 260b. Furthermore, when a low-resistance metal film is stacked as a conductor 260c, a transistor with a driving voltage can be provided.

The structure illustrated in FIGS. 10A to 10C may include an insulator 284 over the insulator 282. As the insulator 284, aluminum oxide is formed by an ALD method, for example. A dense insulating layer including reduced defects such as cracks and pinholes or having a uniform thickness can be formed by an ALD method.

The structure illustrated in FIGS. 10A to 10C may further include an insulator 272 and an insulator 274 that are provided so as to cover the transistor 200. In that case, the insulator 272 is preferably in contact with a side surface of the insulator 250 and the top surface of the insulator 224. The insulators 272 and 274 can each function as a barrier insulating film that prevents impurities such as water or hydrogen from entering the transistor or the like from a layer over the insulators 272 and 274.

For the insulator 272, an oxide insulator that is formed by a sputtering method is preferably used, and for example, aluminum oxide is preferably used. With the insulator 272 formed using such an oxide insulator formed by a sputtering method, oxygen can be added to surfaces in contact with the insulators 224 and 250, so that the insulators 224 and 250 can be in an oxygen excess state.

<Transistor Structure 3>

Figure 11A:
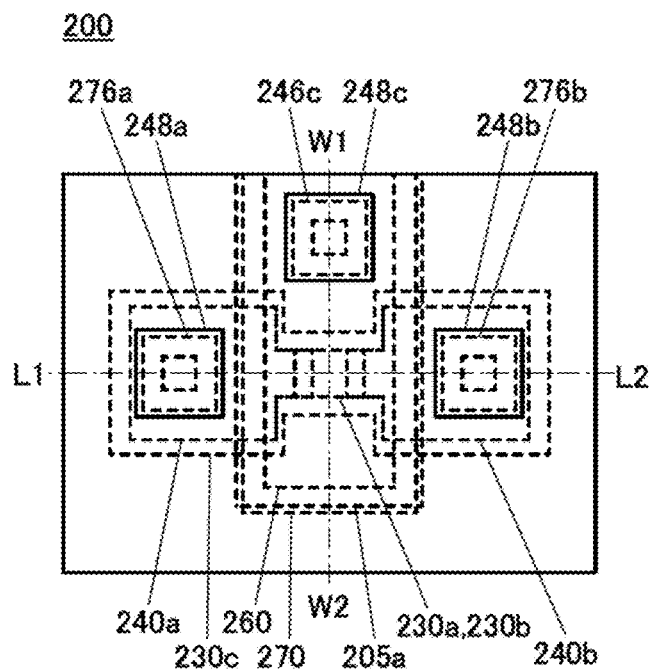
FIGS. 11A to 11C are a top view and cross-sectional views illustrating a structure of a semiconductor device of one embodiment of the present invention.
Figure 11C:
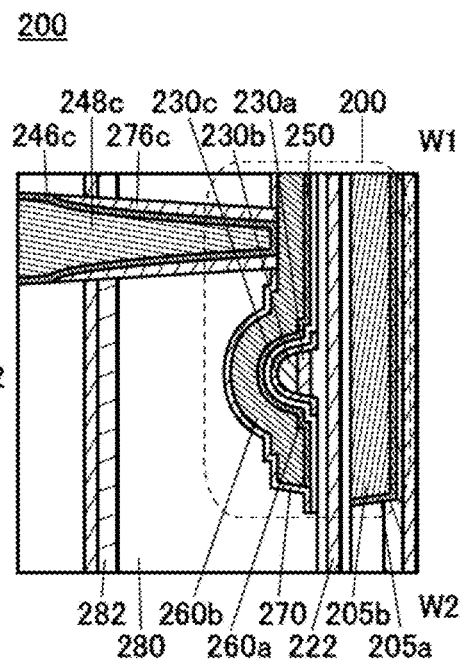
Figure 11B:
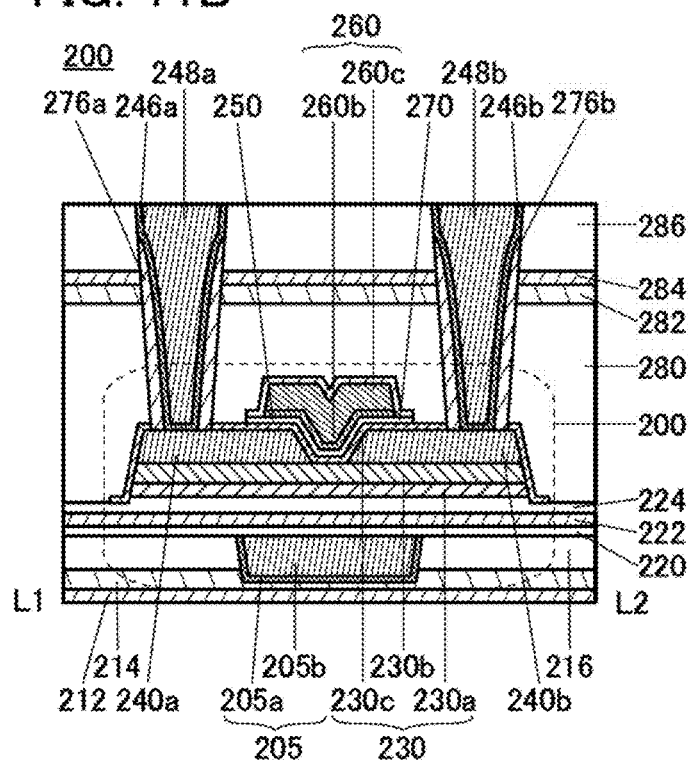

FIGS. 11A to 11C illustrate another example applicable to the transistor 200. FIG. 11A illustrates the top surface of the transistor 200. For simplification of the drawing, some films are not illustrated in FIG. 11A. FIG. 11B is a cross-sectional view taken along a dashed-dotted line L1-L2 in FIG. 11A, and FIG. 11C is a cross-sectional view taken along a dashed-dotted line W1-W2 in FIG. 11A.

Note that in the transistor 200 illustrated in FIGS. 11A to 11C, components having the same functions as the components in the transistor 200 in FIGS. 1A to 1C are denoted by the same reference numerals.

In the structure illustrated in FIGS. 11A to 11C, the oxide 230c covers the top surfaces of the conductors 240 and side surfaces of the oxides 230a and 230b. Thus, the oxide 230c can also function as the barrier layers 244, which enables process simplification.

The structures, the methods, and the like described in this embodiment can be combined as appropriate with any of the structures, the methods, and the like described in the other embodiments and examples.

Embodiment 2

In this embodiment, one embodiment of a semiconductor device will be described with reference to FIG. 12, FIG. 13, FIG. 14, and FIG. 15.

[Memory Device 1]

Examples of a semiconductor device (a memory device) including the transistor 200 that is one embodiment of the present invention are illustrated in FIG. 12, FIG. 13, FIG. 14, and FIG. 15.

Figure 12:
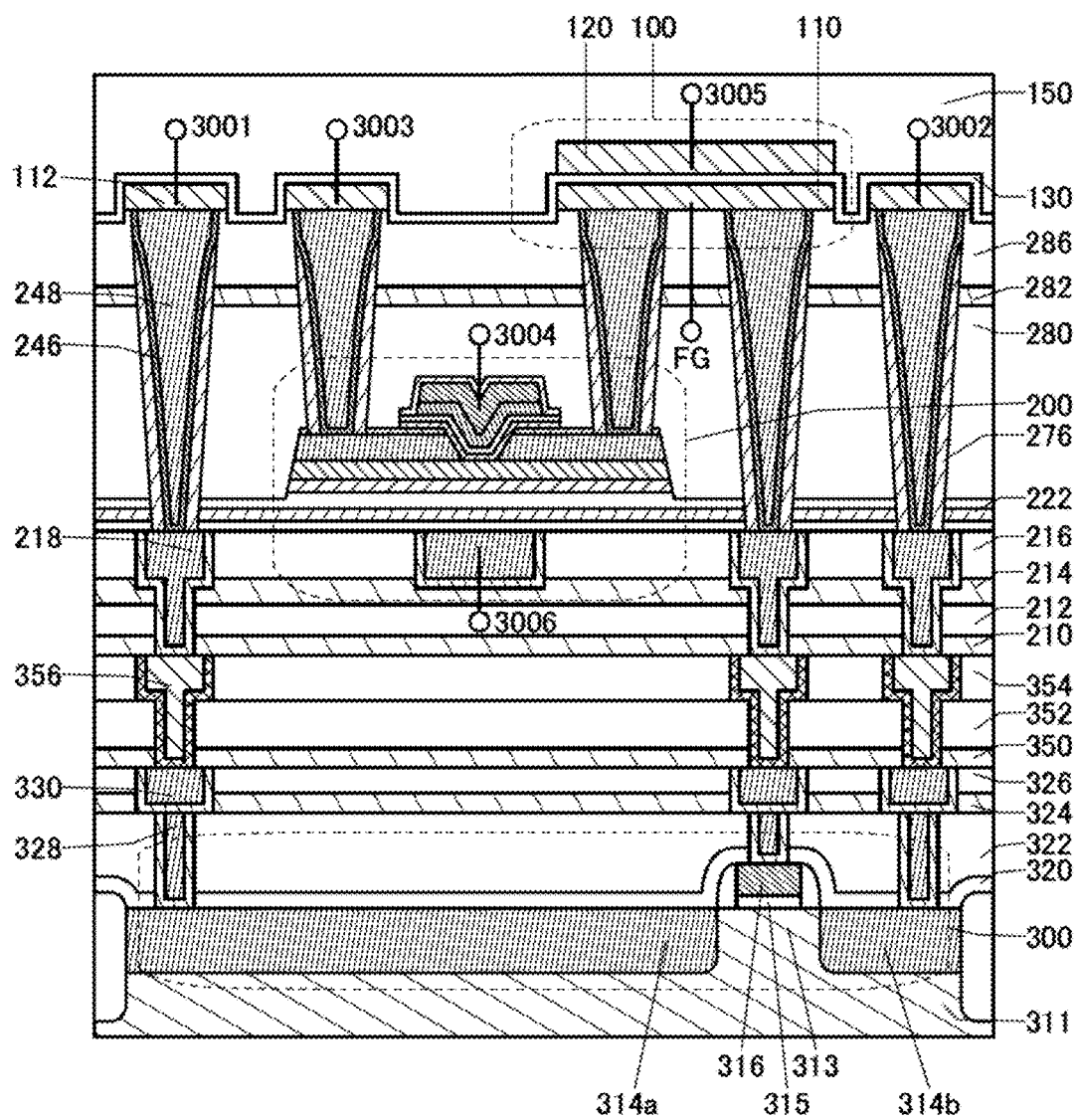
FIG. 12 is a cross-sectional view illustrating a structure of a semiconductor device of one embodiment of the present invention.
Figure 13:
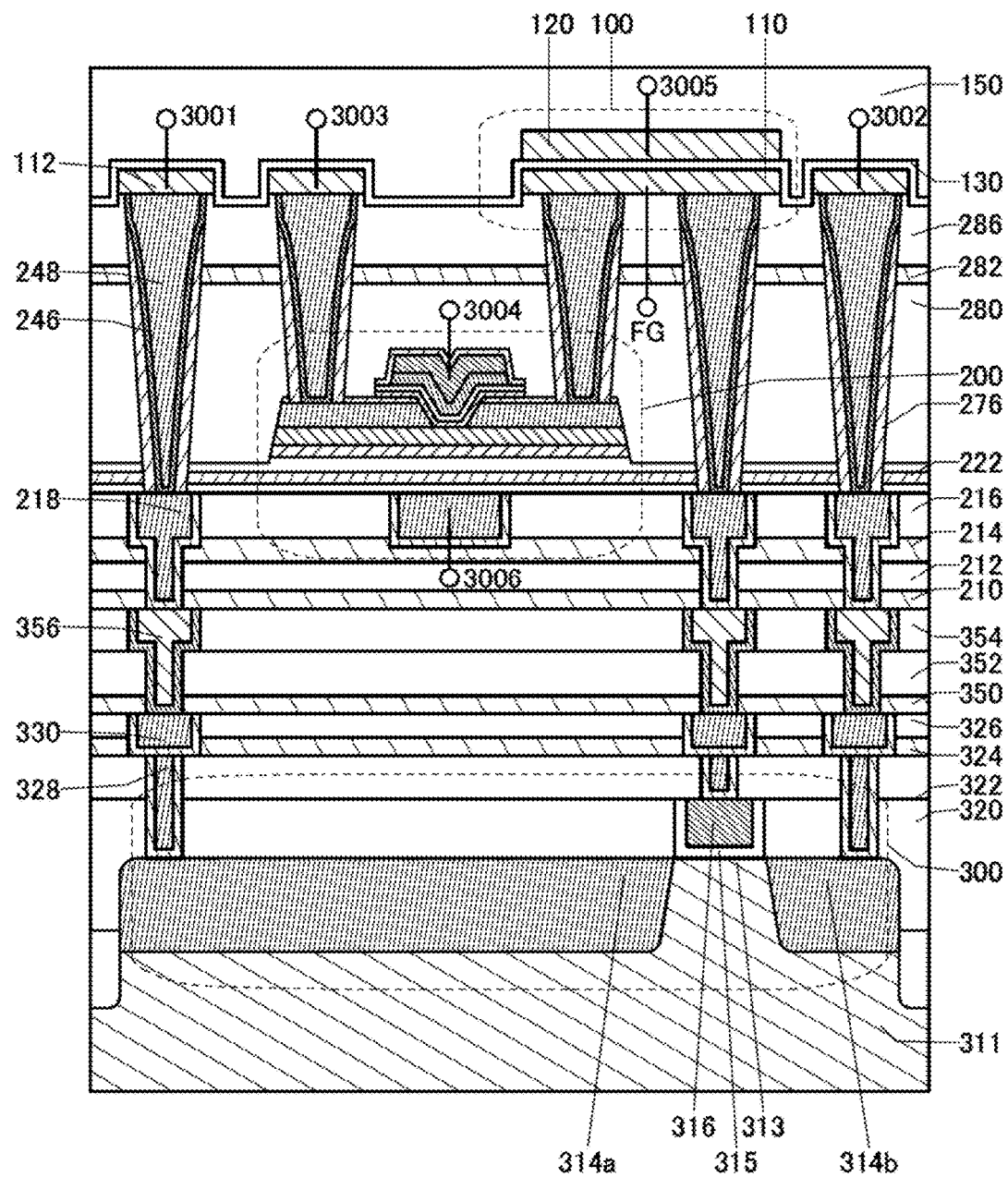
FIG. 13 is a cross-sectional view illustrating a structure of a semiconductor device of one embodiment of the present invention.

Semiconductor devices illustrated in FIG. 12 and FIG. 13 each include a transistor 300, a transistor 200, and a capacitor 100.

The transistor 200 is a transistor in which a channel is formed in a semiconductor layer including an oxide semiconductor. Since the off-state current of the transistor 200 is low, by using the transistor 200 in a memory device, stored data can be retained for a long time. In other words, such a memory device does not require refresh operation or has an extremely low frequency of the refresh operation, which leads to a sufficient reduction in power consumption.

In FIG. 12 and FIG. 13, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to a first gate of the transistor 200. A wiring 3006 is electrically connected to a second gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor devices illustrated in FIG. 12 and FIG. 13 each have a feature that the potential of the gate of the transistor 300 can be retained, and thus enables writing, retaining, and reading of data as follows.

Writing and retaining of data will be described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained at the node FG (retaining).

In the case where the off-state current of the transistor 200 is low, the charge of the node FG is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level charge is given to the gate of the transistor 300 is lower than an apparent threshold voltage $V_{th\_L}$ at the time when the low-level charge is given to the gate of the transistor 300. Here, an apparent threshold voltage refers to the potential of the wiring 3005 which is needed to make the transistor 300 be in "on state." Thus, the potential of the wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the wiring 3005 is $V_0$ ($>V_{th\_H}$), the transistor 300 is brought into "on state." On the other hand, in the case where the low-level charge is supplied to the node FG in writing, even when the potential of the wiring 3005 is $V_0$ ($<V_{th\_L}$), the transistor 300 remains in "off state." Thus, the data retained in the node FG can be read by determining the potential of the wiring 3002.

By arranging semiconductor devices each having the structure illustrated in FIG. 12 or FIG. 13 in a matrix, a memory cell array can be formed.

Note that in the case where memory cells are arrayed, it is necessary that data of a desired memory cell be read in read operation. For example, when a p-channel transistor is used as the transistor 300, the memory cell has a NOR-type structure. Thus, only data of a desired memory cell can be read by supplying a potential at which the transistor 300 is in "off state" regardless of the charge supplied to the node FG, that is, a potential lower than $V_{th\_H}$ to the wiring 3005 of memory cells from which data is not read. Alternatively, when an n-channel transistor is used as the transistor 300, the memory cell has a NAND-type structure. Thus, only data of a desired memory cell can be read by supplying a potential at which the transistor 300 is in "on state" regardless of the charge supplied to the node FG, that is, a potential higher than $V_{th\_L}$ to the wiring 3005 of memory cells from which data is not read.

<Structure of Semiconductor Device 1>

The semiconductor device of one embodiment of the present invention includes the transistor 300, the transistor 200, and the capacitor 100 as illustrated in FIG. 12. The transistor 200 is provided above the transistor 300, and the capacitor 100 is provided above the transistor 300 and the transistor 200.

The transistor 300 is provided over a substrate 311 and includes a conductor 316, an insulator 315, a semiconductor region 313 that is a part of the substrate 311, and low-resistance regions 314a and 314b functioning as a source region and a drain region.

The transistor 300 may be a p-channel transistor or an n-channel transistor.

It is preferable that a region of the semiconductor region 313 where a channel is formed, a region in the vicinity thereof, the low-resistance regions 314a and 314b functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stacked layer of metal materials such as tungsten and aluminum as the conductor. In particular, tungsten is preferable in terms of heat resistance.

Note that the transistor 300 illustrated in FIG. 12 is only an example and is not limited to the structure illustrated therein; an appropriate transistor may be used in accordance with a circuit configuration or a driving method.

An insulator 320, an insulator 322, an insulator 324, and an insulator 326 are stacked sequentially so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents impurities and hydrogen from diffusing from the substrate 311, the transistor 300, or the like into a region where the transistor 200 is formed. The barrier property herein refers to a high oxidation resistance and a function of inhibiting the diffusion of oxygen and impurities typified by hydrogen, and water.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in the TDS analysis in the range of 50° C. to 500° C., for example.

Note that the permittivity of the insulator 326 is preferably lower than that of the insulator 324. For example, the relative permittivity of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low permittivity is used as an interlayer film, the parasitic capacitance between wirings can be reduced.

A conductor 328, a conductor 330, and the like that are electrically connected to the capacitor 100 or the transistor 200 are provided in the insulator 320, the insulator 322, the insulator 324, and the insulator 326. Note that the conductor 328 and the conductor 330 each function as a plug or a wiring. A plurality of structures of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 12, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 300 and the transistor 200 can be separated by a barrier layer, so that the diffusion of hydrogen from the transistor 300 to the transistor 200 can be prevented.

Note that as the conductor having a barrier property against hydrogen, tantalum nitride may be used, for example. By stacking tantalum nitride and tungsten, which has high conductivity, the diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

An insulator 210, the insulator 212, the insulator 214, and the insulator 216 are stacked sequentially over the insulator 354. A material having a barrier property against oxygen and hydrogen is preferably used for any of the insulator 210, the insulator 212, the insulator 214, and the insulator 216.

The insulators 210 and 214 are preferably formed using, for example, a film having a barrier property that prevents hydrogen and impurities from diffusing from the substrate 311, a region where the transistor 300 is formed, or the like to a region where the transistor 200 is formed. Therefore, the insulators 210 and 214 can be formed using a material similar to that used for forming the insulator 324.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the film having a barrier property against hydrogen, for example, as each of the insulators 210 and 214, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

For example, the insulators 212 and 216 can be formed using a material similar to that used for forming the insulator 320. In the case where interlayer films formed of a material with a relatively low permittivity are used for the insulators, the parasitic capacitance between wirings can be reduced. For example, a silicon oxide film, a silicon oxynitride film, or the like can be used for the insulators 212 and 216.

A conductor 218, a conductor (the conductor 205) included in the transistor 200, and the like are provided in the insulators 210, 212, 214, and 216. Note that the conductor 218 functions as a plug or a wiring that is electrically connected to the capacitor 100 or the transistor 300. The conductor 218 can be formed using a material similar to those used for forming the conductors 328 and 330.

In particular, part of the conductor 218 which is in contact with the insulators 210 and 214 is preferably a conductor with a barrier property against oxygen, hydrogen, and water. In such a structure, the transistors 300 and 200 can be completely separated by the layer with a barrier property against oxygen, hydrogen, and water. As a result, the diffusion of hydrogen from the transistor 300 to the transistor 200 can be prevented.

The transistor 200 is provided over the insulator 216. Note that, for example, the structure of the transistor described in the above embodiment can be used as the structure of the transistor 200. Note that the transistor 200 in FIG. 12 is only an example and is not limited to the structure illustrated therein; an appropriate transistor may be used in accordance with a circuit configuration or a driving method.

The insulator 280 is provided over the transistor 200. In the insulator 280, an excess-oxygen region is preferably formed. In particular, in the case of using an oxide semiconductor in the transistor 200, when an insulator including an excess-oxygen region is provided in an interlayer film or the like in the vicinity of the transistor 200, oxygen vacancies in the oxide 230 included in the transistor 200 are reduced, whereby the reliability can be improved. The insulator 280 that covers the transistor 200 may function as a planarization film that covers a roughness thereunder.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 282 is provided over the insulator 280. A material having a barrier property against oxygen or hydrogen is preferably used for the insulator 282. Thus, the insulator 282 can be formed using a material similar to that used for forming the insulator 214. As the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

The insulator 286 is provided over the insulator 282. The insulator 286 can be formed using a material similar to that of the insulator 320. In the case where a material with a relatively low permittivity is used for an interlayer film, the parasitic capacitance between wirings can be reduced. For example, a silicon oxide film, a silicon oxynitride film, or the like can be used for the insulator 286.

The barrier layers 276, the conductors 246, the conductors 248, and the like are provided in the insulators 220, 222, 224, 280, 282, and 286.

The conductors 246 and 248 function as plugs or wirings that are electrically connected to the capacitor 100, the transistor 200, or the transistor 300. The conductors 246 and 248 can be formed using a material similar to those used for forming the conductors 328 and 330.

Here, the barrier layers 276 are provided between the insulator 280 and the conductors 246 and 248. It is particularly preferable that the barrier layers 276 be provided to be in contact with the insulators 282 and 222 having a barrier property. Since the barrier layers 276 are in contact with the insulators 282 and 222, the insulator 280 and the transistor 200 can be sealed by the insulators 222 and 282 having a barrier property and the barrier layers 276. Thus, the diffusion of excess oxygen contained in the insulator 280 to a component in the vicinity of the transistor 200 and the diffusion of hydrogen from other components can be inhibited.

That is, with the barrier layers 276, the diffusion of hydrogen serving as an impurity in the conductors 246 and 248, the diffusion of constituent elements of the conductors 246 and 248, and the diffusion of hydrogen serving as an impurity from the transistor 300, the capacitor 100, or the outside via the conductors 246 and 248 can be inhibited.

With the barrier layers 276, the oxide where the channel is formed in the transistor 200 can be an oxide semiconductor with a low density of defect states and stable characteristics. That is, a change in electrical characteristics of the transistor 200 can be prevented and the reliability can be improved.

In addition, with the barrier layers 276, excess oxygen can be supplied to the transistor 200 stably regardless of the shape or the position of the plug or the wiring provided in the semiconductor device or the number of the plugs or the wirings. Since oxygen vacancies are less likely to be formed when the diffusion of hydrogen is inhibited, generation of carriers can be inhibited. Thus, the transistor 200 can have stable electrical characteristics. Moreover, the design flexibility of the semiconductor device can be increased.

The capacitor 100 is provided above the transistor 200. The capacitor 100 includes a conductor 110, a conductor 120, and an insulator 130.

A conductor 112 may be provided over the conductors 246 and 248. Note that the conductor 112 functions as a plug or a wiring that is electrically connected to the capacitor 100, the transistor 200, or the transistor 300. The conductor 110 functions as the one electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 12; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 100 having the structure, the dielectric strength can be increased and the electrostatic breakdown of the capacitor 100 can be prevented because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material may be used.

An insulator 150 is provided over the conductor 120 and the insulator 130. The insulator 150 can be formed using a material similar to that used for forming the insulator 320. The insulator 150 may function as a planarization film that covers a roughness thereunder.

The above is the description of the structure example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

Modification Example 1

FIG. 13 illustrates a modification example of this embodiment. FIG. 13 is different from FIG. 12 in the structure of the transistor 300.

In the transistor 300 illustrated in FIG. 13, the semiconductor region 313 (part of the substrate 311) in which the channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

The above is the description of the modification example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

<Structure of Memory Cell Array>

Figure 14:
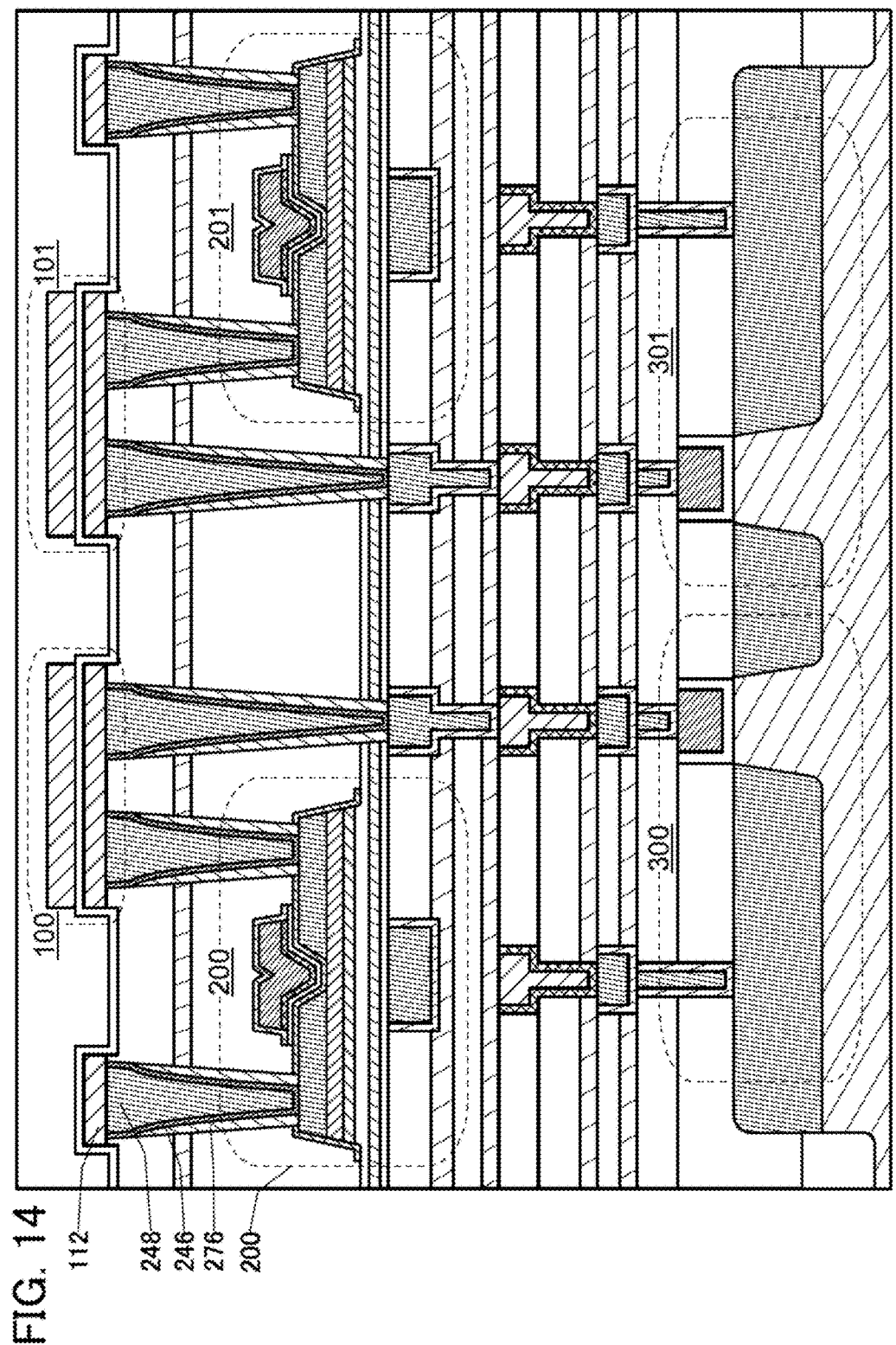
FIG. 14 is a cross-sectional view illustrating a structure of a semiconductor device of one embodiment of the present invention.

FIG. 14 illustrates an example of a memory cell array of this embodiment. FIG. 14 is a circuit diagram which illustrates part of a row in which the semiconductor devices each of which is illustrated in FIG. 13 are arranged in a matrix.

In FIG. 14, the semiconductor device which includes the transistor 300, the transistor 200, and the capacitor 100 and a semiconductor which includes a transistor 301, a transistor 201, and a capacitor 101 are arranged in the same row.

As illustrated in FIG. 14, the memory cell array includes a plurality of transistors (the transistors 200 and 201 in the drawing).

When a plurality of transistors are included, a plurality of wirings are provided, depending on the number of the transistors. Thus, the larger the number of transistors is, the larger the number of formed wirings or plugs is. In the case of increasing the transistor integration degree, the proportion of the oxygen-excess region of the insulator 280 in one transistor is preferably small. Thus, the effect of the barrier layers 276 becomes remarkable.

Even when a plurality of transistors are included, the diffusion of excess oxygen contained in the insulator 280 to a component in the vicinity of the transistor 200 and the diffusion of hydrogen from other components can be inhibited, with the barrier layers 276.

Specifically, with the barrier layers 276, the diffusion of hydrogen serving as an impurity in the conductors 246 and 248, the diffusion of constituent elements of the conductors 246 and 248, and the diffusion of hydrogen serving as an impurity from the transistor 300, the capacitor 100, the transistor 301, the capacitor 101, or the outside via the conductors 246 and 248 can be inhibited. Furthermore, a reduction in the reliability of the semiconductor device, which is caused by not filling oxygen vacancies in the oxide 230 of the transistor 200 or the transistor 201 with excess oxygen because of the absorption of the excess oxygen by the conductors 246 and 248, can be prevented.

With the barrier layers 276, the oxide where the channel is formed in the transistor 200 or the transistor 201 can be an oxide semiconductor with a low density of defect states and stable characteristics. That is, a change in electrical characteristics of the transistor 200 or the transistor 201 can be prevented and the reliability can be improved.

With such a structure, excess oxygen can be supplied to the transistor 200 stably regardless of the shape or the position of the plug or the wiring provided in the semiconductor device or the number of the plugs or the wirings. Since oxygen vacancies are less likely to be formed when the diffusion of hydrogen is inhibited, generation of carriers can be inhibited. Thus, the transistor 200 can have stable electrical characteristics. Moreover, the design flexibility of the semiconductor device can be increased.

[Memory Device 2]

Figure 15:
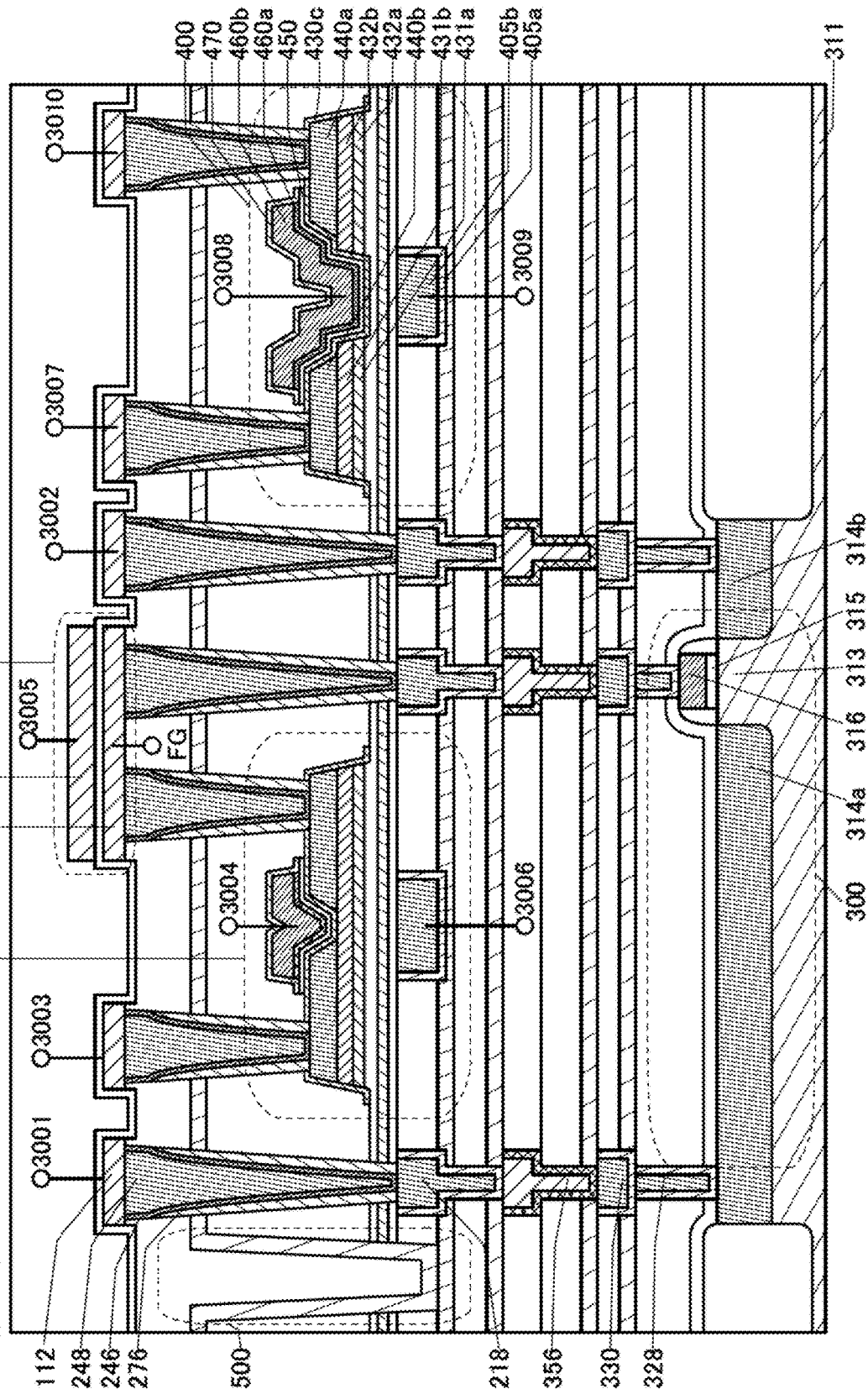
FIG. 15 is a cross-sectional view illustrating a structure of a semiconductor device of one embodiment of the present invention.

FIG. 15 illustrates an example of a memory device using the semiconductor device of one embodiment of the present invention.

The memory device illustrated in FIG. 15 includes a transistor 400 in addition to the semiconductor device illustrated in FIG. 12 that includes the transistor 200, the transistor 300, and the capacitor 100.

The transistor 400 can control second gate voltage of the transistor 200. For example, a first gate and a second gate of the transistor 400 are diode-connected to a source thereof, and the source of the transistor 400 is connected to the second gate of the transistor 200. When a negative potential of the second gate of the transistor 200 is held in this structure, first gate-source voltage and second gate-source voltage of the transistor 400 are 0 V. In the transistor 400, a drain current when the second gate voltage and first gate voltage are 0 V is extremely low; thus, the negative potential of the second gate of the transistor 200 can be held for a long time even without power supply to the transistors 200 and 400. Accordingly, the memory device including the transistors 200 and 400 can retain stored data for a long time.

In FIG. 15, the wiring 3001 is electrically connected to the source of the transistor 300. The wiring 3002 is electrically connected to the drain of the transistor 300. The wiring 3003 is electrically connected to one of the source and the drain of the transistor 200. The wiring 3004 is electrically connected to the first gate of the transistor 200. The wiring 3006 is electrically connected to the second gate of the transistor 200. The gate of the transistor 300 and the other of the source and the drain of the transistor 200 are electrically connected to one electrode of the capacitor 100. The wiring 3005 is electrically connected to the other electrode of the capacitor 100. A wiring 3007 is electrically connected to the source of the transistor 400. A wiring 3008 is electrically connected to the first gate of the transistor 400. A wiring 3009 is electrically connected to the second gate of the transistor 400. A wiring 3010 is electrically connected to the drain of the transistor 400. The wirings 3006, 3007, 3008, and 3009 are electrically connected one another.

Accordingly, the memory device illustrated in FIG. 15 has a feature that the potential of the gate of the transistor 300 can be held and thus enables writing, retaining, and reading of data.

When the memory devices in FIG. 15 are arranged in a matrix like the memory devices illustrated in FIG. 13, a memory cell array can be formed.

<Structure of Memory Device 2>

The transistor 400 and the transistor 200 are formed in the same tier and thus can be fabricated in parallel. The transistor 400 includes a conductor 460 (including a conductor 460a and a conductor 460b) functioning as a first gate electrode, a conductor 405 (including a conductor 405a and a conductor 405b) functioning as a second gate electrode, a barrier layer 470 in contact with the conductor 460, the insulators 220, 222, and 224 and an insulator 450 functioning as gate insulating layers, an oxide 430c including a region where a channel is formed, a conductor 440b and oxides 431a and 431b functioning as one of a source and a drain, and a conductor 440a and oxides 432a and 432b functioning as the other of the source and the drain.

In the transistor 400, the conductor 405 is in the same tier as the conductor 205. The oxides 431a and 432a are in the same tier as the oxide 230a, and the oxides 431b and 432b are in the same tier as the oxide 230b. The conductors 440 are in the same tier as the conductors 240. The oxide 430c is in the same tier as the oxide 230c. The insulator 450 is in the same tier as the insulator 250. The conductor 460 is in the same tier as the conductor 260. The barrier layer 470 is in the same tier as the barrier layer 270.

In the oxide 430c functioning as an active layer of the transistor 400, oxygen vacancies and impurities such as hydrogen or water are reduced, as in the oxide 230 or the like.

Accordingly, the threshold voltage of the transistor 400 can be higher than 0 V, an off-state current can be reduced, and the drain current when the second gate voltage and the first gate voltage are 0 V can be extremely low.

A dicing line (also referred to as a scribe line, a dividing line, or a cutting line) that is provided when a large-sized substrate is divided into semiconductor elements so that a plurality of semiconductor devices are each formed in a chip form will be described. In an example of a dividing method, for example, a groove (a dicing line) for separating the semiconductor elements is formed on the substrate, and then the substrate is cut along the dicing line so that a plurality of semiconductor devices that are separated are obtained. FIG. 15 is a cross-sectional view of a structure 500 around the dicing line, for example.

As in the structure 500, for example, openings are provided in the insulators 280, 224, 222, 220, and 216 around a region overlapping with the dicing line formed in an end portion of the memory cell including the transistor 200 or the transistor 400. Furthermore, the insulator 282 is provided so as to cover side surfaces of the insulators 280, 224, 222, 220, and 216.

Thus, in the openings, the insulators 222 and 214 are in contact with the insulator 282. At that time, at least one of the insulators 222 and 214 is formed using the same material and method as those used for forming the insulator 282, whereby adhesion therebetween can be improved. Aluminum oxide can be used, for example.

With such a structure, the insulator 280 and the transistors 200 and 400 can be enclosed with the insulators 210, 222, and 282. Since the insulators 210, 222, and 282 have functions of preventing the diffusion of oxygen, hydrogen, and water even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 or the transistor 400 can be prevented.

Furthermore, in the structure, excess oxygen in the insulator 280 can be prevented from diffusing to the outside of the insulators 282 and 222. Accordingly, excess oxygen in the insulator 280 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistor 200 or the transistor 400 can be prevented and the reliability can be improved.

Example 1

In this example, TDS measurement results of barrier layers formed over substrates are described. Note that in this example, Sample 1A, Sample 1B, Sample 1C, Sample 1D, Sample 1E, and Sample 1F were fabricated.

<Structures and Fabrication Methods of Samples>

Samples 1A to 1F each of which is one embodiment of the present invention are described below. Samples 1A to 1F have any of a structure 801 illustrated in FIG. 16A, a structure 802 illustrated in FIG. 16B, and a structure 803 illustrated in FIG. 16C.

Figure 16A:
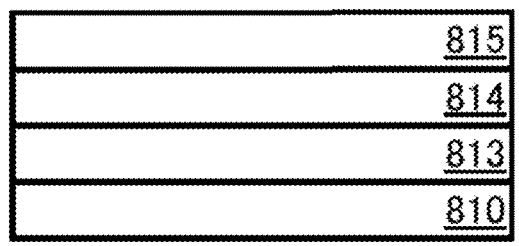
FIGS. 16A to 16C each illustrate a structure in Example.

Sample 1A and Sample 1D each have the structure 801 illustrated in FIG. 16A. The structure 801 includes a substrate 810, a barrier layer 813 over the substrate 810, an insulator 814 over the barrier layer 813, and an insulator 815 over the insulator 814.

Figure 16B:
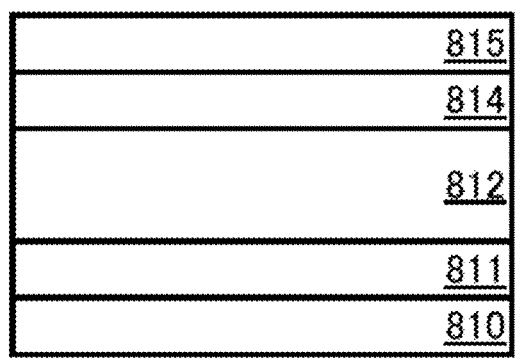

Sample 1B and Sample 1E each have the structure 802 illustrated in FIG. 16B. The structure 802 includes the substrate 810, an insulator 811 over the substrate 810, a conductor 812 over the insulator 811, the insulator 814 over the conductor 812, and the insulator 815 over the insulator 814.

Figure 16C:
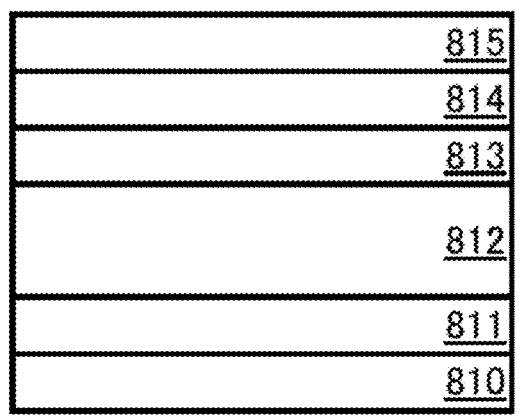
Figure 19A:
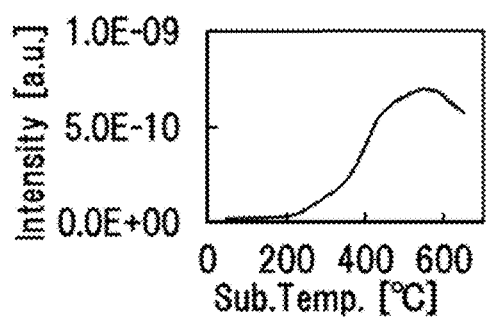
FIGS. 19A to 19D show TDS results in Example.
Figure 19B:
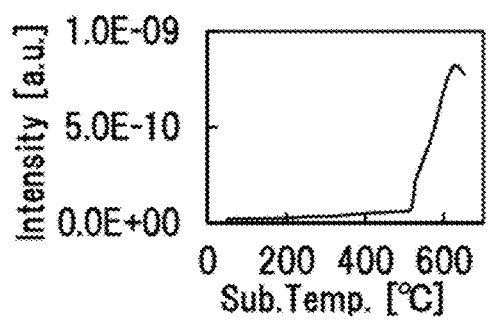
Figure 19C:
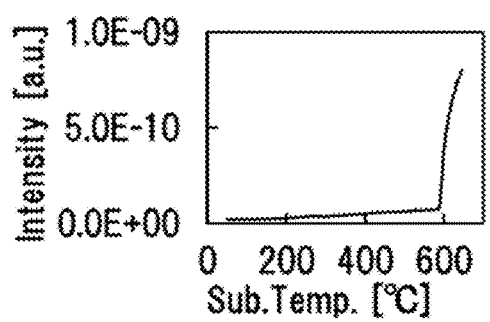
Figure 19D:
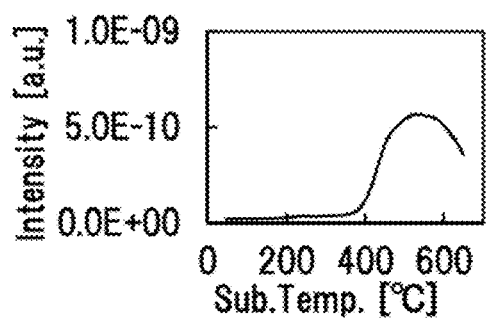

Sample 1C and Sample 1F each have the structure 803 illustrated in FIG. 16C. The structure 803 includes the substrate 810, the insulator 811 over the substrate 810, the conductor 812 over the insulator 811, the barrier layer 813 over the conductor 812, the insulator 814 over the barrier layer 813, and the insulator 815 over the insulator 814.

Note that heat treatment was performed for Samples 1D, 1E, and 1F after the formation of the insulator 815. Table 1 shows the structures of Samples 1A to 1F and whether the heat treatment was performed after the formation of the insulator 815.

was 250° C., a source gas obtained by vaporization of a liquid containing Al(CH$_3$)$_3$ was used, and an O$_3$ gas and an O$_2$ gas were used as oxidizing agents.

Next, for Samples 1B, 1C, 1E, and 1F, a stack including a titanium nitride film and a tungsten film was formed as the conductor 812 over the insulator 811. The titanium nitride film was formed by an ALD method to have a thickness of 5 nm. In the formation, TiCl$_4$ at a flow rate of 50 sccm was used as a source gas, NH$_3$ at a flow rate of 2700 sccm was used as a nitride material, the pressure of a deposition chamber was 667 Pa, and the substrate temperature was 380° C.

The tungsten film was formed to have a thickness of 150 nm through first to third deposition steps by a CVD method. First, in the first deposition step, a mixed gas of WF$_6$ at a flow rate of 160 sccm, SiH$_4$ at a flow rate of 400 sccm, Ar at a flow rate of 6000 sccm, and N$_2$ at a flow rate of 2000 sccm was used as a deposition gas, the pressure of a deposition chamber was set at 1000 Pa, and the substrate temperature was set at 385° C. In the second deposition step, a mixed gas of WF$_6$ at a flow rate of 250 sccm, H$_2$ at a flow rate of 4000 sccm, Ar at a flow rate of 2000 sccm, and N$_2$ at a flow rate of 2000 sccm was used as a deposition gas, the pressure of a deposition chamber was 10666 Pa, and the substrate temperature was 385° C. In the third deposition step, a mixed gas of WF$_6$ at a flow rate of 250 sccm, H$_2$ at a flow rate of 2200 sccm, Ar at a flow rate of 2000 sccm, and N$_2$ at a flow rate of 200 sccm was used as a deposition gas, the pressure of a deposition chamber was 10666 Pa, and the substrate temperature was 385° C.

Next, planarization treatment was performed on the top surface of the tungsten film by a CMP method, so that the thickness of the tungsten film became 100 nm.

Then, for Samples 1A, 1C, 1D, and 1F, 10-nm-thick aluminum oxide was formed as the barrier layer 813 by an ALD method. Note that the barrier layer 813 was formed over the substrate 810 for Samples 1A and 1D, and over the conductor 812 for Samples 1C and 1F. In the formation, the substrate temperature was 250° C., a source gas obtained by sublimation of a solid containing Al(CH$_3$)$_3$ was used, and an O$_3$ gas and an O$_2$ gas were used as oxidizing agents.

Subsequently, a 20-nm-thick silicon oxynitride film was formed as the insulator 814 by a plasma CVD method. Note that the insulator 814 was formed over the barrier layer 813 for Samples 1A, 1C, 1D, and 1F, and over the conductor 812 for Samples 1B and 1E. In the formation, SiH$_4$ at a flow rate of 8 sccm and N$_2$O at a flow rate of 4000 sccm were used as deposition gases, the pressure of a reaction chamber was

TABLE 1

|  | Structure | Insulator 811\Conductor 812 | Barrier layer 813 | Heat treatment |
|---|---|---|---|---|
| Sample 1A | 801 | Not included | Included | Not performed |
| Sample 1B | 802 | Included | Not included |  |
| Sample 1C | 803 |  | Included |  |
| Sample 1D | 801 | Not included | Included | Performed |
| Sample 1E | 802 | Included | Not included |  |
| Sample 1F | 803 |  | Included |  |

Next, methods for fabricating the samples will be described.

A silicon substrate was used as the substrate 810. For Samples 1B, 1C, 1E, and 1F, 20-nm-thick aluminum oxide was formed as the insulator 811 over the substrate 810 by an ALD method. In the formation, the substrate temperature 800 Pa, the substrate temperature was 325° C., and a high frequency (RF) power at 150 W (60 MHz) was applied.

Next, a 20-nm-thick aluminum oxide film was formed as the insulator 815 over the insulator 814 by a sputtering method. The insulator 815 was formed under the following conditions: an Al$_2$O$_3$ target was used, Ar at a flow rate of 25 sccm and O$_2$ at a flow rate of 25 sccm were used as deposition gases, the deposition pressure was 0.4 Pa, the deposition power was 2500 W, and the distance between the target and the substrate was 60 mm.

After that, for Samples 1D to 1F, heat treatment at 400° C. was performed in a nitrogen atmosphere for one hour, and then the atmosphere was replaced by an oxygen atmosphere and heat treatment was performed therein at 400° C. for one hour.

Through the above steps, Samples 1A to 1F in this example were completed.

<TDS Measurement Results of Samples>

The amount of oxygen contained in the insulator 814 of each sample was measured. For the measurement, TDS analysis was conducted on the insulator 814 of each sample after the insulator 815 was removed. In the TDS analysis, the amount of a released gas with a mass-to-charge ratio m/z of 32, which corresponds to an oxygen molecule, was measured. The TDS analysis was conducted with WA1000S manufactured by ESCO Ltd. at a heating rate of 30° C./min. FIGS. 17A to 17F show the measurement results.

FIGS. 17A, 17B, 17C, 17D, 17E, and 17F show the amounts of released oxygen in Samples 1A, 1B, 1C, 1D, 1E, and 1F, respectively. In each of FIGS. 17A to 17F, the lateral axis represents the substrate heating temperature [° C.] and the longitudinal axis represents the intensity proportional to the amount of the released gas with the above mass-to-charge ratio.

As shown in FIGS. 17A and 17D, the release of oxygen from the insulator 814 is observed in Samples 1A and 1D each having the structure 801. Meanwhile, as shown in FIGS. 17B and 17E, the release of oxygen from the insulator 814 is not observed in Samples 1B and 1E each having the structure 802.

The comparison between FIG. 17A and FIG. 17B indicates that oxygen contained in the insulator 814 in the structure 802 is probably absorbed by the conductor 812.

As shown in FIGS. 17C and 17F, the release of oxygen from the insulator 814 is observed in Samples 1C and 1F each having the structure 803.

The comparison between FIG. 17B and FIG. 17C indicates that, in the structure 803, the barrier layer 813 can prevent oxygen contained in the insulator 814 from being absorbed by the conductor 812.

The results in FIGS. 17A to 17F indicate that the heat treatment hardly affects the amount of oxygen contained in the insulator 814 in the structures 801 to 803. Accordingly, it is found that in the case of the structure including the barrier layer between the insulator and the conductor, excess oxygen contained in the insulator is hardly absorbed by the conductor even when heat treatment is performed in the post-process.

The above results indicate that the barrier layer provided between the conductor and the insulator can prevent excess oxygen contained in the insulator from being absorbed by the conductor.

The structure described in this example can be combined as appropriate with any of the structures described in the other examples and embodiments.

Example 2

In this example, TDS measurement results of structures in which barrier layers are formed over substrates will be described. Note that in this example, Sample 2A, Sample 2B, Sample 2C, and Sample 2D were fabricated.

<Structures and Fabrication Methods of Samples>

Samples 2A to 2D each of which is one embodiment of the present invention are described below. Samples 2A to 2D have a structure 804 illustrated in FIG. 18A or a structure 805 illustrated in FIG. 18B.

Figures 18A, 18B:
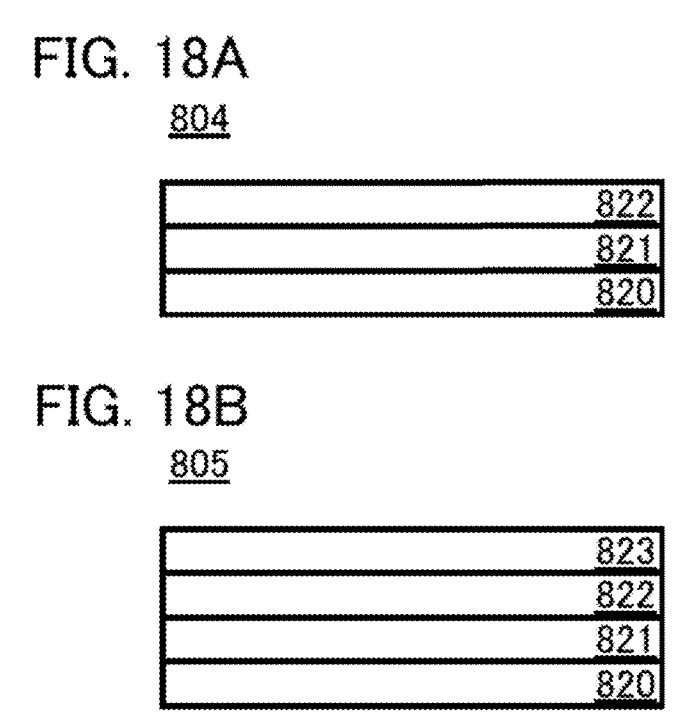

Sample 2A has the structure 804 illustrated in FIG. 18A. The structure 804 includes a substrate 820, an insulator 821 over the substrate 820, and an insulator 822 over the insulator 821.

Samples 2B to 2D each have the structure 805 illustrated in FIG. 18B. The structure 805 includes the substrate 820, the insulator 821 over the substrate 820, the insulator 822 over the insulator 821, and a barrier layer 823 over the insulator 822.

Note that the barrier layers 823 in Samples 2B to 2D were formed to have different thicknesses using different materials. Table 2 shows the materials and the thicknesses of the barrier layers 823 in Samples 2A to 2D.

TABLE 2

|  | Barrier layer 823 | |
| --- | --- | --- |
|  | Material | Thickness [nm] |
| Sample 2A | — | — |
| Sample 2B | AlO$x$ | 10 |
| Sample 2C | AlO$x$ | 20 |
| Sample 2D | TaN | 10 |

Next, the fabrication methods of the samples will be described.

A silicon substrate was used as the substrate 820. A 100-nm-thick thermal oxide film was formed as the insulator 821 over the substrate 820.

Next, a 50-nm-thick silicon oxynitride film was formed as the insulator 822 over the insulator 821 by a plasma CVD method. In the formation, SiH$_4$ at a flow rate of 40 sccm, NH$_3$ at a flow rate of 300 sccm, N$_2$O at a flow rate of 30 sccm, and N$_2$ at a flow rate of 900 sccm were used as deposition gases, the pressure of a reaction chamber was 160 Pa, the substrate temperature was 325° C., and a high frequency (RF) power at 250 W (27.12 MHz) was applied.

Through the above steps, Sample 2A in this example was completed. For Samples 2B to 2D, the barrier layer 823 was formed over the insulator 822.

For Sample 2B, 10-nm-thick aluminum oxide was formed as the barrier layer 823 by an ALD method. In the formation, the substrate temperature was 250° C., a source gas obtained by sublimation of a solid containing Al(CH$_3$)$_3$ was used, and an O$_3$ gas and an O$_2$ gas were used as oxidizing agents.

For Sample 2C, 20-nm-thick aluminum oxide was formed as the barrier layer 823 by an ALD method. In the formation, the substrate temperature was 250° C., a source gas obtained by sublimation of a solid containing Al(CH$_3$)$_3$ was used, and an O$_3$ gas and an O$_2$ gas were used as oxidizing agents.

For Sample 2D, 10-nm-thick tantalum nitride was formed as the barrier layer 823 by a sputtering method. In the formation, a tantalum (Ta) target was used, Ar at a flow rate of 25 sccm and N$_2$ at a flow rate of 25 sccm were used as sputtering gases, the substrate temperature was 300° C., the deposition pressure was 0.7 Pa, the deposition power was 4000 W, and the distance between the target and the substrate was 160 mm.

Through the above steps, Samples 2B to 2D in this example were completed.

<TDS Measurement Results of Samples>

The amount of released hydrogen in each sample was measured. In the TDS analysis, the amount of a released gas with a mass-to-charge ratio m/z of 2, which corresponds to a hydrogen molecule, was measured. The TDS analysis was conducted with WA1000S manufactured by ESCO Ltd. at a heating rate of 30° C./min. FIGS. 19A to 19D show the measurement results.

FIGS. 19A, 19B, 19C, and 19D show the amounts of released hydrogen in Samples 2A, 2B, 2C, and 2D. In each of FIGS. 19A to 19D, the lateral axis represents the substrate heating temperature [° C.] and the longitudinal axis represents the intensity proportional to the amount of the released gas with the above mass-to-charge ratio.

The results in FIGS. 19A to 19D indicate that the use of the barrier layer 823 can inhibit the release of hydrogen from the insulator 822. Furthermore, the comparison between FIG. 19B and FIG. 19D indicates that the aluminum oxide can inhibit the release of hydrogen from the insulator 822 more than the tantalum nitride can when their thicknesses are the same (in this example, 10 nm). Moreover, the comparison between FIG. 19B and FIG. 19C indicates that, in the case of using the aluminum oxide as the barrier layer 823, the larger the thickness of the aluminum oxide is, the more the release of hydrogen from the insulator 822 can be inhibited.

The above results indicate that the use of the barrier layer 823 can prevent the diffusion of hydrogen from the insulator. The results also indicate that the aluminum oxide has a higher barrier property against hydrogen than the tantalum nitride.

Note that the 10-nm-thick tantalum nitride was able to function as a barrier layer sufficiently as long as heat treatment at a temperature higher than or equal to 400° C. was not performed in the post-process, for example. Thus, it is found that tantalum nitride can be used as a conductive barrier layer when the thickness or the like is appropriately designed with respect to the conditions for the post-process.

The above results indicate that the barrier layer provided between the conductor and the insulator can prevent the diffusion of hydrogen contained in the insulator.

The structure described in this example can be combined as appropriate with any of the structures described in the other examples and embodiments.

Example 3

In this example, the shape of a region around a contact portion in the case of the semiconductor device described in Embodiment 1 was observed.

<Structure and Fabrication Method of Sample>

In this section, the structure and the fabrication method of Sample 3A used in this example will be described.

Figure 20A:
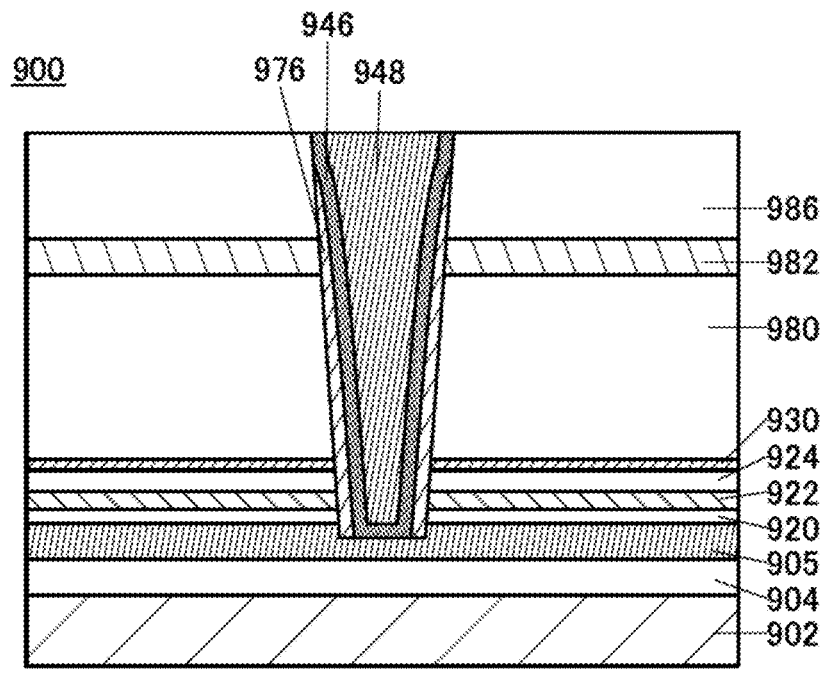
FIGS. 20A and 20B are a cross-sectional view of a structure in Example and a STEM image.

As Sample 3A, a structure 900 illustrated in FIG. 20A was fabricated. The structure 900 included a substrate 902; an insulator 904 over the substrate 902; a conductor 905 over the insulator 904; insulators 920, 922, and 924 having openings over the conductor 905; an oxide 930 having an opening over the insulator 924; an insulator 980 having an opening over the oxide 930; an insulator 982 having an opening over the insulator 980; an insulator 986 having an opening over the insulator 982; an insulator 976 in contact with side surfaces of the openings of the insulators 920, 922, and 924, the oxide 930, and the insulators 980, 982, and 986; a conductor 946 in contact with the conductor 905 and the insulator 976; and a conductor 948 in contact with the conductor 946.

The fabrication method of Sample 3A will be described below.

First, a silicon substrate was prepared as the substrate 902. Then, a 100-nm-thick silicon oxynitride film was formed as the insulator 904 over the substrate 902 by a plasma CVD method. In the formation, $SiH_4$ at a flow rate of 5 sccm and $N_2O$ at a flow rate of 1000 sccm were used as deposition gases, the pressure of a reaction chamber was 133.30 Pa, the substrate temperature was 325° C., and a high frequency (RF) power at 45 W (13.56 MHz) was applied.

Next, a 50-nm-thick tantalum nitride film was formed as the conductor 905 over the insulator 904 by a sputtering method. In the formation, Ar at a flow rate of 50 sccm and $N_2$ at a flow rate of 10 sccm were used as sputtering gases, a tungsten target was used, the pressure of a deposition chamber was 0.6 Pa, the substrate temperature was R.T., the distance between the target and the substrate was 60 mm, and a power (DC) at 1.0 kW was applied.

Subsequently, a 10-nm-thick silicon oxynitride film was formed as the insulator 920 over the conductor 905 by a plasma CVD method. In the formation, $SiH_4$ at a flow rate of 1 sccm and $N_2O$ at a flow rate of 800 sccm were used as deposition gases, the pressure of a reaction chamber was 40.00 Pa, the substrate temperature was 500° C., and a high frequency (RF) power at 150 W (60 MHz) was applied.

Then, 20-nm-thick hafnium oxide was formed as the insulator 922 over the insulator 920 by an ALD method. In the formation, the substrate temperature was 200° C., a source gas obtained by sublimation of a solid containing $Hf(NMe_2)_4$ was used, and an $O_3$ gas and an $O_2$ gas were used as oxidizing agents.

After that, a 30-nm-thick silicon oxynitride film was formed as the insulator 924 over the insulator 922 by a plasma CVD method. In the formation, $SiH_4$ at a flow rate of 5 sccm and $N_2O$ at a flow rate of 1000 sccm were used as deposition gases, the pressure of a reaction chamber was 133.30 Pa, the substrate temperature was 325° C., and a high frequency (RF) power at 45 W (13.56 MHz) was applied.

Subsequently, a 5-nm-thick oxide containing In, Ga, and Zn was formed as the oxide 930 over the insulator 924 by a sputtering method. In the formation, Ar at a flow rate of 30 sccm and $O_2$ at a flow rate of 15 sccm were used as sputtering gases, an oxide target containing In, Ga, and Zn (an atomic ratio of In to Ga and Zn was 1:3:2) was used, the pressure of a deposition chamber was 0.7 Pa, the substrate temperature was 200° C., the distance between the target and the substrate was 60 mm, and a power (DC) at 500 W was applied.

Then, a 200-nm-thick silicon oxynitride film was formed as the insulator 980 over the oxide 930 by a plasma CVD method. In the formation, $SiH_4$ at a flow rate of 5 sccm and $N_2O$ at a flow rate of 1000 sccm were used as deposition gases, the pressure of a reaction chamber was 133.30 Pa, the substrate temperature was 325° C., and a high frequency (RF) power at 45 W (13.56 MHz) was applied.

Next, a 40-nm-thick aluminum oxide film was formed as the insulator 982 over the insulator 980 by a sputtering method. In the formation, an $Al_2O_3$ target was used, Ar at a flow rate of 25 sccm and $O_2$ at a flow rate of 25 sccm were used as sputtering gases, the pressure was 0.4 Pa, the deposition power was 2500 W, the distance between the target and the substrate was 60 mm, and the substrate temperature was 250° C.

After that, a 100-nm-thick silicon oxynitride film was formed as the insulator 986 over the insulator 982 by a plasma CVD method. In the formation, $SiH_4$ at a flow rate of 5 sccm and $N_2O$ at a flow rate of 1000 sccm were used as deposition gases, the pressure of a reaction chamber was 133.30 Pa, the substrate temperature was 325° C., and a high frequency (RF) power at 45 W (13.56 MHz) was applied.

Next, a 30-nm-thick tungsten film was formed as a conductor functioning as a hard mask over the insulator 986 by a sputtering method. In the formation, Ar at a flow rate of 80 sccm was used as a sputtering gas, a tungsten target was used, the pressure of a deposition chamber was 0.8 Pa, the substrate temperature was 130° C., the distance between the target and the substrate was 60 mm, and a power (DC) at 1.0 kW was applied.

Then, a 100-nm-thick silicon nitride film was formed as an insulator functioning as a hard mask over the conductor functioning as a hard mask by a sputtering method. In the formation, Ar at a flow rate of 10 sccm and $N_2$ at a flow rate of 10 sccm were used as sputtering gases, a non-doped silicon target was used, the pressure of the deposition chamber was 0.6 Pa, the substrate temperature was 100° C., the distance between the target and the substrate was 60 mm, and a power (DC) at 1.0 kW was applied.

Subsequently, a resist adherence agent was applied to the silicon nitride film, a resist mask was formed, and first etching, second etching, and third etching were performed by a CCP etching method to process the silicon nitride film functioning as a hard mask and the conductor functioning as a hard mask into desired shapes.

The first etching was performed for 13 seconds under the following conditions: the pressure was 3.0 Pa, the distance between an upper electrode and a lower electrode was 80 mm, the power of the upper electrode was 500 W, the bias power was 100 W, a $CF_4$ atmosphere at a flow rate of 80 sccm was used, and the substrate temperature was 20° C. The resist adherence agent was removed by this etching.

The second etching was performed for 26 seconds under the following conditions: the pressure was 5.3 Pa, the distance between the upper electrode and the lower electrode was 80 mm, the power of the upper electrode was 550 W, the bias power was 350 W, a mixed atmosphere of $CHF_3$ at a flow rate of 67 sccm and $O_2$ at a flow rate of 13 sccm was used, and the substrate temperature was 20° C. The insulator functioning as a hard mask was processed into a desired shape by this etching.

The third etching was performed for 10 seconds under the following conditions: the pressure was 0.6 Pa, the distance between the upper electrode and the lower electrode was 100 mm, the power of the upper electrode was 1000 W, the bias power was 100 W, a mixed atmosphere of $Cl_2$ at a flow rate of 11 sccm and $O_2$ at a flow rate of 22 sccm was used, and the substrate temperature was 20° C. The conductor functioning as a hard mask was processed into a desired shape by this etching.

Next, fourth etching to ninth etching were performed using the hard masks by a CCP etching method to form the openings in the insulators 986, 982, and 980, the oxide 930, and the insulators 924, 922, and 920.

The fourth etching was performed for 14 seconds under the following conditions: the pressure was 3.3 Pa, the distance between the upper electrode and the lower electrode was 25 mm, the power of the upper electrode was 1800 W, the bias power was 2000 W, a mixed atmosphere of $C_4F_6$ at a flow rate of 22 sccm, $O_2$ at a flow rate of 30 sccm, and Ar at a flow rate of 800 sccm was used, and the substrate temperature was 20° C.

The fifth etching was performed for 10 seconds under the following conditions: the pressure was 2.0 Pa, the distance between the upper electrode and the lower electrode was 40 mm, the power of the upper electrode was 500 W, the bias power was 100 W, an 02 atmosphere at a flow rate of 200 sccm was used, and the substrate temperature was 20° C.

The sixth etching was performed for 27 seconds under the following conditions: the pressure was 2.6 Pa, the distance between the upper electrode and the lower electrode was 25 mm, the power of the upper electrode was 1000 W, the bias power was 1200 W, a mixed atmosphere of $C_4F_8$ at a flow rate of 6 sccm, $CF_4$ at a flow rate of 10 sccm, $N_2$ at a flow rate of 50 sccm, and Ar at a flow rate of 500 sccm was used, and the substrate temperature was 20° C.

The seventh etching was performed for 28 seconds under the following conditions: the pressure was 2.6 Pa, the distance between the upper electrode and the lower electrode was 25 mm, the power of the upper electrode was 1000 W, the bias power was 1200 W, a mixed atmosphere of $H_2$ at a flow rate of 16 sccm, $C_4F_8$ at a flow rate of 8 sccm, and Ar at a flow rate of 475 sccm was used, and the substrate temperature was 20° C.

The eighth etching was performed for 28 seconds under the following conditions: the pressure was 2.6 Pa, the distance between the upper electrode and the lower electrode was 25 mm, the power of the upper electrode was 1000 W, the bias power was 1200 W, a mixed atmosphere of $H_2$ at a flow rate of 16 sccm, $C_4F_8$ at a flow rate of 8 sccm, and Ar at a flow rate of 475 sccm was used, and the substrate temperature was 20° C.

The ninth etching was performed for 10 seconds under the following conditions: the pressure was 2.6 Pa, the distance between the upper electrode and the lower electrode was 40 mm, the power of the upper electrode was 500 W, the bias power was 100 W, an 02 atmosphere at a flow rate of 200 sccm was used, and the substrate temperature was 20° C.

Next, 13-nm-thick aluminum oxide was formed as a film to be the insulator 976 in the openings by an ALD method. In the formation, the substrate temperature was 250° C., a source gas obtained by sublimation of a solid containing $Al(CH_3)_3$ was used, and an $O_3$ gas and an $O_2$ gas were used as oxidizing agents.

Then, tenth etching to twelfth etching were performed on the film to be the insulator 976 by a dry etching method to form the insulator 976.

The tenth etching was performed for 11 seconds under the following conditions: the pressure was 2.6 Pa, the distance between the upper electrode and the lower electrode was 25 mm, the power of the upper electrode was 1000 W, the bias power was 1200 W, a mixed atmosphere of $C_4F_8$ at a flow rate of 6 sccm, $CF_4$ at a flow rate of 10 sccm, $N_2$ at a flow rate of 50 sccm, and Ar at a flow rate of 500 sccm was used, and the substrate temperature was 20° C.

The eleventh etching was performed for 10 seconds under the following conditions: the pressure was 2.6 Pa, the distance between the upper electrode and the lower electrode was 40 mm, the power of the upper electrode was 500 W, the bias power was 100 W, an 02 atmosphere at a flow rate of 200 sccm was used, and the substrate temperature was 20° C.

The twelfth etching was performed for 10 seconds under the following conditions: the pressure was 4.0 Pa, the distance between the upper electrode and the lower electrode was 40 mm, the power of the upper electrode was 1000 W, the bias power was 250 W, an Ar atmosphere at a flow rate of 300 sccm was used, and the substrate temperature was 20° C.

Next, a 10-nm-thick titanium nitride film was formed as a film to be the conductor 946 by an ALD method. In the formation, a mixed gas of $TiCl_4$ at a flow rate of 50 sccm and $NH_3$ at a flow rate of 2700 sccm was used as a deposition gas, the pressure of a deposition chamber was 667 Pa, and the substrate temperature was 380° C.

After that, a 150-nm-thick tungsten film was formed as a film to be the conductor 948 through first to third deposition steps by a CVD method. In the first deposition step, a mixed gas of $WF_6$ at a flow rate of 160 sccm, $SiH_4$ at a flow rate of 400 sccm, Ar at a flow rate of 6000 sccm, and $N_2$ at a flow rate of 2000 sccm was used as a deposition gas, the pressure of a deposition chamber was 1000 Pa, and the substrate temperature was 385° C. In the second deposition step, a mixed gas of $WF_6$ at a flow rate of 250 sccm, $H_2$ at a flow rate of 4000 sccm, Ar at a flow rate of 2000 sccm, and $N_2$ at a flow rate of 2000 sccm was used as a deposition gas, the pressure of the deposition chamber was 10666 Pa, and the substrate temperature was 385° C. In the third deposition step, a mixed gas of $WF_6$ at a flow rate of 250 sccm, $H_2$ at a flow rate of 2200 sccm, Ar at a flow rate of 2000 sccm, and $N_2$ at a flow rate of 200 sccm was used as a deposition gas, the pressure of the deposition chamber was 10666 Pa, and the substrate temperature was 385° C.

Next, planarization treatment was performed on the top surface of the film to be the conductor 948 by a CMP method, so that the conductors 948 and 946 were formed.

Through the above steps, Sample 3A was completed.

<Cross-Sectional Observation of Sample>

Figure 20B:
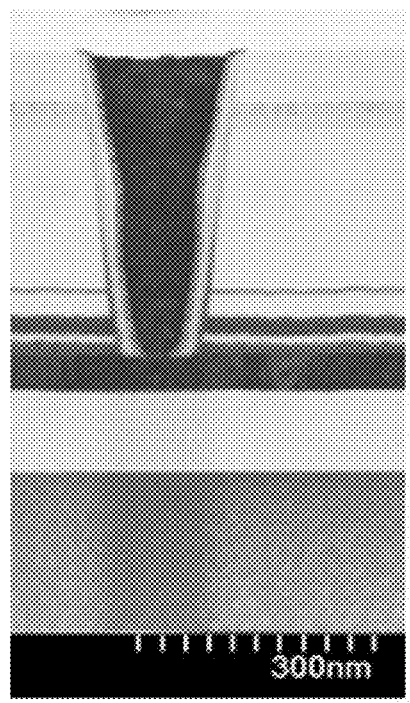

A cross section of Sample 3A was observed. FIG. 20B is a bright-field image of Sample 3A obtained with a scanning transmission electron microscope (STEM).

It was observed that the insulator 976 was able to be formed on the side surfaces of the openings of the insulators 920, 922, and 924, the oxide 930, and the insulators 980, 982, and 986 in Sample 3A. It was also observed that the conductors 946 and 948 were able to be formed in the openings. In addition, it was confirmed that a conduction state was able to be obtained when the conductor 946 and the conductor 905 were in contact with each other.

The STEM image in FIG. 20B shows that Sample 3A fabricated in this example has a favorable cross-sectional shape. In other words, the layer functioning as a barrier was able to be formed even on the side surfaces of the minute openings in Sample 3A. Furthermore, a portion of the layer functioning as a barrier on a surface of the conductor 905 exposed in the openings was able to be removed.

The structure described in this example can be combined as appropriate with any of the structures described in the other examples and embodiments.

Example 4

In this example, a semiconductor device including the transistor 200 illustrated in FIGS. 1A to 1C, which is one embodiment of the present invention, was fabricated as each of Samples 4A and 4B, and tests for the electrical characteristics and reliability of the transistor 200 were carried out.

In Sample 4A, 81 transistors 200 were fabricated in one plane. The density of the transistors 200 in Sample 4A was $0.89/\mu^2$.

In Sample 4B, 17424 transistors 200 were fabricated in one plane. The density of the transistors 200 in Sample 4B was $2.9/\mu m^2$.

Note that the channel length and channel width of the transistor 200 were each 60 nm.

<Fabrication Methods of Samples>

Fabrication methods of Samples 4A and 4B will be described below.

First, a 400-nm-thick silicon oxide film was formed as the insulator 212 over a p-type silicon single crystal wafer by a thermal oxidation method. Subsequently, a 40-nm-thick aluminum oxide film was formed as the insulator 214 over the insulator 212 by a sputtering method. Then, a 150-nm-thick silicon oxynitride film was formed as the insulator 216 over the insulator 214 by a CVD method.

Next, a 35-nm-thick tungsten film was formed over the insulator 216 by a sputtering method. Then, the tungsten film was processed by a lithography method, and a hard mask including the tungsten film was formed.

Next, the insulators 214 and 216 were processed by a damascene method to form an opening and a groove in which a wiring was provided. A tantalum nitride film was formed in the opening and the groove by a sputtering method. A titanium nitride film was formed over the tantalum nitride film by an ALD method. A tungsten film was formed over the titanium nitride film by a CVD method. Then, the tungsten film, the titanium nitride film, and the tantalum nitride film were polished by CMP processing until the top surface of the silicon oxynitride film was exposed, so that the tungsten, the titanium nitride, and the tantalum nitride were provided in the opening and the groove as a conductor corresponding to the conductor 205.

Next, a silicon oxynitride film, a hafnium oxide film, and a silicon oxynitride film were formed in this order as the insulator 220, the insulator 222, and the insulator 224. The silicon oxynitride film was formed by a CVD method to have a thickness of 10 nm. The hafnium oxide film was formed by an ALD method to have a thickness of 20 nm. The silicon oxynitride film was formed by a CVD method to have a thickness of 30 nm.

Then, heat treatment was performed. The heat treatment was performed at 400° C. in an atmosphere containing nitrogen for one hour.

Next, as a first oxide to be the oxide 230a, a 5-nm-thick In—Ga—Zn oxide was formed by a sputtering method. The first oxide was formed under the following conditions: a target having an atomic ratio of In to Ga and Zn of 1:3:4 was used, the oxygen gas flow rate was 45 sccm, the pressure was 0.7 Pa, and the substrate temperature was 200° C.

Subsequently, as a second oxide to be the oxide 230b, a 20-nm-thick In—Ga—Zn oxide was formed over the first oxide by a sputtering method. The second oxide was formed under the following conditions: a target having an atomic ratio of In to Ga and Zn of 4:2:4.1 was used, the argon gas flow rate was 30 sccm, the oxygen gas flow rate was 15 sccm, the pressure was 0.7 Pa, and the substrate temperature was 200° C. Note that the first oxide and the second oxide were successively formed.

Then, heat treatment was performed. As the heat treatment, treatment was performed at 400° C. in an atmosphere containing nitrogen for one hour, and subsequently another treatment was performed at 400° C. in an atmosphere containing oxygen for one hour.

Next, a 20-nm-thick tantalum nitride film was formed over the second oxide by a sputtering method. Then, a 5-nm-thick aluminum oxide film was formed over the tantalum nitride film by an ALD method. After that, a 15-nm-thick tungsten film was formed over the aluminum oxide film by a sputtering method.

Then, the tungsten film and the aluminum oxide film in a region where a channel was formed were etched by a lithography method. A dry etching method was used for the etching.

Next, by a lithography method, unnecessary parts of the tungsten film, the aluminum oxide film, the tantalum nitride film, the second oxide, and the first oxide were etched in this order. A dry etching method was used for the etching. By this processing, the oxides 230a and 230b and the barrier layers 244 were formed.

Next, the tantalum nitride film in a region where the channel was formed was etched using the tungsten film and the aluminum oxide film from which the region where the channel was formed was removed as masks. A dry etching method was used for the etching. By this processing, the conductors 240 were formed. Note that by the etching, the tungsten film used as a mask was removed.

Then, as a third oxide to be the oxide 230c, a 5-nm-thick In—Ga—Zn oxide was formed by a sputtering method. The third oxide was formed under the following conditions: a target having an atomic ratio of In to Ga and Zn of 1:1:1 was used, the oxygen gas flow rate was 45 sccm, the pressure was 0.7 Pa, and the substrate temperature was R.T.

Next, a silicon oxynitride film to be the insulator 250 was formed by a CVD method to have a thickness of 10 nm.

Then, heat treatment was performed. The heat treatment was performed at 400° C. in an atmosphere containing nitrogen for one hour.

Next, a titanium nitride film to be the conductor 260a was formed over the silicon oxynitride film to be the insulator 250 to have a thickness of 5 nm by a sputtering method. Over the titanium nitride film, a tungsten film to be the conductor 260b was formed to have a thickness of 50 nm by a sputtering method. Note that the titanium nitride film and the tungsten film were successively formed.

Next, the tungsten film and the titanium nitride film were etched in this order by a lithography method. A dry etching method was used for the etching of the tungsten film and the titanium nitride film. By the processing, the conductor 260 was formed.

Then, an aluminum oxide film to be the barrier layer 270 was formed to have a thickness of 7 nm by an ALD method. Subsequently, part of the aluminum oxide film and part of the silicon oxynitride film to be the insulator 250 were etched in this order by a lithography method. The aluminum oxide film and the silicon oxynitride film were etched by a dry etching method. In this manner, the barrier layer 270 and the insulator 250 were formed.

Next, part of the third oxide was etched by a lithography method using the barrier layer 270 and the insulator 250 as masks. A wet etching method was used for the etching. Through the processing, the oxide 230c was formed.

After that, a silicon oxynitride film to be the insulator 280 was formed to have a thickness of 310 nm by a CVD method. Then, CMP processing was performed to polish the silicon oxynitride film so that the surface of the silicon oxynitride film was planarized; accordingly, the insulator 280 was formed.

Then, a 40-nm-thick aluminum oxide film was formed as the insulator 282 over the insulator 280 by a sputtering method under the following conditions: the argon gas flow rate was 25 sccm, the oxygen gas flow rate was 25 sccm, the pressure was 0.4 Pa, and the substrate temperature was 250° C.

After that, heat treatment was performed. The heat treatment was performed at 400° C. in an atmosphere containing oxygen for one hour.

Next, a 100-nm-thick silicon oxynitride film was formed as the insulator 286 by a CVD method.

Then, a tungsten film to be a hard mask and a silicon nitride film to be a hard mask were formed by a sputtering method, and the hard masks were formed by a lithography method.

Subsequently, by using the hard masks, contact holes reaching the conductors 260 and 240 were formed.

Next, an aluminum oxide film to be the barrier layers 276 was formed by an ALD method to have a thickness of 13 nm. After that, etch-back processing was performed on the aluminum oxide film by a dry etching method to form the barrier layers 276.

Then, a 10-nm-thick titanium nitride film was formed by an ALD method, and a 150-nm-thick tungsten film was formed by a CVD method.

Next, the tungsten film and the titanium nitride film were polished by CMP processing until the insulator 286 was exposed, whereby the conductors 246 and 248 filling the contact holes were formed.

After that, a 50-nm-thick tungsten film was formed by a sputtering method. Subsequently, the tungsten film was processed by a lithography method to form a wiring layer.

Through the above steps, Samples 4A and 4B were completed.

<Electrical Characteristics of Transistors>

Next, the $I_d$-$V_g$ characteristics were measured as the electrical characteristics of Samples 4A and 4B. Note that semiconductor devices were fabricated as Conventional Examples 4A and 4B by conventional fabrication methods for comparison, and the $I_d$-$V_g$ characteristics of transistors included in Conventional Examples 4A and 4B were measured.

In the measurement of the $I_d$-$V_g$ characteristics, a change in a current between the conductor 240a functioning as a source electrode and the conductor 240b functioning as a drain electrode (hereinafter, referred to as a drain current $I_d$) when a potential applied to the conductor 260 functioning as a first gate electrode of the transistor 200 was changed from a first value to a second value was measured.

Here, a change in the drain current ($I_d$) between the conductor 240a and the conductor 240b when a potential difference between the conductor 240a and the conductor 240b (hereinafter, referred to as a drain voltage $V_d$) was set to 0.1 V or 3.3 V and a potential difference between the conductor 240a and the conductor 260 (hereinafter, referred to as a gate voltage ($V_g$)) was changed from −3.3 V to +3.3 V was measured.

Figure 21:
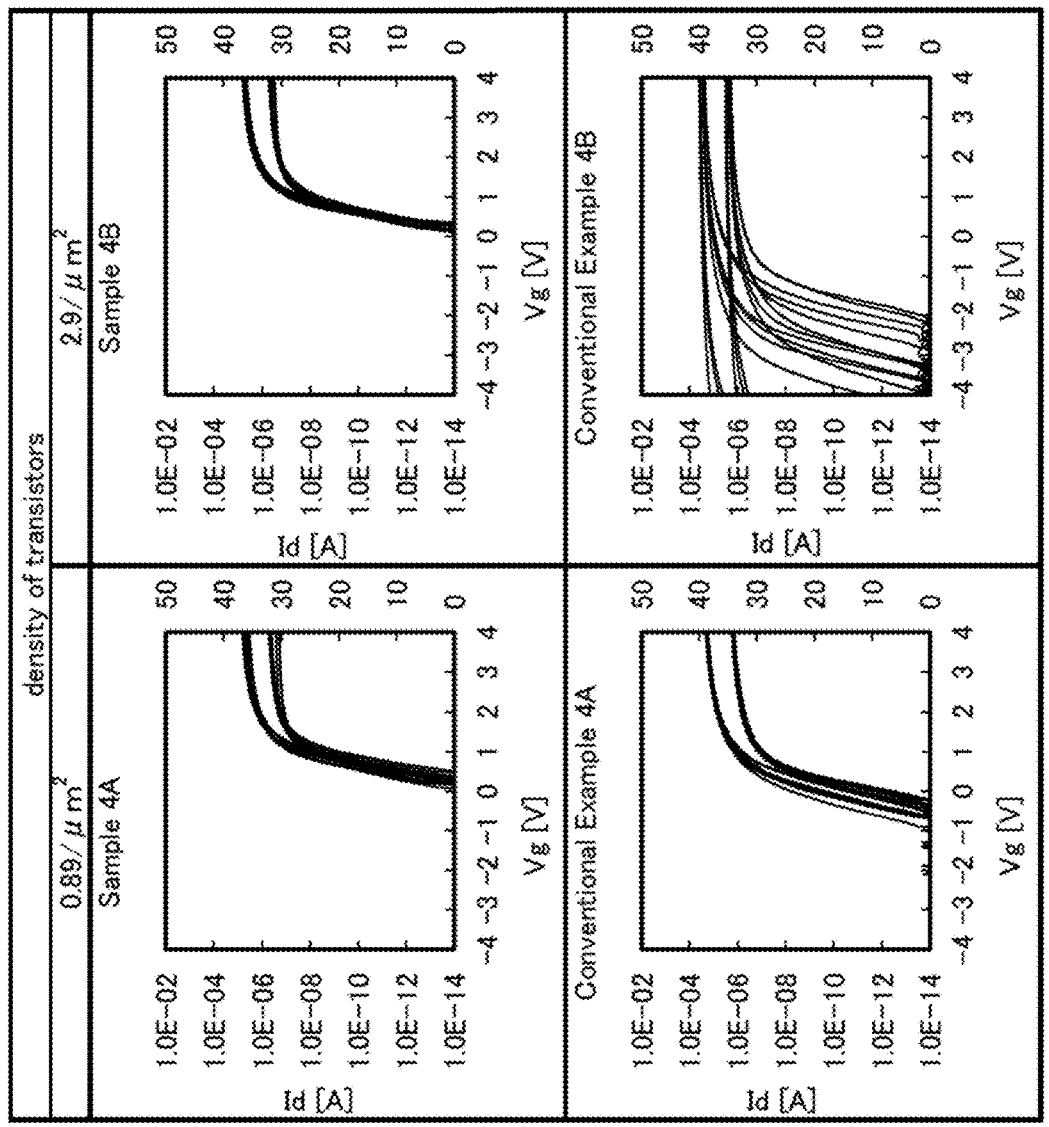
FIG. 21 shows $I_d$-$V_g$ characteristics in Example.

Note that in this measurement, the potential of the conductor 205 functioning as a second gate electrode (back gate electrode) was set to 0 V. FIG. 21 shows the results.

FIG. 21 shows the measurement results of the samples including transistors fabricated by the conventional method as the results of comparative examples. The transistors in the comparative examples had no barrier layer 276.

In Conventional Example 4A, 81 transistors were fabricated in one plane, and the density of the transistors 200 was 0.89/μm². In Conventional Example 4B, 17424 transistors 200 were fabricated in one plane, and the density of the transistors 200 was 2.9/μm².

The comparison between Sample 4A and Conventional Example 4A revealed that Sample 4A had small variation on the substrate. The threshold voltages of the transistors in Conventional Example 4A were negative when the voltage applied to the first gates was 0 V. Meanwhile, the transistors in Sample 4A were in off states when the voltage applied to the first gates was 0 V. Accordingly, it was confirmed that the transistors in Sample 4A had extremely excellent off-state characteristics.

The comparison between Sample 4B and Conventional Example 4B revealed that Sample 4B had extremely small variation on the substrate. In addition, the transistors in Sample 4B were in off states when the voltage applied to the first gates was 0 V. Accordingly, it was confirmed that the transistors in Sample 4B had extremely excellent off-state characteristics.

As for the conventional examples having no barrier layer 276, as the density of the transistors on the substrate increased, the electrical characteristics of the transistors became worse and variation between the transistors became larger. In contrast, although the density of the transistors on the substrate was high in Sample 4B, which is one embodiment of the present invention, the electrical characteristics did not deteriorate and variation was small.

The above results show that the semiconductor device of one embodiment of the present invention is a semiconductor device that includes a transistor having excellent off-state characteristics. The results also show that even when transistors are integrated, the transistors have favorable electrical characteristics and small variation.

At least part of this example can be implemented in combination with any of the other examples and embodiments described in this specification as appropriate.

Example 5

In this example, TDS measurement results of structures in which barrier layers are formed over substrates will be described. Note that in this example, Sample 5A, Sample 5B, Sample 5C, Sample 5D, Sample 5E, Sample 5F, and a comparative example were fabricated.

<Structures and Fabrication Methods of Samples>

Samples 5A to 5F each of which is one embodiment of the present invention and the comparative example are described below. Samples 5A to 5F each have a structure 806 illustrated in FIG. 22A. The structure 806 includes a substrate 830, an insulator 831 over the substrate 830, an insulator 832 over the insulator 831, an insulator 833 over the insulator 832, and a film 834 over the insulator 833.

Note that the films 834 in Samples 5A to 5F were formed to have different thicknesses using different materials. Samples 5B, 5D, and 5F were subjected to heat treatment assumed as the post-process. A structure having no film 834 was formed as Comparative Example 5. Table 3 shows the materials and the thicknesses of the films 834 in Samples 5A to 5F and Comparative Example 5 and whether the heat treatment was performed.

TABLE 3

| | Film 834 | | |
|---|---|---|---|
| | Material | Thickness [nm] | Heat treatment |
| Sample 5A | TN | 20 | Not performed |
| Sample 5B | TN | 20 | Performed |
| Sample 5C | TaN | 40 | Not performed |
| Sample 5D | TaN | 40 | Performed |
| Sample 5E | AlOx | 13 | Not performed |
| Sample 5F | AlOx | 13 | Performed |
| Comparative Example 5 | — | — | Not performed |

Next, the fabrication methods of the samples will be described.

A silicon substrate was used as the substrate 830. A 100-nm-thick thermal oxide film was formed as the insulator 831 over the substrate 830.

Then, heat treatment was performed. As the heat treatment, treatment was performed at 400° C. in an atmosphere containing nitrogen for one hour, and subsequently another treatment was performed at 400° C. in an oxygen atmosphere for one hour.

Subsequently, 10-nm-thick aluminum oxide was formed as the insulator 832 over the insulator 831 by an ALD method. The aluminum oxide was provided so as to prevent oxygen in an oxygen-excess region to be formed in the insulator 833 from being absorbed on the substrate side. In the formation, the substrate temperature was 250° C., a source gas obtained by sublimation of a solid containing $Al(CH_3)_3$ was used, and an $O_3$ gas and an $O_2$ gas were used as oxidizing agents.

Next, a 160-nm-thick silicon oxynitride film was formed as the insulator 833 by a plasma CVD method. In the formation, $SiH_4$ at a flow rate of 8 sccm and $N_2O$ at a flow rate of 4000 sccm were used as deposition gases, the pressure of a reaction chamber was 800 Pa, the substrate temperature was 325° C., and a high frequency (RF) power at 150 W (60 MHz) was applied.

After that, to form the oxygen-excess region in the insulator 833, a 40-nm-thick aluminum oxide film was formed over the insulator 833 by a sputtering method under the following conditions: an argon gas at a flow rate of 25 sccm and an oxygen gas at a flow rate of 25 sccm were used, the pressure was 0.4 Pa, and the substrate temperature was 250° C. Then, heat treatment was performed at 350° C. in an atmosphere containing oxygen for one hour. The aluminum oxide film was removed using a mixed acid aluminum etchant at 85° C.

Through the above steps, the comparative example in this example was completed. Then, for Samples 5A to 5F, the film 834 was formed over the insulator 833.

For each of Samples 5A and 5B, 20-nm-thick titanium nitride was formed as the film 834 by an ALD method. In the formation, the substrate temperature was 375° C., and a source gas containing $TiCl_4$ and $NH_3$ was used.

For each of Samples 5C and 5D, 40-nm-thick tantalum nitride was formed as the film 834 by a sputtering method with a collimator. In the formation, a tantalum (Ta) target was used, Ar at a flow rate of 25 sccm and $N_2$ at a flow rate of 25 sccm were used as sputtering gases, the substrate temperature was 300° C., the deposition pressure was 0.7 Pa, the deposition power was 4000 W, and the distance between the target and the substrate was 160 mm. The collimator with a thickness of 16 mm was placed such that the distance between the target and the collimator was 52 mm and the distance between the collimator and the substrate was 92 mm to provide the 160-mm distance between the target and the substrate.

For each of Samples 5E and 5F, 13-nm-thick aluminum oxide was formed as the film 834 by an ALD method. In the formation, the substrate temperature was 250° C., a source gas obtained by sublimation of a solid containing $Al(CH_3)_3$ was used, and an $O_3$ gas and an $O_2$ gas were used as oxidizing agents.

Through the above steps, Samples 5A, 5C, and 5E in this example were completed. Then, for Samples 5B, 5D, and 5F, heat treatment was performed at 400° C. in an atmosphere containing nitrogen for one hour.

Through the above steps, Samples 5B, 5D, and 5F in this example were completed.

<TDS Measurement Results of Samples>

Figures 22A, 22B:
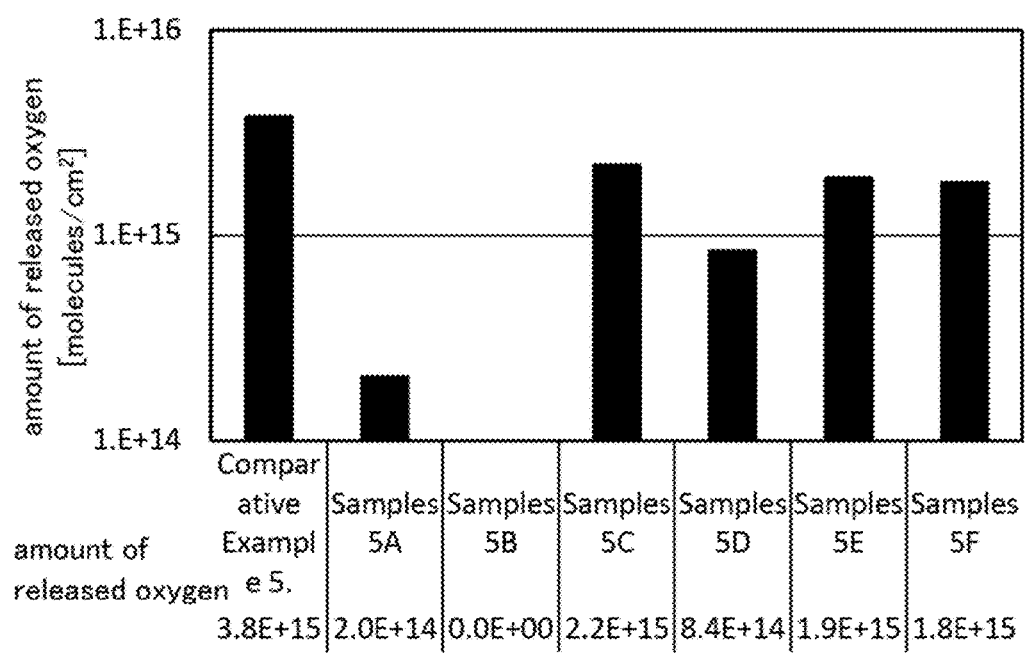
FIGS. 22A and 22B show a structure in Example and TDS results.

The amount of released oxygen in each sample was measured. In the TDS analysis, the amount of a released gas with a mass-to-charge ratio m/z of 32, which corresponds to an oxygen molecule, was measured. The TDS analysis was conducted with WA1000S manufactured by ESCO Ltd. at a heating rate of 30° C./min. FIG. 22B shows the measurement results.

FIG. 22B shows the amounts of released oxygen in Samples 5A to 5F and Comparative Example 5. In FIG. 22B, the longitudinal axis represents the amount of released oxygen [molecules/cm$^2$].

The results in FIG. 22B indicate that excess oxygen contained in the insulator 833 is absorbed by a structure proximate to the insulator 833 in some cases and is released by heat treatment performed in the post-process or heating during the deposition in other cases.

In particular, the comparison between Samples 5A and 5B and Comparative Example 5 indicates that when titanium nitride is in contact with the insulator having the oxygen-excess region, most excess oxygen is absorbed by the titanium nitride. The comparison between Samples 5C and 5D and Comparative Example 5 indicates that when tantalum nitride is in contact with the insulator having the oxygen-excess region, the tantalum nitride is less likely to absorb excess oxygen. However, the tantalum nitride absorbs excess oxygen when heat treatment is performed in the post-process.

In contrast, the amount of absorbed excess oxygen is small when aluminum oxide is in contact with the insulator having the oxygen-excess region. The aluminum oxide hardly absorbs excess oxygen even when heat treatment is performed in the post-process.

The above results show that aluminum oxide absorbs a small amount of excess oxygen contained in the insulator having the oxygen-excess region. The results also show that titanium nitride absorbs a relatively large amount of excess oxygen, and tantalum nitride absorbs a relatively large amount of excess oxygen depending on the condition.

The structure described in this example can be combined as appropriate with any of the structures described in the other examples and embodiments.

Example 6

In this example, assuming that the semiconductor device described in Embodiment 1 was used, the shape of a region around a contact portion was observed and the contact resistance was measured. Ten types of square openings having different side lengths were formed as contact holes. Nine openings were prepared for each type. The side lengths were 350 nm, 300 nm, 250 nm, 200 nm, 150 nm, 125 nm, 100 nm, 90 nm, 80 nm, and 70 nm.

<Structures and Fabrication Methods of Samples>

In this section, the structures and the fabrication methods of Samples 6A to 6C used in this example will be described.

Figure 23A:
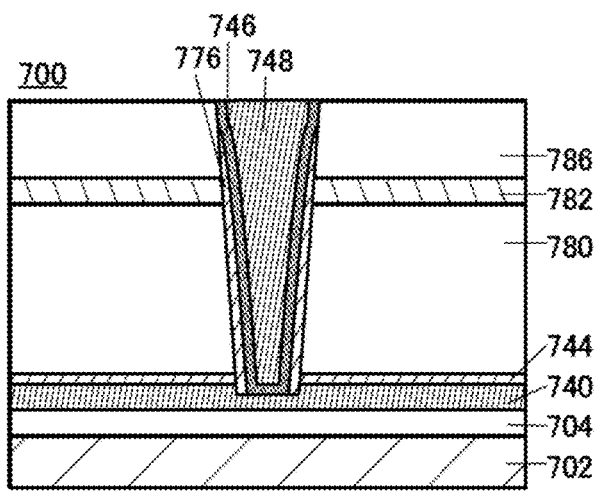
FIGS. 23A to 23D are a cross-sectional view of a structure in Example and STEM images.

As each of Samples 6A to 6C, a structure 700 illustrated in FIG. 23A was fabricated. The structure 700 included a substrate 702, an insulator 704 over the substrate 702, a conductor 740 over the insulator 704, an insulator 744 having an opening over the conductor 740, an insulator 780 having an opening over the insulator 744, an insulator 782 having an opening over the insulator 780, an insulator 786 having an opening over the insulator 782, an insulator 776 in contact with side surfaces of the openings of the insulators 744, 780, 782, and 786, a conductor 746 in contact with the conductor 740 and the insulator 776, and a conductor 748 in contact with the conductor 746.

The fabrication methods of Samples 6A to 6C will be described below.

First, a silicon substrate was prepared as the substrate 702. Then, a 100-nm-thick silicon oxynitride film was formed as the insulator 704 over the substrate 702 by a plasma CVD method. In the formation, SiH$_4$ at a flow rate of 5 sccm and N$_2$O at a flow rate of 1000 sccm were used as deposition gases, the pressure of a reaction chamber was 133.30 Pa, the substrate temperature was 325° C., and a high frequency (RF) power at 45 W (13.56 MHz) was applied.

Next, a 20-nm-thick tantalum nitride film was formed as the conductor 740 over the insulator 704 by a sputtering method. In the formation, Ar at a flow rate of 50 sccm and N$_2$ at a flow rate of 10 sccm were used as sputtering gases, a tungsten target was used, the pressure of a deposition chamber was 0.6 Pa, the substrate temperature was R.T., the distance between the target and the substrate was 60 mm, and a power (DC) at 1.0 kW was applied.

Then, 5-nm-thick aluminum oxide was formed as the insulator 744 over the conductor 740 by an ALD method. In the formation, the substrate temperature was 250° C., a source gas obtained by sublimation of a solid containing Al(CH$_3$)$_3$ was used, and an O$_3$ gas and an O$_2$ gas were used as oxidizing agents.

After that, a 120-nm-thick silicon oxynitride film was formed as the insulator 780 over the insulator 744 by a plasma CVD method. In the formation, SiH$_4$ at a flow rate of 5 sccm and N$_2$O at a flow rate of 1000 sccm were used as deposition gases, the pressure of a reaction chamber was 133.30 Pa, the substrate temperature was 325° C., and a high frequency (RF) power at 45 W (13.56 MHz) was applied.

Next, a 40-nm-thick aluminum oxide film was formed as the insulator 782 over the insulator 780 by a sputtering method. In the formation, an aluminum oxide target was used, Ar at a flow rate of 25 sccm and O$_2$ at a flow rate of 25 sccm were used as sputtering gases, the pressure was 0.4 Pa, the deposition power was 2500 W, the distance between the target and the substrate was 60 mm, and the substrate temperature was 250° C.

Subsequently, a 300-nm-thick silicon oxynitride film was formed as the insulator 786 over the insulator 782 by a plasma CVD method. In the formation, SiH$_4$ at a flow rate of 5 sccm and N$_2$O at a flow rate of 1000 sccm were used as deposition gases, the pressure of a reaction chamber was 133.30 Pa, the substrate temperature was 325° C., and a high frequency (RF) power at 45 W (13.56 MHz) was applied.

Then, the insulator 786 was polished by CMP processing to make a surface of the insulator 786 flat and to make the thickness of the insulator 786 100 nm.

Next, a 90-nm-thick tungsten film was formed as a conductor functioning as a hard mask over the insulator 786 by a sputtering method. In the formation, Ar at a flow rate of 80 sccm was used as a sputtering gas, a tungsten target was used, the pressure of a deposition chamber was 0.8 Pa, the substrate temperature was 130° C., the distance between the target and the substrate was 60 mm, and a power (DC) at 1.0 kW was applied.

Then, a 130-nm-thick silicon nitride film was formed as an insulator functioning as a hard mask over the conductor functioning as a hard mask by a sputtering method. In the formation, Ar at a flow rate of 10 sccm and N$_2$ at a flow rate of 10 sccm were used as sputtering gases, a non-doped silicon target was used, the pressure of the deposition chamber was 0.6 Pa, the substrate temperature was 100° C., the distance between the target and the substrate was 60 mm, and a power (DC) at 1.0 kW was applied.

Subsequently, a resist adherence agent was applied to the insulator functioning as a hard mask, a resist mask was formed, and first etching, second etching, and third etching were performed by a CCP etching method to process the insulator functioning as a hard mask and the conductor functioning as a hard mask into desired shapes.

The first etching was performed for 13 seconds under the following conditions: the pressure was 3.0 Pa, the distance between an upper electrode and a lower electrode was 80 mm, the power of the upper electrode was 500 W, the bias power was 100 W, a $CF_4$ atmosphere at a flow rate of 80 sccm was used, and the substrate temperature was 20° C. The resist adherence agent was removed by this etching.

The second etching was performed for 36 seconds under the following conditions: the pressure was 5.3 Pa, the distance between the upper electrode and the lower electrode was 80 mm, the power of the upper electrode was 550 W, the bias power was 350 W, a mixed atmosphere of $CHF_3$ at a flow rate of 67 sccm and $O_2$ at a flow rate of 13 sccm was used, and the substrate temperature was 20° C. The insulator functioning as a hard mask was processed into a desired shape by this etching.

The third etching was performed for 40 seconds under the following conditions: the pressure was 0.6 Pa, the distance between the upper electrode and the lower electrode was 100 mm, the power of the upper electrode was 1000 W, the bias power was 200 W, a mixed atmosphere of $C_{12}$ at a flow rate of 11 sccm and $O_2$ at a flow rate of 22 sccm was used, and the substrate temperature was 20° C. The conductor functioning as a hard mask was processed into a desired shape by this etching.

Next, fourth etching to tenth etching were performed using the hard masks by a CCP etching method to form the openings in the insulators 786, 782, 780, and 744.

The fourth etching was performed for 14 seconds under the following conditions: the pressure was 3.3 Pa, the distance between the upper electrode and the lower electrode was 25 mm, the power of the upper electrode was 1800 W, the bias power was 2000 W, a mixed atmosphere of $C_4F_6$ at a flow rate of 22 sccm, $O_2$ at a flow rate of 30 sccm, and Ar at a flow rate of 800 sccm was used, and the substrate temperature was 20° C.

The fifth etching was performed for 15 seconds under the following conditions: the pressure was 2.6 Pa, the distance between the upper electrode and the lower electrode was 40 mm, the power of the upper electrode was 500 W, the bias power was 0 W, a mixed atmosphere of Ar at a flow rate of 400 sccm and $O_2$ at a flow rate of 100 sccm was used, and the substrate temperature was 20° C.

The sixth etching was performed for 10 seconds under the following conditions: the pressure was 2.0 Pa, the distance between the upper electrode and the lower electrode was 40 mm, the power of the upper electrode was 500 W, the bias power was 100 W, an $O_2$ atmosphere at a flow rate of 100 sccm was used, and the substrate temperature was 20° C.

The seventh etching was performed for 27 seconds under the following conditions: the pressure was 2.6 Pa, the distance between the upper electrode and the lower electrode was 25 mm, the power of the upper electrode was 1000 W, the bias power was 1200 W, a mixed atmosphere of $C_4F_8$ at a flow rate of 6 sccm, $CF_4$ at a flow rate of 10 sccm, $N_2$ at a flow rate of 50 sccm, and Ar at a flow rate of 500 sccm was used, and the substrate temperature was 20° C.

The eighth etching was performed for 58 seconds under the following conditions: the pressure was 2.6 Pa, the distance between the upper electrode and the lower electrode was 25 mm, the power of the upper electrode was 1000 W, the bias power was 1200 W, a mixed atmosphere of $H_2$ at a flow rate of 24 sccm, $C_4F_8$ at a flow rate of 12 sccm, and Ar at a flow rate of 475 sccm was used, and the substrate temperature was 20° C.

The ninth etching was performed for 60 seconds under the following conditions: the pressure was 2.6 Pa, the distance between the upper electrode and the lower electrode was 40 mm, the power of the upper electrode was 500 W, the bias power was 0 W, a mixed atmosphere of $O_2$ at a flow rate of 100 sccm and Ar at a flow rate of 400 sccm was used, and the substrate temperature was 20° C.

The tenth etching was performed for 10 seconds under the following conditions: the pressure was 2.6 Pa, the distance between the upper electrode and the lower electrode was 40 mm, the power of the upper electrode was 500 W, the bias power was 100 W, an $O_2$ atmosphere at a flow rate of 200 sccm was used, and the substrate temperature was 20° C.

Next, 13-nm-thick aluminum oxide was formed as a film to be the insulator 776 in the openings by an ALD method. In the formation, the substrate temperature was 250° C., a source gas obtained by sublimation of a solid containing $Al(CH_3)_3$ was used, and an $O_3$ gas and an $O_2$ gas were used as oxidizing agents.

Then, the film to be the insulator 776 was processed into the insulator 776 as follows.

First, eleventh etching was performed for Samples 6A to 6C. The eleventh etching was performed for 10 seconds under the following conditions: the pressure was 2.6 Pa, the distance between the upper electrode and the lower electrode was 25 mm, the power of the upper electrode was 1000 W, the bias power was 1200 W, a mixed atmosphere of $C_4F_8$ at a flow rate of 6 sccm, $CF_4$ at a flow rate of 10 sccm, $N_2$ at a flow rate of 50 sccm, and Ar at a flow rate of 500 sccm was used, and the substrate temperature was 20° C.

Then, twelfth etching was performed for Sample 6A. The twelfth etching was performed for 5 seconds under the following conditions: the pressure was 6.6 Pa, the distance between the upper electrode and the lower electrode was 35 mm, the power of the upper electrode was 200 W, the bias power was 150 W, a $CF_4$ atmosphere at a flow rate of 100 sccm was used, and the substrate temperature was 20° C.

For Samples 6B and 6C, cleaning was performed to remove an etching residue in the openings. For the cleaning, an alkaline solution such as a resist stripping solution can be used, for example. In this example, a resist stripping solution containing alkanolamine at less than 20% was used as the alkaline solution.

Next, plasma treatment was performed for Samples 6B and 6C under different conditions.

For Sample 6B, plasma treatment was performed for 10 seconds under the following conditions: the pressure was 4.0 Pa, the distance between the upper electrode and the lower electrode was 40 mm, the power of the upper electrode was 100 W, the bias power was 250 W, and an Ar atmosphere at a flow rate of 300 sccm was used.

For Sample 6C, plasma treatment was performed for 5 seconds under the following conditions: the pressure was 4.0 Pa, the distance between an upper electrode and a lower electrode was 40 mm, the power of the upper electrode was 100 W, the bias power was 250 W, and an Ar atmosphere at a flow rate of 300 sccm was used. After that, another plasma treatment was performed for 5 seconds under the following conditions: the pressure was 6.6 Pa, the distance between the upper electrode and the lower electrode was 35 mm, the power of the upper electrode was 200 W, the bias power was 150 W, and a $CF_4$ atmosphere at a flow rate of 100 sccm was used.

The following steps were common in Samples 6A to 6C.

Next, a 10-nm-thick titanium nitride film was formed as a film to be the conductor 746 by an ALD method. In the formation, a mixed gas of $TiCl_4$ at a flow rate of 50 sccm and NH$_3$ at a flow rate of 2700 sccm was used as a deposition gas, the pressure of a deposition chamber was 667 Pa, and the substrate temperature was 380° C.

After that, a 150-nm-thick tungsten film was formed as a film to be the conductor 748 through first to third deposition steps by a CVD method. In the first deposition step, a mixed gas of WF$_6$ at a flow rate of 160 sccm, SiH$_4$ at a flow rate of 400 sccm, Ar at a flow rate of 6000 sccm, and N$_2$ at a flow rate of 2000 sccm was used as a deposition gas, the pressure of a deposition chamber was 1000 Pa, and the substrate temperature was 385° C. In the second deposition step, a mixed gas of WF$_6$ at a flow rate of 250 sccm, H$_2$ at a flow rate of 4000 sccm, Ar at a flow rate of 2000 sccm, and N$_2$ at a flow rate of 2000 sccm was used as a deposition gas, the pressure of the deposition chamber was 10666 Pa, and the substrate temperature was 385° C. In the third deposition step, a mixed gas of WF$_6$ at a flow rate of 250 sccm, H$_2$ at a flow rate of 2200 sccm, Ar at a flow rate of 2000 sccm, and N$_2$ at a flow rate of 200 sccm was used as a deposition gas, the pressure of the deposition chamber was 10666 Pa, and the substrate temperature was 385° C.

Next, planarization treatment was performed on the top surface of the film to be the conductor 748 by a CMP method, so that the conductors 748 and 746 were formed.

Through the above steps, Samples 6A to 6C were completed.

<Cross-Sectional Observation of Samples>

For cross-sectional observation of Samples 6A to 6C, bright-field images were obtained with a scanning transmission electron microscope (STEM) (hereinafter, the images are also referred to as STEM images).

Figure 23B:
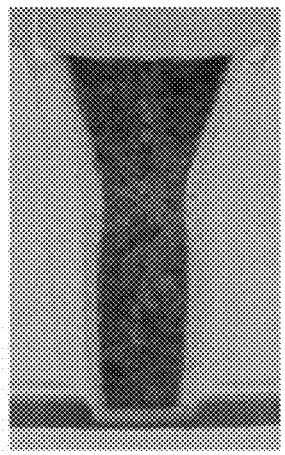
Figure 23C:
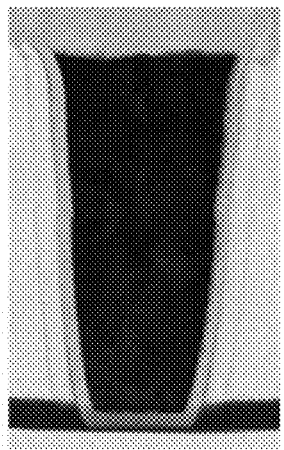
Figure 23D:
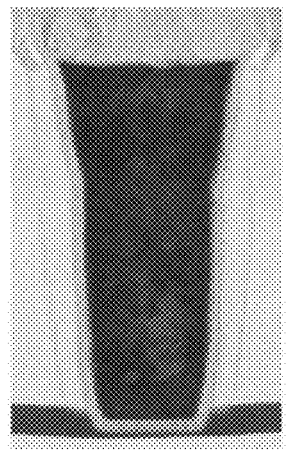

FIG. 23B, FIG. 23C, and FIG. 23D are the STEM image of Sample 6A, that of Sample 6B, and that of Sample 6C, respectively.

It was observed that the insulator 776 was able to be formed on the side surfaces of the openings of the insulators 744, 780, 782, and 786 in each of Samples 6A to 6C. It was also observed that the conductors 746 and 748 were able to be formed in the openings. In addition, it was confirmed that a conduction state was able to be obtained when the conductor 740 and the conductor 746 were in contact with each other.

The STEM image of Sample 6A shows that the insulator 782 has a bump of an insulator on its side surface. The STEM images of Samples 6B and 6C show that surfaces of openings formed in the insulators 744, 780, 782, and 786 are substantially aligned with one another.

The STEM images in FIGS. 23B to 23D show that Samples 6A to 6C fabricated in this example each have a favorable cross-sectional shape in which the conductors 746 and 748 are provided in the openings formed in the insulators 744, 780, 782, and 786. In particular, the side surfaces of the openings in Samples 6B and 6C are substantially aligned with one another. Thus, the conductors 746 and 748 can probably be formed in the openings even when a material with low embeddability was used for the conductors 746 and 748, or a formation method with low coverage was used, for example.

<Contact Resistance of Samples>

Figure 24A:
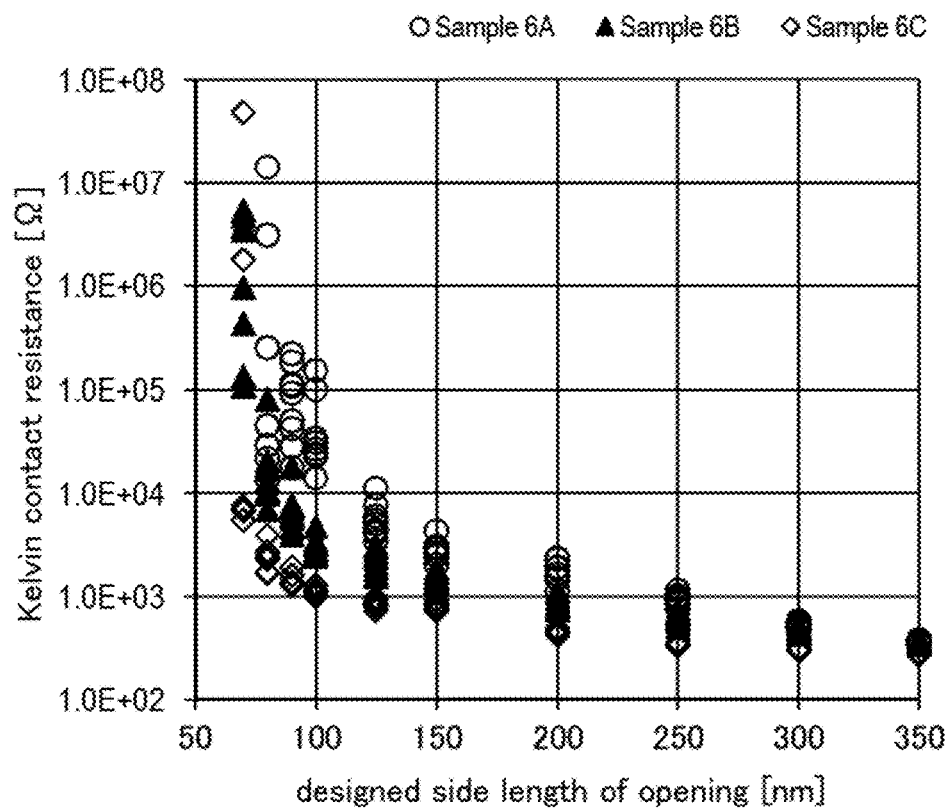
FIG. 24A shows contact resistance of samples in Example.

Next, the measurement of the Kelvin contact resistance between the conductor 740 and the conductors 746 and 748 was performed on the nine structures of each of the ten types for each of Samples 6A to 6C. FIG. 24A shows the results. In FIG. 24A, the longitudinal axis represents the Kelvin contact resistance and the lateral axis represents a designed side length of an opening [nm].

In Samples 6A to 6C, even when the insulator 776 with a thickness of 13 nm was formed on a sidewall of the contact hole, the Kelvin contact resistance was less than or equal to $1 \times 10^4 \Omega$ and the conduction between the conductor 740 and the conductors 746 and 748 was able to be made when the side length of the contact hole was longer than 100 nm. In particular, Samples 6B and 6C had small variation even when the side length of the contact hole was 100 nm or 90 nm. In addition, Sample 6C had a Kelvin contact resistance of less than or equal to $1.0 \times 10^4 \Omega$ even when the side length of the contact hole was 70 nm, and had favorable characteristics.

<Elementary Analysis of Samples>

An elementary analysis of a region around the contact portion was performed on Samples 6B and 6C. Described here are the results of the elementary analysis performed on Samples 6B and 6C, obtained by the evaluation of energy dispersive X-ray (EDX) mapping images obtained by EDX spectroscopy. In the EDX measurement, an energy dispersive X-ray spectrometer Octane T Ultra manufactured by EDAX Inc. was used as an elementary analysis apparatus.

Figure 24B:
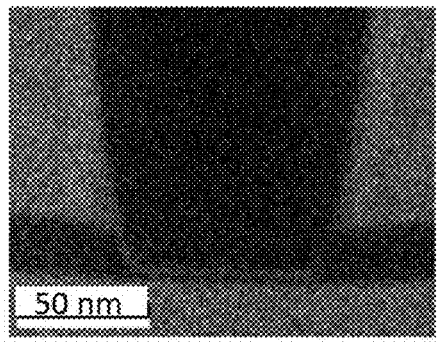
FIGS. 24B and 24C show EDX mapping images.
Figure 24C:
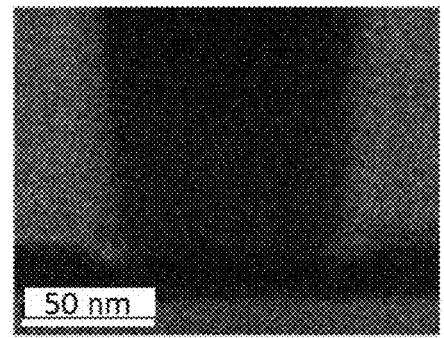

FIG. 24B shows the EDX mapping image of the region around the contact portion in Sample 6B. FIG. 24C shows the EDX mapping image of the region around the contact portion in Sample 6C. The magnification of the EDX mapping images in FIGS. 24B and 24C was 400000 times.

FIG. 24B shows that Sample 6B has a layer containing a large number of oxygen atoms between the conductor 740 and the conductor 746. That is, in Sample 6B, an extremely thin oxide film is probably formed over the conductor 740. In contrast, as shown in FIG. 24C, a region containing a large number of oxygen atoms is not observed between the conductor 740 and the conductor 746 in Sample 6C. Thus, it is confirmed that Sample 6C has low Kelvin contact resistance between the conductor 740 and the conductors 746 and 748 and an improved structure.

Accordingly, the layer functioning as a barrier was able to be formed even on the side surfaces of the minute openings in each of Samples 6A to 6C. Furthermore, a portion of the layer functioning as a barrier on a surface of the conductor 740 exposed in the openings was able to be removed.

The structure described in this example can be combined as appropriate with any of the structures described in the other examples and embodiments.

Example 7

In this example, a semiconductor device including a plurality of the transistors 200 each of which is one embodiment of the present invention illustrated in FIGS. 1A to 1C, was fabricated as each of Samples 7A to 7D, and tests for the electrical characteristics and reliability of the transistors 200 were carried out.

Table 4 shows the materials of the barrier layers 276 and the conductors 246 and 248 in Samples 7A to 7D and the conditions for processing the barrier layers 276.

TABLE 4

|  | 276 | 246 | 248 | Processing conditions for 276A |
|---|---|---|---|---|
| Sample 7A | — | TN | W |  |
| Sample 7B | — | TaN\TN | W |  |
| Sample 7C | AlOx | TN | W | Conditions 1 |
| Sample 7D | AlOx | TN | W | Conditions 2 |

Note that the channel length and channel width of the transistor 200 were each 60 nm.

Each of Samples 7A to 7D had first to third regions each of which included 17424 transistors 200. The first region, the second region, and the third region were designed to have densities of the 17424 transistors 200 of 1.49/μm$^2$, 1.97/μm$^2$, and 3.94/μm$^2$, respectively.

In addition, regions that were designed to have densities of the 17424 transistors 200 of 1.49/μm$^2$, 2.96/μm$^2$, 3.94/μm$^2$, and 4.96/μm$^2$ were formed in Sample 7D for stress tests.

<Fabrication Methods of Samples>

Fabrication methods of Samples 7A to 7D will be described below.

First, a 400-nm-thick silicon oxide film was formed as the insulator 212 over a p-type silicon single crystal wafer by a thermal oxidation method. Subsequently, a 40-nm-thick aluminum oxide film was formed as the insulator 214 over the insulator 212 by a sputtering method. Then, a 150-nm-thick silicon oxynitride film was formed as the insulator 216 over the insulator 214 by a CVD method.

Next, a 35-nm-thick tungsten film was formed over the insulator 216 by a sputtering method. Then, the tungsten film was processed by a lithography method, and a hard mask including the tungsten film was formed.

Next, the insulators 214 and 216 were processed by a damascene method to form an opening and a groove in which a wiring was provided. A tantalum nitride film was formed in the opening and the groove by a sputtering method. A titanium nitride film was formed over the tantalum nitride film by an ALD method. A tungsten film was formed over the titanium nitride film by a CVD method. Then, the tungsten film, the titanium nitride film, and the tantalum nitride film were polished by CMP processing until the top surface of the silicon oxynitride film was exposed, so that the tungsten, the titanium nitride, and the tantalum nitride were provided in the opening and the groove as a conductor corresponding to the conductor 205.

Next, a silicon oxynitride film, a hafnium oxide film, and a silicon oxynitride film were formed in this order as the insulator 220, the insulator 222, and the insulator 224. The silicon oxynitride film was formed by a CVD method to have a thickness of 10 nm. The hafnium oxide film was formed by an ALD method to have a thickness of 20 nm. The silicon oxynitride film was formed by a CVD method to have a thickness of 30 nm.

Then, heat treatment was performed. The heat treatment was performed at 400° C. in an atmosphere containing nitrogen for one hour.

Next, as a first oxide to be the oxide 230a, a 5-nm-thick In—Ga—Zn oxide was formed by a sputtering method. The first oxide was formed under the following conditions: a target having an atomic ratio of In to Ga and Zn of 1:3:4 was used, the oxygen gas flow rate was 45 sccm, the pressure was 0.7 Pa, and the substrate temperature was 200° C.

Subsequently, as a second oxide to be the oxide 230b, a 20-nm-thick In—Ga—Zn oxide was formed over the first oxide by a sputtering method. The second oxide was formed under the following conditions: a target having an atomic ratio of In to Ga and Zn of 4:2:4.1 was used, the argon gas flow rate was 40 sccm, the oxygen gas flow rate was 5 sccm, the pressure was 0.7 Pa, and the substrate temperature was 130° C. Note that the first oxide and the second oxide were successively formed.

Then, heat treatment was performed. As the heat treatment, treatment was performed at 400° C. in an atmosphere containing nitrogen for one hour, and subsequently another treatment was performed at 400° C. in an atmosphere containing oxygen for one hour.

Next, a 20-nm-thick tantalum nitride film was formed over the second oxide by a sputtering method. Then, a 5-nm-thick aluminum oxide film was formed over the tantalum nitride film by an ALD method. After that, a 15-nm-thick tantalum nitride film was formed over the aluminum oxide film by a sputtering method.

Then, the tantalum nitride film and the aluminum oxide film in a region where a channel was formed were etched by a lithography method. A dry etching method was used for the etching.

Next, by a lithography method, unnecessary parts of the tantalum nitride film, the aluminum oxide film, the tantalum nitride film, the second oxide, and the first oxide were etched in this order. A dry etching method was used for the etching. By this processing, the oxides 230a and 230b and the barrier layers 244 were formed.

Next, the tantalum nitride film in a region where the channel was formed was etched using the tantalum nitride film and the aluminum oxide film from which the region where the channel was formed was removed as masks. A dry etching method was used for the etching. By this processing, the conductors 240 were formed. Note that by the etching, the tantalum nitride film used as a mask was removed.

Then, as a third oxide to be the oxide 230c, a 5-nm-thick In—Ga—Zn oxide was formed by a sputtering method. The third oxide was formed under the following conditions: a target having an atomic ratio of In to Ga and Zn of 4:2:4.1 was used, the oxygen gas flow rate was 45 sccm, the pressure was 0.7 Pa, and the substrate temperature was 130° C.

Next, a silicon oxynitride film to be the insulator 250 was formed by a CVD method to have a thickness of 10 nm.

Next, a titanium nitride film to be the conductor 260a was formed over the silicon oxynitride film to be the insulator 250 to have a thickness of 10 nm by a sputtering method. Over the titanium nitride film, a tungsten film to be the conductor 260b was formed to have a thickness of 30 nm by a sputtering method. Note that the titanium nitride film and the tungsten film were successively formed.

Next, the tungsten film and the titanium nitride film were etched in this order by a lithography method. A dry etching method was used for the etching of the tungsten film and the titanium nitride film. By the processing, the conductor 260 was formed.

Then, an aluminum oxide film to be the barrier layer 270 was formed to have a thickness of 7 nm by an ALD method. Subsequently, part of the aluminum oxide film and part of the silicon oxynitride film to be the insulator 250 were etched in this order by a lithography method. The aluminum oxide film and the silicon oxynitride film were etched by a dry etching method. In this manner, the barrier layer 270 and the insulator 250 were formed.

Next, part of the third oxide was etched by a lithography method using the barrier layer 270 and the insulator 250 as masks. A wet etching method was used for the etching. Through the processing, the oxide 230c was formed.

After that, a silicon oxynitride film to be the insulator 280 was formed to have a thickness of 310 nm by a CVD method. Then, CMP processing was performed to polish the silicon oxynitride film so that the surface of the silicon oxynitride film was planarized; accordingly, the insulator 280 was formed.

Then, a 40-nm-thick aluminum oxide film was formed as the insulator 282 over the insulator 280 by a sputtering method under the following conditions: the argon gas flow rate was 25 sccm, the oxygen gas flow rate was 25 sccm, the pressure was 0.4 Pa, and the substrate temperature was 250° C.

After that, heat treatment was performed. The heat treatment was performed at 400° C. in an atmosphere containing oxygen for one hour.

Next, a 100-nm-thick silicon oxynitride film was formed as the insulator 286 by a CVD method.

Then, a tungsten film to be a hard mask and a silicon nitride film to be a hard mask were formed by a sputtering method, and the hard masks were formed by a lithography method.

Subsequently, by using the hard masks, contact holes reaching the conductors 260 and 240 were formed.

Here, for Samples 7C and 7D, a 13-nm-thick aluminum oxide film to be the barrier layers 276 was formed by an ALD method. For Sample 7C, the aluminum oxide film was processed into the barrier layers 276 under first conditions. For Sample 7D, the aluminum oxide film was processed into the barrier layers 276 under second conditions.

First, first etching was performed for Samples 7C and 7D. The first etching was performed for 10 seconds under the following conditions: the pressure was 2.6 Pa, the distance between the upper electrode and the lower electrode was 25 mm, the power of the upper electrode was 1000 W, the bias power was 1200 W, a mixed atmosphere of $C_4F_8$ at a flow rate of 6 sccm, $CF_4$ at a flow rate of 10 sccm, $N_2$ at a flow rate of 50 sccm, and Ar at a flow rate of 500 sccm was used, and the substrate temperature was 20° C.

Then, second etching was performed for Sample 7C. The second etching was performed for 5 seconds under the following conditions: the pressure was 6.6 Pa, the distance between the upper electrode and the lower electrode was 35 mm, the power of the upper electrode was 200 W, the bias power was 150 W, a $CF_4$ atmosphere at a flow rate of 100 sccm was used, and the substrate temperature was 20° C.

For Sample 7D, cleaning was performed to remove an etching residue in the contact holes. For the cleaning, an alkaline solution such as a resist stripping solution can be used, for example. In this example, a resist stripping solution containing alkanolamine at less than 20% was used as the alkaline solution.

Then, for Sample 7D, plasma treatment was performed for 5 seconds under the following conditions: the pressure was 4.0 Pa, the distance between an upper electrode and a lower electrode was 40 mm, the power of the upper electrode was 100 W, the bias power was 250 W, and an Ar atmosphere at a flow rate of 300 sccm was used. After that, another plasma treatment was performed for 5 seconds under the following conditions: the pressure was 6.6 Pa, the distance between the upper electrode and the lower electrode was 35 mm, the power of the upper electrode was 200 W, the bias power was 150 W, and a $CF_4$ atmosphere at a flow rate of 100 sccm was used.

Here, for Sample 7B, a 40-nm-thick tantalum nitride film functioning as a conductive barrier film was formed by a sputtering method.

The following steps were common in Samples 7A to 7D.

A 10-nm-thick titanium nitride film was formed by an ALD method, and a 150-nm-thick tungsten film was formed by a CVD method.

Next, CMP processing was performed. For Samples 7A, 7B, and 7D, the tungsten film and the titanium nitride film were polished until the insulator 286 was exposed, whereby the conductors 246 and 248 filling the contact holes were formed. For Sample 7B, the tantalum nitride film, the tungsten film, and the titanium nitride film were polished by CMP processing until the insulator 286 was exposed, whereby the conductors 246 and 248 filling the contact holes were formed.

After that, a 50-nm-thick tungsten film was formed by a sputtering method. Subsequently, the tungsten film was processed by a lithography method to form a wiring layer.

Through the above steps, Samples 7A to 7D were completed.

<Electrical Characteristics of Transistors>

Figure 25:
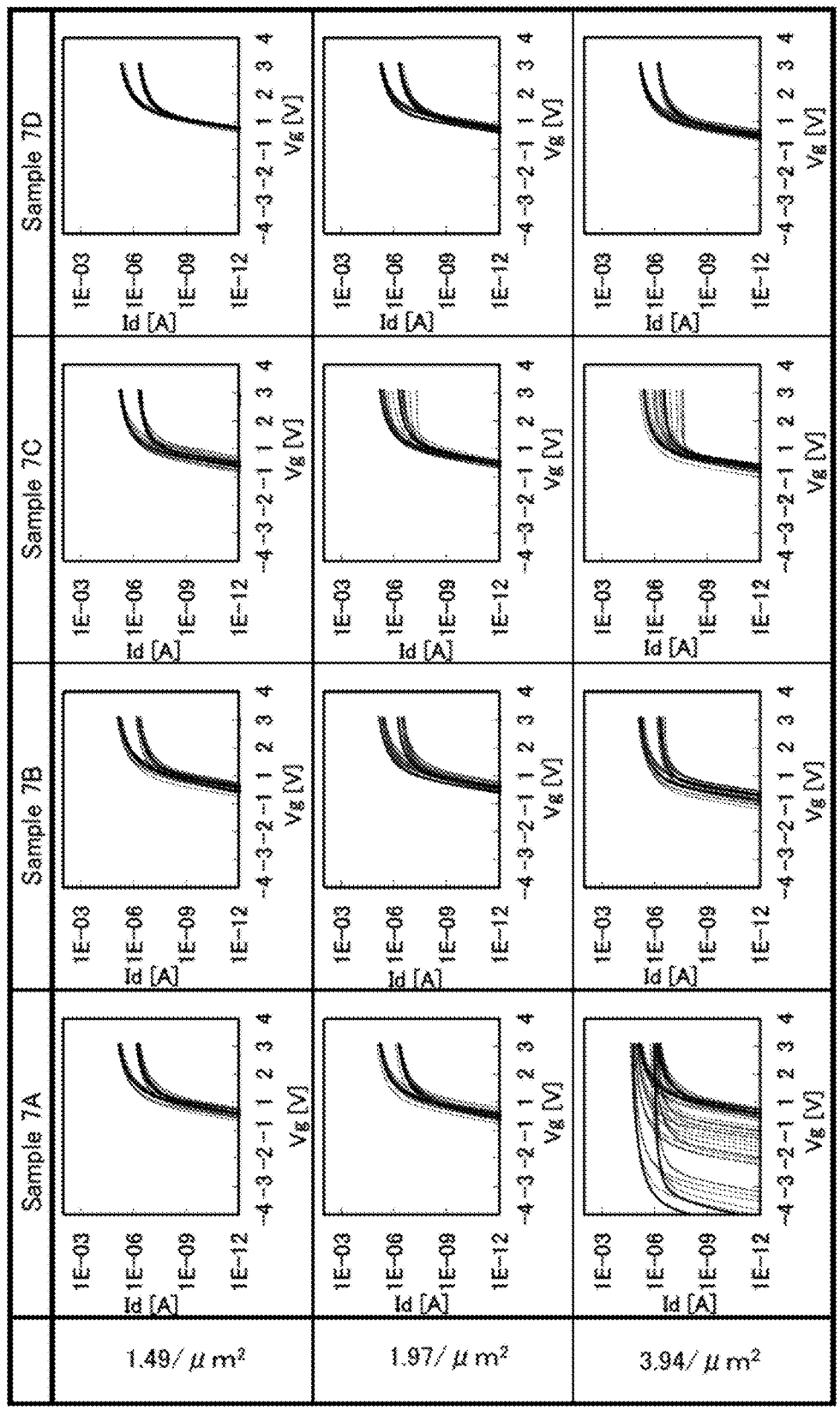
FIG. 25 shows $I_d$-$V_g$ characteristics in Example.
Figure 26:
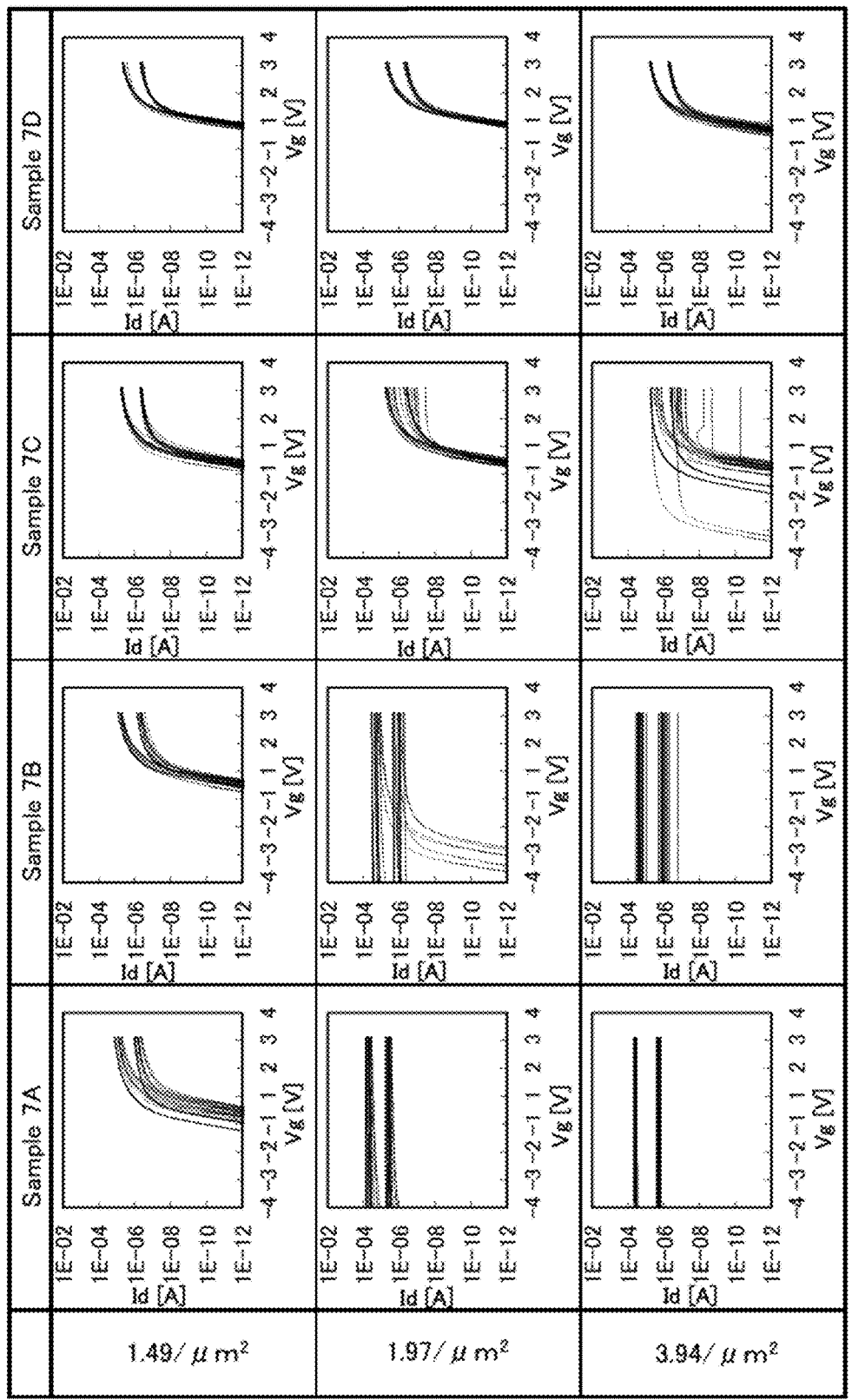
FIG. 26 shows $I_d$-$V_g$ characteristics in Example.

Next, the $I_d$-$V_g$ characteristics were measured as electrical characteristics of the transistors 200 included in Samples 7A to 7D. Note that the $I_d$-$V_g$ characteristics before and after a step of forming connection wirings in the fabrication of modules including the transistors 200 were measured. FIG. 25 shows the $I_d$-$V_g$ characteristics after the formation of the transistors 200 in Samples 7A to 7D. FIG. 26 shows the $I_d$-$V_g$ characteristics of the transistors 200 in Samples 7A to 7D after the transistors 200 and the connection wirings are formed in the fabrication of the modules.

In the measurement of the $I_d$-$V_g$ characteristics, a change in a current between the conductor 240a functioning as a source electrode and the conductor 240b functioning as a drain electrode (hereinafter, referred to as a drain current $I_d$) when a potential applied to the conductor 260 functioning as a first gate electrode of the transistor 200 was changed from a first value to a second value was measured.

Here, a change in the drain current ($I_d$) between the conductor 240a and the conductor 240b when a potential difference between the conductor 240a and the conductor 240b (hereinafter, referred to as a drain voltage $V_d$) was set to 0.1 V or 3.3 V and a potential difference between the conductor 240a and the conductor 260 (hereinafter, referred to as a gate voltage ($V_g$)) was changed from −3.3 V to +3.3 V was measured.

Note that in this measurement, the potential of the conductor 205 functioning as a second gate electrode (back gate electrode) was set to 0 V. FIG. 25 and FIG. 26 show the results.

FIG. 25 shows that Samples 7A to 7D have favorable characteristics when the density of the transistors 200 is low. In particular, the variation is small in Sample 7D. It is found that, in Samples 7A to 7C, the variation becomes larger as the density of the transistors 200 becomes higher. The characteristics significantly deteriorate particularly in Sample 7A with a density of the transistors 200 of 3.94/μm². Meanwhile, the degree of variation and the characteristics do not change in Sample 7D even with high density of the transistors 200.

The transistors in Sample 7D were in off states when the voltage applied to the first gates was 0 V. Accordingly, it was confirmed that the transistors in Sample 7D had extremely excellent off-state characteristics.

FIG. 26 shows that the variation in the characteristics is large in Sample 7A even with low density of the transistors 200. The variation becomes larger as the density of the transistors 200 becomes higher in Samples 7A and 7B, and the characteristics significantly deteriorate.

This is probably because excess oxygen was not sufficiently supplied to the oxide 230 for the following reason: excess oxygen contained in the insulator 280 was absorbed by the conductors 246 and 248 because of thermal budget or the like in the step of forming the connection wiring in the fabrication of the module or diffused to another component other than the oxide 230 via the openings. Alternatively, impurities such as hydrogen were probably diffused from the conductors 246 and 248 to the oxide 230 via the openings.

In contrast, Samples 7C and 7D can have transistor characteristics even with high density of the transistors 200. In particular, Sample 7D has excellent characteristics regardless of the density. Furthermore, the degree of variation and the characteristics do not change in Sample 7D even with high density of the transistors 200. Furthermore, the transistors 200 in Sample 7D are in off states when voltage applied to the first gates ($V_g$) is 0 V even with low density of the transistors 200. In other words, Sample 7D includes transistors having extremely excellent off-state characteristics.

This is probably because the barrier layers 276 prevented excess oxygen contained in the insulator 280 from being absorbed by the conductors 246 and 248 or from being diffused to a component other than the oxide 230 via the openings, which led to sufficient supply of excess oxygen to the oxide 230.

<Contact Resistance of Source or Drain Electrode of Transistor>

Figure 27:
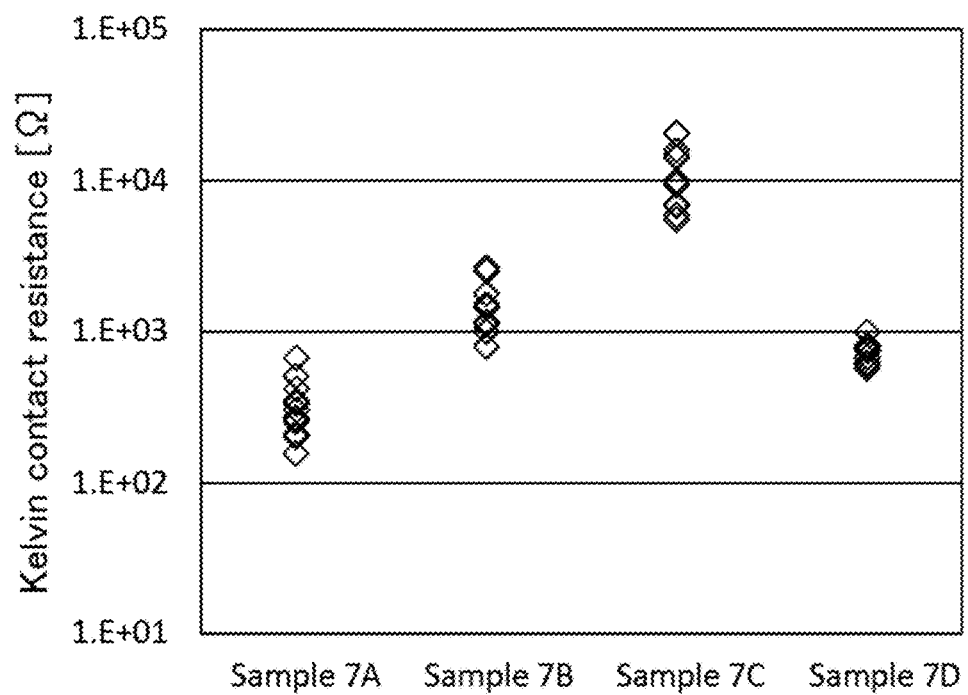
FIG. 27 shows contact resistance of samples in Example.

Next, the measurement of the Kelvin contact resistance between the conductors 240 and the conductors 246 and 248 was performed for Samples 7A to 7D. FIG. 27 shows the results. In FIG. 27, the longitudinal axis represents the Kelvin contact resistance.

The comparison between Sample 7A and Sample 7B suggests that the contact resistance depends on the material of the conductors 246. The comparison between Sample 7A and Sample 7C indicates that Sample 7C has higher contact resistance than Sample 7A. This is because, in Sample 7C, the insulator was formed in the openings and the substantial sizes of the openings became small, or the residue of the barrier layers, which was an insulator, was generated on surfaces of the conductors 240 exposed in the openings at the time of the processing for the barrier layers 276.

Sample 7D had a Kelvin contact resistance of less than or equal to $1.0 \times 10^3 \Omega$, which was equivalent to the contact resistance of Sample 7A having no insulator in the openings, and had favorable characteristics. Furthermore, Sample 7D had less variation than Sample 7A. This is probably because no residue of the barrier layers, which was an insulator, was generated on surfaces of the conductors 240 exposed in the openings owing to the processing conditions for Sample 7D. Furthermore, it was confirmed that the processing conditions for Sample 7D caused less variation among contacts and achieved high processing accuracy.

The above results show that the semiconductor device of one embodiment of the present invention is a semiconductor device that includes a transistor having excellent off-state characteristics. The results also show that even when transistors are integrated, the transistors have favorable electrical characteristics and small variation.

<Stress Test on Transistor>

Next, in Sample 7D including the transistors having favorable electrical characteristics, stress tests were conducted on the transistors 200 in regions having different transistor densities. Note that the densities of the 17424 transistors 200 in the regions were $1.49/\mu m^2$, $2.96/\mu m^2$, $3.94/\mu m^2$, and $4.96/\mu m^2$.

As the stress tests, GBT stress tests were conducted. In the GBT stress tests, the stress temperature was set at 125° C., and the $I_d$-$V_g$ characteristics were measured after a predetermined period of time under the same conditions as those of the measurement of the electrical characteristics. Note that the back gate potential was set to 0.00 V.

In this example, the measurement was performed 12 times: after 0 seconds, after 100 seconds, after 300 seconds, after 600 seconds, after 1000 seconds, after 1800 seconds (0.5 hours), after 3600 seconds (1 hour), after 7200 seconds (2 hours), after 10000 seconds (2.78 hours), after 18000 seconds (5 hours), after 32400 seconds (9 hours), and after 43200 seconds (12 hours).

As an index of the amount of change in the electrical characteristics of a transistor, variation in the threshold voltage ($V_{sh}$) of the transistor (hereinafter, also referred to as $\Delta V_{sh}$) with time was used. Note that in the $I_d$-$V_g$ characteristics, $V_{sh}$ is defined as a value of $V_g$ when $I_d = 1.0 \times 10^{-12}$ [A] is satisfied. If $V_{sh}$ when the stress starts to be applied is +0.50 V and $V_{sh}$ after the stress is applied for 100 seconds is −0.55 V, for example, $\Delta V_{sh}$ after the stress is applied for 100 seconds is −1.05 V.

Figure 28:
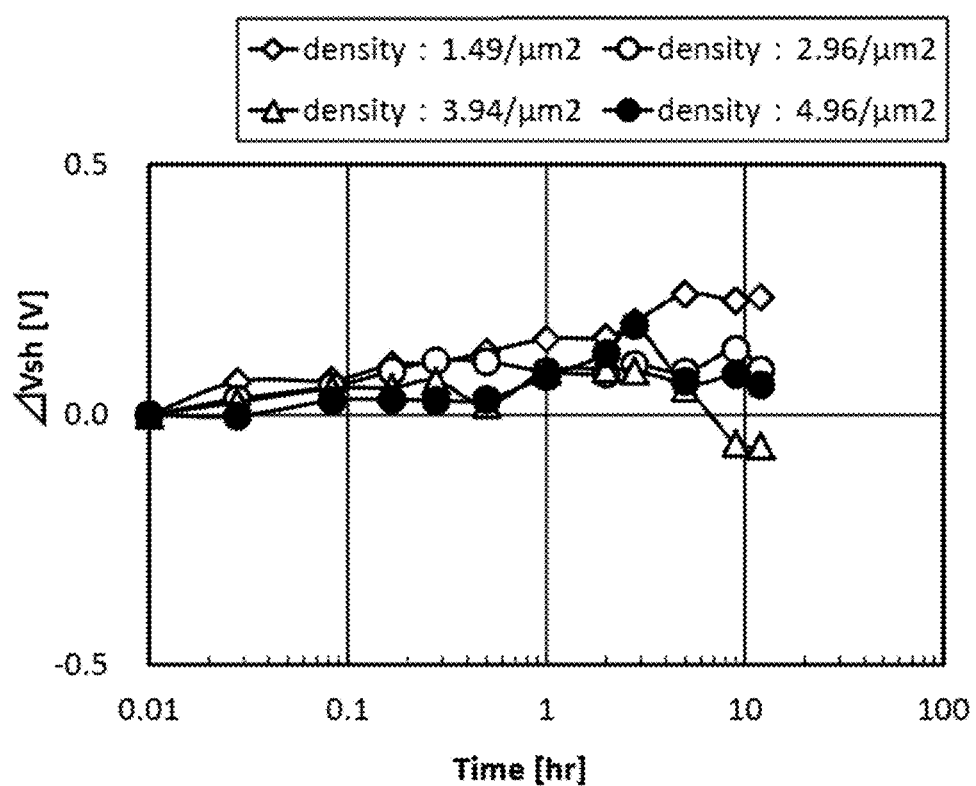
FIG. 28 shows the results of GBT stress tests of samples in Example.

FIG. 28 shows the stress time dependence of $\Delta V_{sh}$ as a result of the GBT stress tests. The results of the GBT stress tests shown in FIG. 28 indicate that $\Delta V_{sh}$ does not depend on the density of the transistors in Sample 7D.

The results in FIG. 28 also indicate that the amount of change in the threshold voltage of the transistors in Sample 7D is small.

The above results show that one embodiment of the present invention is a semiconductor device including a transistor with high reliability. The results also show that the transistor in one embodiment of the present invention has favorable electrical characteristics and less variation.

At least part of this example can be implemented in combination with any of the other examples and embodiments described in this specification as appropriate.

REFERENCE NUMERALS

100: capacitor, 101: capacitor, 110: conductor, 112: conductor, 120: conductor, 130: insulator, 150: insulator, 200: transistor, 201: transistor, 205: conductor, 205a: conductor, 205A: conductive film, 205b: conductor, 205B: conductive film, 210: insulator, 212: insulator, 214: insulator, 216: insulator, 218: conductor, 220: insulator, 222: insulator, 224: insulator, 230: oxide, 230a: oxide, 230A: oxide film, 230b: oxide, 230B: oxide film, 230c: oxide, 230C: oxide film, 240: conductor, 240a: conductor, 240A: conductive film, 240b: conductor, 240B: conductive film, 244: barrier layer, 244a: barrier layer, 244A: barrier film, 244b: barrier layer, 244B: barrier film, 246: conductor, 246a: conductor, 246A: conductive film, 246b: conductor, 246c: conductor, 248: conductor, 248a: conductor, 248A: conductive film, 248b: conductor, 248c: conductor, 250: insulator, 250A: insulating film, 260: conductor, 260a: conductor, 260A: conductive film, 260b: conductor, 260B: conductive film, 260c: conductor, 270: barrier layer, 270A: barrier film, 272: insulator, 274: insulator, 276: barrier layer, 276a: barrier layer, 276A: barrier film, 276b: barrier layer, 276c: barrier layer, 280: insulator, 282: insulator, 284: insulator, 286: insulator, 290a: hard mask, 290A: film, 290b: hard mask, 290B: film, 292A: film, 292B: hard mask, 292C: hard mask, 294A: film, 294B: hard mask, 296: resist mask, 300: transistor, 301: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 405a: conductor, 405b: conductor, 430c: oxide, 431a: oxide, 431b: oxide, 432a: oxide, 432b: oxide, 440: conductor, 440a: conductor, 440b: conductor, 450: insulator, 460: conductor, 460a: conductor, 460b: conductor, 470: barrier layer, 500: structure, 700: structure, 702: substrate, 704: insulator, 740: conductor, 744: insulator, 746: conductor, 748: conductor, 776: insulator, 780: insulator, 782: insulator, 786: insulator, 801: structure, 802: structure, 803: structure, 804: structure, 805: structure, 806: structure, 810: substrate, 811: insulator, 812: conductor, 813: barrier layer, 814: insulator, 815: insulator, 820: substrate, 821: insulator, 822: insulator, 823: barrier layer, 830: substrate, 831: insulator, 832: insulator, 833: insulator, 834: film, 900: structure, 902: substrate, 904: insulator, 905: conductor, 920: insulator, 922: insulator, 924: insulator, 930: oxide, 946: conductor, 948: conductor, 976: insulator, 980: insulator, 982: insulator, 986: insulator, 3001: wiring, 3002: wiring, 3003: wiring, 3004: wiring, 3005: wiring, 3006: wiring, 3007: wiring, 3008: wiring, 3009: wiring, and 3010: wiring.

This application is based on Japanese Patent Application Serial No. 2016-146342 filed with Japan Patent Office on Jul. 26, 2016 and Japanese Patent Application Serial No. 2017-026908 filed with Japan Patent Office on Feb. 16, 2017, the entire contents of which are hereby incorporated by reference.

The invention claimed is:

1. A semiconductor device comprising:
a first barrier layer;
a second barrier layer;
a third barrier layer;
a transistor comprising an oxide;
an insulator comprising an oxygen-excess region; and
a conductor,
wherein the insulator and the oxide are between the first barrier layer and the second barrier layer,
wherein the third barrier layer and the conductor are in an opening of the first barrier layer and an opening of the insulator,
wherein the conductor is not in contact with the insulator, and
wherein the third barrier layer is an insulating layer.

2. The semiconductor device according to claim 1, wherein a side surface of the opening of the first barrier layer and a side surface of an opening of the second barrier layer are in contact with the third barrier layer, so that the transistor and the insulator are sealed by the first barrier layer, the second barrier layer, and the third barrier layer.

3. The semiconductor device according to claim 1, wherein an amount of hydrogen released from components below the first barrier layer, the second barrier layer, or the third barrier layer is less than or equal to $5.0 \times 10^{14}/cm^2$ when measured by TDS at a temperature lower than or equal to 400° C.

4. The semiconductor device according to claim 1, further comprising:
a second insulator having an opening; and
a third insulator having an opening,
wherein the second insulator is over the second barrier layer,
wherein the third insulator is below the first barrier layer, and
wherein a side surface of the opening of the second insulator and a side surface of the opening of the third insulator each have a region covered by the third barrier layer.

5. The semiconductor device according to claim 1, wherein the first barrier layer serves as a gate insulating film of the transistor.

6. A semiconductor device comprising:
a first barrier layer;
a second barrier layer;
a third barrier layer;
a transistor comprising an oxide;
an insulator comprising an oxygen-excess region; and
a conductor electrically connected to the transistor,
wherein the insulator and the oxide are between the first barrier layer and the second barrier layer,
wherein the conductor is in an opening of the first barrier layer and an opening of the insulator,
wherein the third barrier layer is between the conductor and the insulator,
wherein the third barrier layer is between the conductor and the first barrier layer, and
wherein the third barrier layer is an insulating layer.

7. The semiconductor device according to claim 6, wherein a side surface of the opening of the first barrier layer and a side surface of an opening of the second barrier layer are in contact with the third barrier layer, so that the transistor and the insulator are sealed by the first barrier layer, the second barrier layer, and the third barrier layer.

8. The semiconductor device according to claim 6, wherein an amount of hydrogen released from components below the first barrier layer, the second barrier layer, or the third barrier layer is less than or equal to $5.0 \times 10^{14}/cm^2$ when measured by TDS at a temperature lower than or equal to 400° C.

9. The semiconductor device according to claim 6, further comprising:
a second insulator having an opening; and
a third insulator having an opening,
wherein the second insulator is over the second barrier layer,
wherein the third insulator is below the first barrier layer, and
wherein a side surface of the opening of the second insulator and a side surface of the opening of the third insulator each have a region covered by the third barrier layer.

10. The semiconductor device according to claim 6, wherein the first barrier layer serves as a gate insulating film of the transistor.

11. A semiconductor device comprising:
a first barrier layer;
a second barrier layer;
a third barrier layer;
a transistor comprising an oxide;
an insulator comprising an oxygen-excess region;
a first conductor; and
a second conductor,
wherein the second conductor is electrically connected to the transistor,
wherein the insulator and the oxide are between the first barrier layer and the second barrier layer,
wherein the first conductor is in an opening of the first barrier layer, an opening of the second barrier layer, and an opening of the insulator,
wherein the third barrier layer is between the first conductor and each of the first barrier layer, the second barrier layer, and the insulator,
wherein the second conductor is in the opening of the first barrier layer and the opening of the insulator, and
wherein the third barrier layer is between the second conductor and each of the first barrier layer and the insulator.

12. The semiconductor device according to claim 11, wherein a side surface of the opening of the first barrier layer and a side surface of the opening of the second barrier layer are in contact with the third barrier layer, so that the transistor and the insulator are sealed by the first barrier layer, the second barrier layer, and the third barrier layer.

13. The semiconductor device according to claim 11, wherein an amount of hydrogen released from components below the first barrier layer, the second barrier layer, or the third barrier layer is less than or equal to $5.0\times10^{14}/cm^2$ when measured by TDS at a temperature lower than or equal to 400° C.

14. The semiconductor device according to claim 11, further comprising:
   a second insulator having an opening; and
   a third insulator having an opening,
   wherein the second insulator is over the second barrier layer,
   wherein the third insulator is below the first barrier layer, and
   wherein a side surface of the opening of the second insulator and a side surface of the opening of the third insulator each have a region covered by the third barrier layer.

15. The semiconductor device according to claim 11, wherein the first barrier layer serves as a gate insulating film of the transistor.

\* \* \* \* \*